US012575322B2

(12) United States Patent
Kim et al.

(10) Patent No.: US 12,575,322 B2
(45) Date of Patent: Mar. 10, 2026

(54) ORGANIC LIGHT EMITTING DIODE AND ORGANIC LIGHT EMITTING DISPLAY DEVICE INCLUDING THE SAME

(71) Applicant: LG DISPLAY CO., LTD., Seoul (KR)

(72) Inventors: Gyeong-Woo Kim, Paju-si (KR); Ji-Seon Jang, Paju-si (KR); Joon-Beom Im, Paju-si (KR); Suk-Young Bae, Paju-si (KR); Han-Jin Ahn, Paju-si (KR); Jun-Yun Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 364 days.

(21) Appl. No.: 18/240,026

(22) Filed: Aug. 30, 2023

(65) Prior Publication Data

US 2024/0237521 A1 Jul. 11, 2024

(30) Foreign Application Priority Data

Nov. 22, 2022 (KR) ........................ 10-2022-0157297

(51) Int. Cl.
*H10K 85/60* (2023.01)
*C09K 11/02* (2006.01)
(Continued)

(52) U.S. Cl.
CPC .......... *H10K 85/6572* (2023.02); *C09K 11/02* (2013.01); *C09K 11/06* (2013.01); (Continued)

(58) Field of Classification Search
None
See application file for complete search history.

(56) References Cited

U.S. PATENT DOCUMENTS

2015/0188076 A1* 7/2015 Kum ........................ C09B 57/10 257/40
2017/0117488 A1 4/2017 Ahn et al.
2024/0244857 A1* 7/2024 Lee ...................... H10K 85/658

FOREIGN PATENT DOCUMENTS

KR 10-2018-0027468 A 3/2018

OTHER PUBLICATIONS

Nam et al. "Improved Efficiency and Lifetime of Deep-Blue Hyperfluorescent Organic Light-Emitting Diode using Pt(II) Complex as Phosphorescent Sensitizer," Adv. Sci. (Weinh) 2021, 2100586, Jun. 16, 2021, https://doi.org/10.1002/advs.202100586.

(Continued)

*Primary Examiner* — Nicholas J Tobergte
(74) *Attorney, Agent, or Firm* — Morgan, Lewis & Bockius LLP

(57) ABSTRACT

An organic light emitting diode includes a first electrode; a second electrode facing the first electrode; and a first emitting part including a first blue emitting material layer and positioned between the first and second electrodes, the first blue emitting material layer including a first blue emitting layer and a second blue emitting layer, wherein the first blue emitting layer includes a first p-type host and a first n-type host, and the second blue emitting layer includes a second p-type host and a second n-type host, wherein one of the first p-type host and the second p-type host is a first compound represented by one of Formula 1a and Formula 1b, and wherein the other one of the first p-type host and the second p-type host is a second compound represented by one of Formula 3a and Formula 3b.

20 Claims, 9 Drawing Sheets

D1

(51) Int. Cl.
*C09K 11/06* (2006.01)
*H10K 85/30* (2023.01)
*H10K 85/40* (2023.01)
*H10K 50/12* (2023.01)
*H10K 101/00* (2023.01)
*H10K 101/30* (2023.01)

(52) U.S. Cl.
CPC ........... *H10K 85/346* (2023.02); *H10K 85/40* (2023.02); *C09K 2211/1007* (2013.01); *C09K 2211/1011* (2013.01); *C09K 2211/1029* (2013.01); *C09K 2211/1044* (2013.01); *C09K 2211/185* (2013.01); *H10K 50/12* (2023.02); *H10K 85/654* (2023.02); *H10K 2101/30* (2023.02); *H10K 2101/90* (2023.02)

(56) References Cited

OTHER PUBLICATIONS

Wang et al. "High Triplet Energy Hosts for Blue OrganicLight-Emitting Diodes," Adv. Funct. Mater. 2021, 31(12), 2008332, Nov. 9, 2020, https://doi.org/10.1002/adfm.202008332.

* cited by examiner

ORGANIC LIGHT EMITTING DIODE AND ORGANIC LIGHT EMITTING DISPLAY DEVICE INCLUDING THE SAME

CROSS-REFERENCE TO RELATED APPLICATION

The present application claims the benefit of Korean Patent Application No. 10-2022-0157297 filed in the Republic of Korea on Nov. 22, 2022, which is hereby incorporated by reference in its entirety.

BACKGROUND

Technical Field

The present disclosure relates to an organic light emitting diode, and more particularly, to an organic light emitting diode having low driving voltage and improved lifespan and an organic light emitting device including the organic light emitting diode.

Discussion of the Related Art

Requirement for flat panel display devices having small occupied area is increased. Among the flat panel display devices, a technology of an organic light emitting display device, which includes an organic light emitting diode (OLED) and may be called to as an organic electroluminescent device, is rapidly developed.

The OLED emits light by injecting electrons from a cathode as an electron injection electrode and holes from an anode as a hole injection electrode into an emitting material layer, combining the electrons with the holes, generating an exciton, and transforming the exciton from an excited state to a ground state.

However, the related art OLED has a limitation in the driving voltage and the lifespan. In particular, there is big limitation in a blue OLED.

SUMMARY

Accordingly, embodiments of the present disclosure are directed to an OLED and an organic light emitting device that substantially obviate one or more of the problems associated with the limitations and disadvantages of the related art.

An object of the present disclosure is to provide an OLED and an organic light emitting device having low driving voltage and improved lifespan.

Additional features and aspects will be set forth in the description that follows, and in part will be apparent from the description, or may be learned by practice of the present disclosure concepts provided herein. Other features and aspects of the present disclosure concepts may be realized and attained by the structure particularly pointed out in the written description, or derivable therefrom, and the claims hereof as well as the appended drawings.

To achieve these and other advantages in accordance with the objects of the present disclosure, as embodied and broadly described herein, an organic light emitting diode comprises a first electrode; a second electrode facing the first electrode; and a first emitting part including a first blue emitting material layer and positioned between the first and second electrodes, the first blue emitting material layer including a first blue emitting layer and a second blue emitting layer, wherein the first blue emitting layer includes a first p-type host and a first n-type host, and the second blue emitting layer includes a second p-type host and a second n-type host, wherein one of the first p-type host and the second p-type host is a first compound represented by one of Formula 1a and Formula 1b:

[Formula 1a]

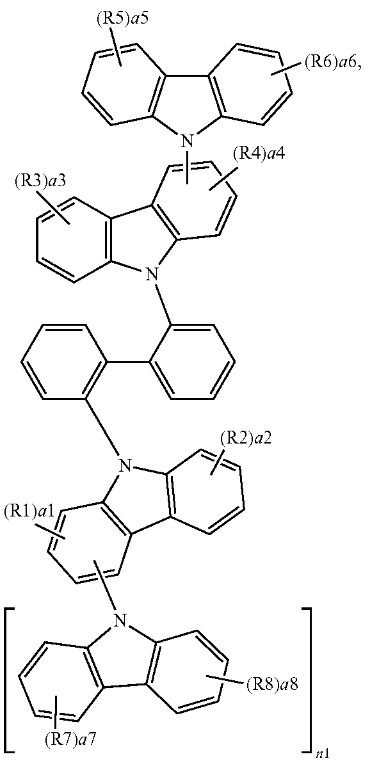

and

[Formula 1b]

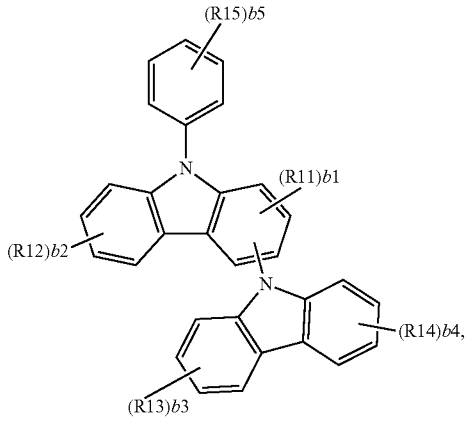

wherein in the Formula 1a, each of a1 and a4 is independently an integer of 0 to 3, each of a2, a3 and a5 to a8 is independently an integer of 0 to 4, n1 is 0 or 1, and each of R1 to R8 is independently selected from the group consisting of deuterium, halogen, cyano, a substituted or unsubstituted C6 to C30 arylsilyl group, a substituted or unsubstituted C1 to C20 alkyl group, a substituted or unsubstituted C6 to C30 aryl group, a substituted or unsubstituted C5 to C60 heteroaryl group, a substituted or unsubstituted C1 to C30 alkylamino group and a substituted or unsubstituted C6 to C60 arylamino group, wherein in the Formula 1b, b1 is an integer of 0 to 3, each of b2 to b4 is independently an integer of 0 to 4, b5 is an integer of 0 to 5, and each of R11 to R15 p-type host and the second p-type host is a second compound represented by one of Formula 3a and Formula 3b:

[Formula 3a]

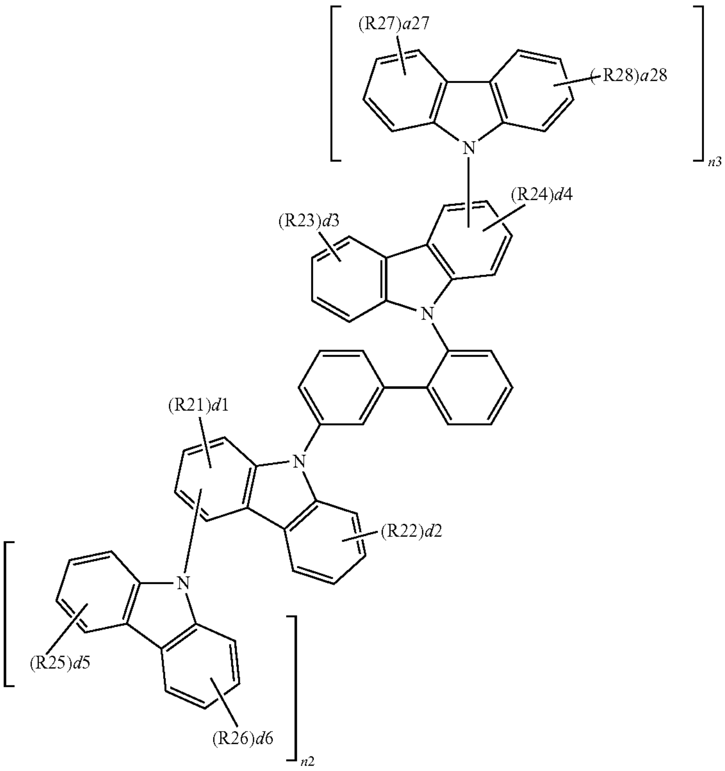

, and

[Formula 3b]

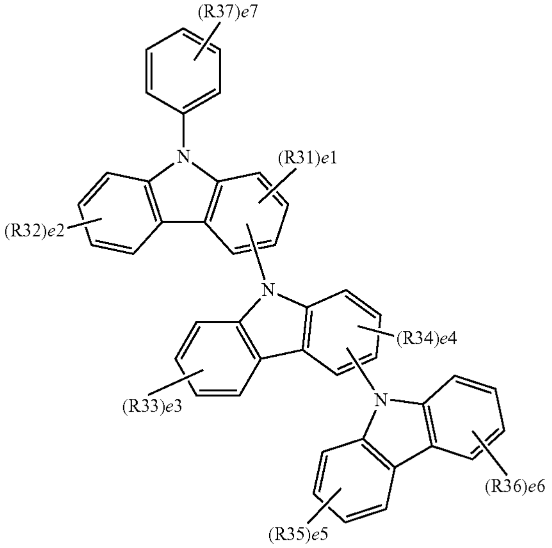

, is independently selected from the group consisting of deuterium, halogen, cyano, a substituted or unsubstituted C6 to C30 arylsilyl group, a substituted or unsubstituted C1 to C20 alkyl group, a substituted or unsubstituted C6 to C30 aryl group, a substituted or unsubstituted C5 to C60 heteroaryl group, a substituted or unsubstituted C1 to C30 alkylamino group and a substituted or unsubstituted C6 to C60 arylamino group, wherein the other one of the first wherein in the Formula 3a, each of d1 and d4 is independently an integer of 0 to 3, each of d2, d3, d5, d6, a27 to a28 is independently an integer of 0 to 4, each of n2 and n3 is independently 0 or 1, and each of R21 to R28 is independently selected from the group consisting of deuterium, halogen, cyano, a substituted or unsubstituted C6 to C30 arylsilyl group, a substituted or unsubstituted C1 to C20 alkyl group, a substituted or unsubstituted C6 to C30 aryl group, a substituted or unsubstituted C5 to C60 heteroaryl group, a substituted or unsubstituted C1 to C30 alkylamino group and a substituted or unsubstituted C6 to C60 arylamino group, wherein in the Formula 3b, each of e1 and e4 is independently an integer of 0 to 3, each of e2, e3, e5 and e6 is independently an integer of 0 to 4, e7 is an integer of 0 to 5, and each of R31 to R37 is independently selected from the group consisting of deuterium, halogen, cyano, a substituted or unsubstituted C6 to C30 arylsilyl group, a substituted or unsubstituted C1 to C20 alkyl group, a substituted or unsubstituted C6 to C30 aryl group, a substituted or unsubstituted C5 to C60 heteroaryl group, a substituted or unsubstituted C1 to C30 alkylamino group and a substituted or unsubstituted C6 to C60 arylamino group.

In another aspect of the present disclosure, an organic light emitting device comprises a substrate; the above organic light emitting diode disposed over the substrate; and an encapsulation layer covering the organic light emitting diode.

It is to be understood that both the foregoing general description and the following detailed description are merely by way of example and are intended to provide further explanation of the inventive concepts as claimed.

BRIEF DESCRIPTION OF THE DRAWINGS

The accompanying drawings, which are included to provide a further understanding of the present disclosure and are incorporated in and constitute a part of this application, illustrate embodiments of the present disclosure and together with the description serve to explain principles of the present disclosure.

DETAILED DESCRIPTION

Figure 1:
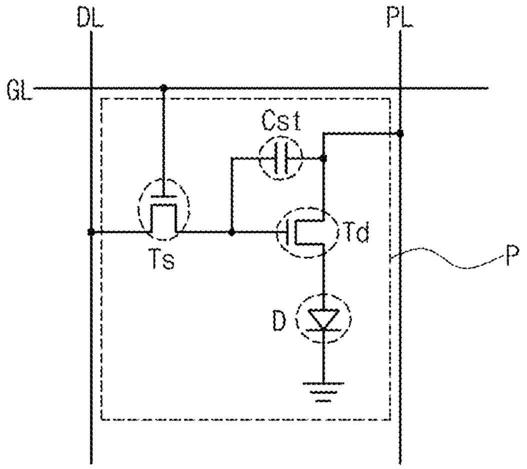
FIG. 1 is a schematic circuit diagram of an organic light emitting display device of the present disclosure.

Reference will now be made in detail to aspects of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure and methods of achieving them will be apparent with reference to the aspects described below in detail with the accompanying drawings. However, the present disclosure is not limited to the aspects disclosed below, but can be realized in a variety of different forms, and only these aspects allow the disclosure of the present disclosure to be complete. The present disclosure is provided to fully inform the scope of the disclosure to the skilled in the art of the present disclosure.

The shapes, sizes, proportions, angles, numbers, and the like disclosed in the drawings for explaining the aspects of the present disclosure are illustrative, and the present disclosure is not limited to the illustrated matters. The same reference numerals refer to the same elements throughout the specification. In addition, in describing the present disclosure, if it is determined that a detailed description of the related known technology unnecessarily obscure the subject matter of the present disclosure, the detailed description thereof can be omitted. When 'including', 'having', 'consisting', and the like are used in this specification, other parts may be added unless 'only' is used. When a component is expressed in the singular, cases including the plural are included unless specific statement is described.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Reference will now be made in detail to some of the examples and preferred embodiments, which are illustrated in the accompanying drawings.

The present disclosure relates to an OLED, in which each of adjacent blue emitting layers includes a p-type host and an n-type host, and the p-type hosts have different hole mobilities, and an organic light emitting device including the OLED. For example, an organic light emitting device may be an organic light emitting display device or an organic lightening device. As an example, an organic light emitting display device, which is a display device including the OLED of the present disclosure, will be mainly described.

FIG. 1 is a schematic circuit diagram of an organic light emitting display device of the present disclosure.

As shown in FIG. 1, an organic light emitting display device includes a gate line GL, a data line DL, a power line PL, a switching thin film transistor TFT Ts, a driving TFT Td, a storage capacitor Cst, and an OLED D. The gate line GL and the data line DL cross each other to define a pixel region P. The pixel region may include a red pixel region, a green pixel region and a blue pixel region.

The switching TFT Ts is connected to the gate line GL and the data line DL, and the driving TFT Td and the storage capacitor Cst are connected to the switching TFT Ts and the power line PL. The OLED D is connected to the driving TFT Td.

In the organic light emitting display device, when the switching TFT Ts is turned on by a gate signal applied through the gate line GL, a data signal from the data line DL is applied to the gate electrode of the driving TFT Td and an electrode of the storage capacitor Cst.

When the driving TFT Td is turned on by the data signal, an electric current is supplied to the OLED D from the power line PL. As a result, the OLED D emits light. In this case, when the driving TFT Td is turned on, a level of an electric current applied from the power line PL to the OLED D is determined such that the OLED D can produce a gray scale.

The storage capacitor Cst serves to maintain the voltage of the gate electrode of the driving TFT Td when the switching TFT Ts is turned off. Accordingly, even if the switching TFT Ts is turned off, a level of an electric current applied from the power line PL to the OLED D is maintained to next frame.

As a result, the organic light emitting display device displays a desired image.

Figure 2:
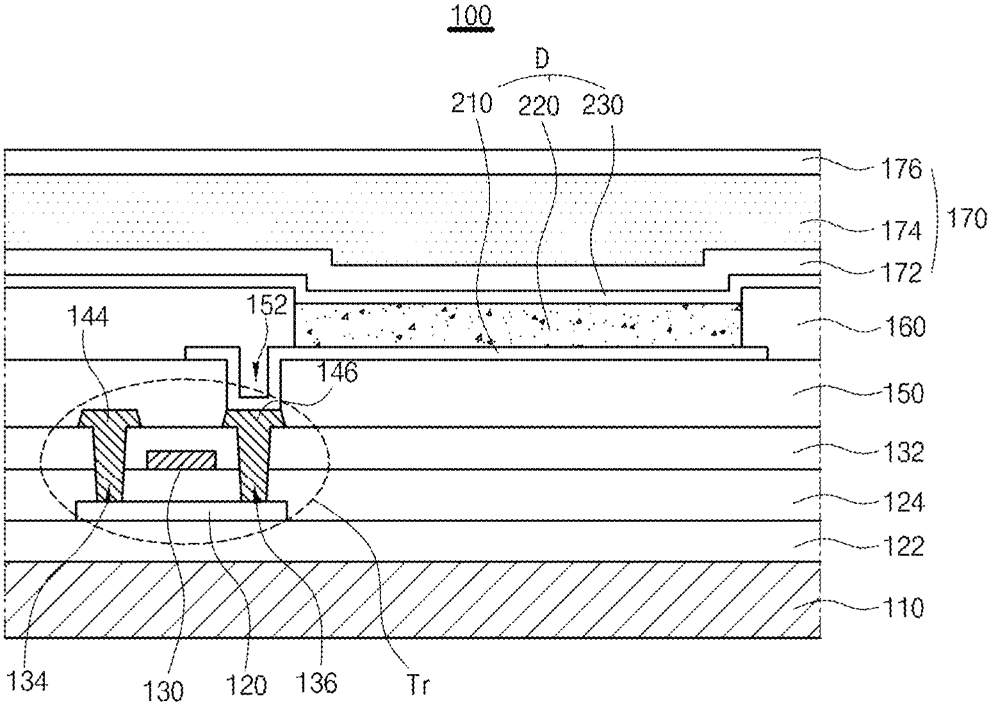
FIG. 2 is a schematic cross-sectional view of an organic light emitting display device according to a first embodiment of the present disclosure.

FIG. 2 is a schematic cross-sectional view of an organic light emitting display device according to a first embodiment of the present disclosure.

As shown in FIG. 2, the organic light emitting display device 100 includes a substrate 110, a TFT Tr on or over the substrate 110, a planarization layer 150 covering the TFT Tr and an OLED D on the planarization layer 150 and connected to the TFT Tr. A red pixel region, a green pixel region and a blue pixel region may be defined on the substrate 110.

The substrate 110 may be a glass substrate or a flexible substrate. For example, the flexible substrate may be one of a polyimide (PI) substrate, a polyethersulfone (PES) substrate, a polyethylenenaphthalate (PEN) substrate, a polyethylene terephthalate (PET) substrate and a polycarbonate (PC) substrate.

A buffer layer 122 is formed on the substrate, and the TFT Tr is formed on the buffer layer 122. The buffer layer 122 may be omitted. For example, the buffer layer 122 may be formed of an inorganic insulating material, e.g., silicon oxide or silicon nitride.

A semiconductor layer 120 is formed on the buffer layer 122. The semiconductor layer 120 may include an oxide semiconductor material or polycrystalline silicon.

When the semiconductor layer 120 includes the oxide semiconductor material, a light-shielding pattern (not shown) may be formed under the semiconductor layer 120. The light to the semiconductor layer 120 is shielded or blocked by the light-shielding pattern such that thermal degradation of the semiconductor layer 120 can be prevented. On the other hand, when the semiconductor layer 120 includes polycrystalline silicon, impurities may be doped into both sides of the semiconductor layer 120.

A gate insulating layer 124 is formed on the semiconductor layer 120. The gate insulating layer 124 may be formed of an inorganic insulating material such as silicon oxide or silicon nitride.

A gate electrode 130, which is formed of a conductive material, e.g., metal, is formed on the gate insulating layer 124 to correspond to a center of the semiconductor layer 120. In FIG. 2, the gate insulating layer 124 is formed on an entire surface of the substrate 110. Alternatively, the gate insulating layer 124 may be patterned to have the same shape as the gate electrode 130.

An interlayer insulating layer 132 is formed on the gate electrode 130 and over an entire surface of the substrate 110. The interlayer insulating layer 132 may be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 120. The first and second contact holes 134 and 136 are positioned at both sides of the gate electrode 130 to be spaced apart from the gate electrode 130.

The first and second contact holes 134 and 136 are formed through the gate insulating layer 124. Alternatively, when the gate insulating layer 124 is patterned to have the same shape as the gate electrode 130, the first and second contact holes 134 and 136 is formed only through the interlayer insulating layer 132.

A source electrode 144 and a drain electrode 146, which are formed of a conductive material, e.g., metal, are formed on the interlayer insulating layer 132.

The source electrode 144 and the drain electrode 146 are spaced apart from each other with respect to the gate electrode 130 and respectively contact both sides of the semiconductor layer 120 through the first and second contact holes 134 and 136.

The semiconductor layer 120, the gate electrode 130, the source electrode 144 and the drain electrode 146 constitute the TFT Tr. The TFT Tr serves as a driving element. Namely, the TFT Tr is the driving TFT Td (of FIG. 1).

In the TFT Tr, the gate electrode 130, the source electrode 144, and the drain electrode 146 are positioned over the semiconductor layer 120. Namely, the TFT Tr has a coplanar structure.

Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, the gate line and the data line cross each other to define the pixel region, and the switching TFT is formed to be connected to the gate and data lines. The switching TFT is connected to the TFT Tr as the driving element. In addition, the power line, which may be formed to be parallel to and spaced apart from one of the gate and data lines, and the storage capacitor for maintaining the voltage of the gate electrode of the TFT Tr in one frame may be further formed.

A planarization layer 150 is formed on an entire surface of the substrate 110 to cover the source and drain electrodes 144 and 146. The planarization layer 150 provides a flat top surface and has a drain contact hole 152 exposing the drain electrode 146 of the TFT Tr.

The OLED D is disposed on the planarization layer 150 and includes a first electrode 210, which is connected to the drain electrode 146 of the TFT Tr, an organic light emitting layer 220 and a second electrode 230. The organic light emitting layer 220 and the second electrode 230 are sequentially stacked on the first electrode 210. The OLED D is positioned in each of the red, green and blue pixel regions and respectively emits the red, green and blue light.

The first electrode 210 is separately formed in each pixel region. The first electrode 210 may be an anode and may include a transparent conductive oxide material layer, which may be formed of a conductive material, e.g., a transparent conductive oxide (TCO), having a relatively high work function.

For example, the transparent conductive oxide material layer may be formed of one of indium-tin-oxide (ITO), indium-zinc-oxide (IZO), indium-tin-zinc-oxide (ITZO), tin oxide (SnO), zinc oxide (ZnO), indium-copper-oxide (ICO) and aluminum-zinc-oxide (Al:ZnO, AZO).

The first electrode 210 may have a single-layered structure of the transparent conductive oxide material layer. Namely, the first electrode 210 may be a transparent electrode.

Alternatively, the first electrode 210 may further include a reflective layer to have a double-layered structure or a triple-layered structure. Namely, the first electrode 210 may be a reflective electrode.

For example, the reflective layer may be formed of one of silver (Ag), an alloy of Ag and one of palladium (Pd), copper (Cu), indium (In) and neodymium (Nd), and aluminum-palladium-copper (APC) alloy. For example, the first electrode 210 may have a double-layered structure of Ag/ITO or APC/ITO or a triple-layered structure of ITO/Ag/ITO or ITO/APC/ITO.

In addition, a bank layer 160 is formed on the planarization layer 150 to cover an edge of the first electrode 210. Namely, the bank layer 160 is positioned at a boundary of the pixel region and exposes a center of the first electrode 210 in the pixel region.

The organic light emitting layer 220 including an emitting material layer (EML) is formed on the first electrode 210. In the OLED D in the blue pixel region, the EML of the organic light emitting layer 220 includes a first blue emitting layer and a second blue emitting layer.

The organic light emitting layer 220 may further include at least one of a hole injection layer (HIL), a hole transporting layer (HTL), an electron blocking layer (EBL), a hole blocking layer (HBL), an electron transporting layer (ETL) and an electron injection layer (EIL) to have a multi-layered structure.

In an aspect of the present disclosure, the organic light emitting layer 220 of the OLED D in the blue pixel region may include a first blue emitting part including a first blue EML and a second blue emitting part including a second blue EML to have a tandem structure, and at least one of the first and second blue EMLs may include a first blue emitting layer and a second blue emitting layer. In this case, the organic light emitting layer 220 may further include a charge generation layer (CGL) between the first and second blue emitting parts.

As described below, in the OLED D of the blue pixel region, each of the first and second blue emitting layers includes a p-type host and an n-type host, the p-type host of the first blue emitting layer and the p-type host in the second blue emitting layer have different hole mobilities. As a result, a recombination zone of the hole and the electron in the EML is expanded (enlarged) so that the OLED D and the organic light emitting display device 100 of the present disclosure have low driving voltage and improved lifespan.

The second electrode 230 is formed over the substrate 110 where the organic light emitting layer 220 is formed. The second electrode 230 covers an entire surface of the display area and may be formed of a conductive material having a relatively low work function to serve as a cathode. For example, the second electrode 230 may be formed of aluminum (Al), magnesium (Mg), calcium (Ca), silver (Ag) or their alloy, e.g., Mg—Ag alloy (MgAg).

In a top-emission type OLED D, the first electrode 210 serves as a reflective electrode, and the second electrode 230 has a thin profile to serve as a transparent (or a semi-transparent) electrode. Alternatively, in a bottom-emission type OLED, the first electrode 210 serves as a transparent electrode, and the second electrode 230 serves as a reflective electrode.

Although not shown, the OLED D may further include a capping layer on the second electrode 230. The emitting efficiency of the OLED D and the organic light emitting display device 100 may be further improved by the capping layer.

An encapsulation layer (or an encapsulation film) 170 is formed on the second electrode 230 to prevent penetration of moisture into the OLED D. The encapsulation layer 170 includes a first inorganic insulating layer 172, an organic insulating layer 174 and a second inorganic insulating layer 176 sequentially stacked, but it is not limited thereto.

Alternatively, in the bottom-emission type organic light emitting display device 100, a metal encapsulation plate may be disposed over the second electrode 230. For example, the metal encapsulation plate may be attached to the OLED D using an adhesive layer.

Although not shown, the organic light emitting display device 100 may include a color filter layer corresponding to the red, green and blue pixel regions. For example, the color filter layer may be positioned on or over the OLED D or between the substrate 110 and the OLED D. In the top-emission type organic light emitting display device 100, the color filter layer may be formed on the encapsulation layer 170.

The organic light emitting display device 100 may further include a polarization plate for reducing an ambient light reflection. For example, the polarization plate may be a circular polarization plate. In the bottom-emission type organic light emitting display device 100, the polarization plate may be disposed under the substrate 110. In the top-emission type organic light emitting display device 100, the polarization plate may be disposed on or over the encapsulation layer 170.

In addition, the organic light emitting display device 100 may further include a cover window on or over the encapsulation layer 170 or the polarization plate. In this instance, the substrate 110 and the cover window have a flexible property such that a flexible organic light emitting display device may be provided.

Figure 3:
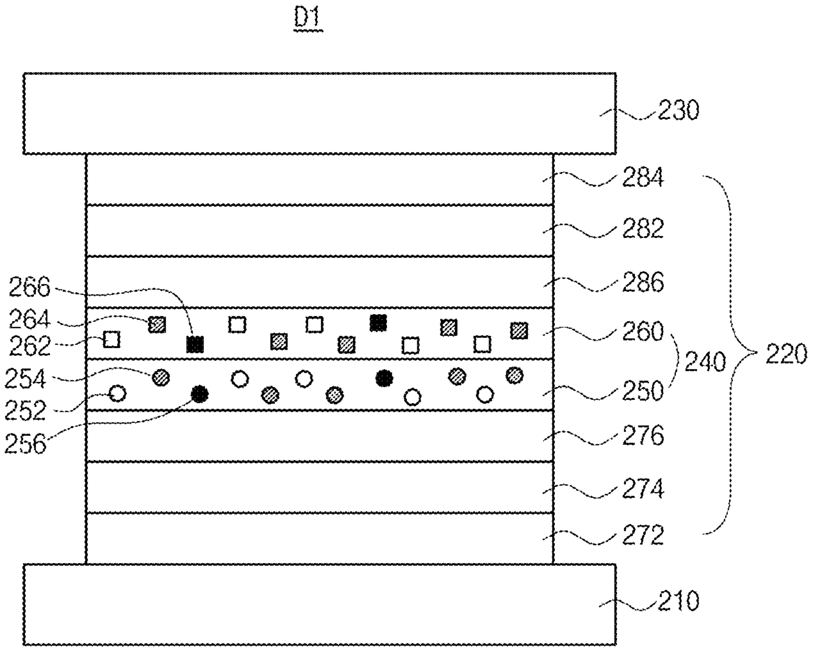
FIG. 3 is a schematic cross-sectional view of an OLED according to a second embodiment of the present disclosure.

FIG. 3 is a schematic cross-sectional view of an OLED according to a second embodiment of the present disclosure.

As shown in FIG. 3, the OLED D1 includes first and second electrodes 210 and 230, which face each other, and an organic light emitting layer 220 therebetween. The organic light emitting layer 220 includes a blue emitting material layer (EML) 240, and the blue EML 240 includes a first blue emitting layer 250 and a second blue emitting layer 260. The OLED D1 may further include a capping layer on the second electrode 230 to enhance a light extraction efficiency.

The organic light emitting display device 100 (of FIG. 2) may include a red pixel region, a green pixel region and a blue pixel region, and the OLED D1 may be positioned in the blue pixel region.

The first electrode 210 may be an anode, and the second electrode 230 may be a cathode. One of the first and second electrodes 210 and 230 may be a reflective electrode, and the other one of the first and second electrodes 210 and 230 may be a transparent (or a semi-transparent) electrode. For example, the first electrode 210 may have a single-layered structure of ITO, and the second electrode 230 may be formed of Al.

The light emitting layer 220 further include at least one of a hole transporting layer (HTL) 274 between the first electrode 210 and the EML 240 and an electron transporting layer (ETL) 282 between the second electrode 230 and the EML 240.

In addition, the light emitting layer 220 may further include at least one of a hole injection layer (HIL) 272 between the first electrode 210 and the HTL 274 and an electron injection layer (EIL) 284 between the second electrode 230 and the ETL 282.

Moreover, the light emitting layer 220 may further include at least one of an electron blocking layer (EBL) 276 between the HTL 274 and the EML 240 and a hole blocking layer (HBL) 286 between the EML 240 and the ETL 282.

In the blue EML 240, the second blue emitting layer 260 contacts the first blue emitting layer 250 and positioned on the first blue emitting layer 250 so that the blue EML 240 has a double-layered structure. Alternatively, the blue EML 240 may further include another second blue emitting layer contacting the first blue emitting layer and positioned on the first blue emitting layer or another first blue emitting layer contacting the second blue emitting layer and positioned on the second blue emitting layer to have a triple-layered structure.

The first blue emitting layer 250 includes a first p-type host 252 and a first n-type host 254, and the second blue emitting layer 260 includes a second p-type host 262 and a second n-type host 264. The first blue emitting layer 250 may further include a first phosphorescent dopant (e.g., phosphorescent emitter) 256 and the second blue emitting layer 260 may further include a second phosphorescent dopant 266.

One of the first p-type host 252 and the second p-type host 262 is a first compound represented by one of Formula 1a and Formula 1b.

[Formula 1a]

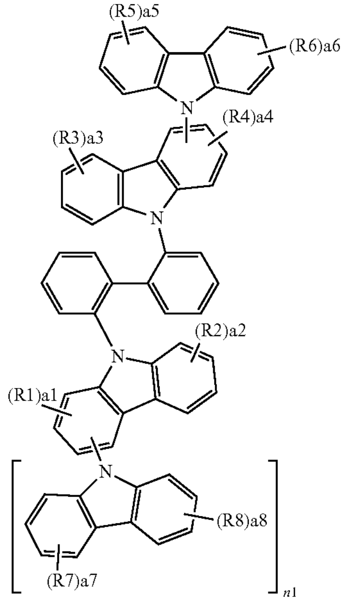

[Formula 1b]

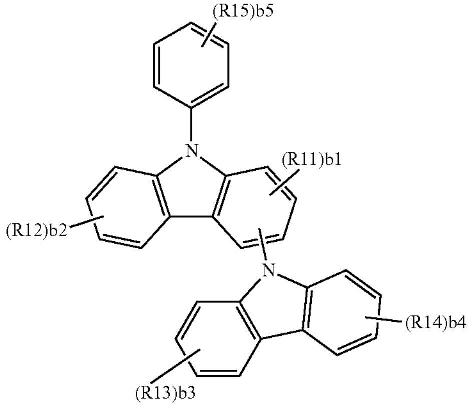

In Formula 1a, each of a1 and a4 is independently an integer of 0 to 3, each of a2, a3 and a5 to a8 is independently an integer of 0 to 4, n1 is 0 or 1, and each of R1 to R8 is independently selected from the group consisting of deuterium, halogen, cyano, a substituted or unsubstituted C6 to C30 arylsilyl group, a substituted or unsubstituted C1 to C20 alkyl group, a substituted or unsubstituted C6 to C30 aryl group, a substituted or unsubstituted C5 to C60 heteroaryl group, a substituted or unsubstituted C1 to C30 alkylamino group and a substituted or unsubstituted C6 to C60 arylamino group.

In Formula 1b, b1 is an integer of 0 to 3, each of b2 to b4 is independently an integer of 0 to 4, b5 is an integer of 0 to 5, and each of R11 to R15 is independently selected from the group consisting of deuterium, halogen, cyano, a substituted or unsubstituted C6 to C30 arylsilyl group, a substituted or unsubstituted C1 to C20 alkyl group, a substituted or unsubstituted C6 to C30 aryl group, a substituted or unsubstituted C5 to C60 heteroaryl group, a substituted or unsubstituted C1 to C30 alkylamino group and a substituted or unsubstituted C6 to C60 arylamino group.

In the present disclosure, without specific definition, a substituent of an arylsilyl group, an alkyl group, an aryl group, a heteroaryl group, an alkylamino group and an arylamino group may be selected from deuterium, halogen, cyano, a substituted or unsubstituted C6 to C30 arylsilyl group, a substituted or unsubstituted C6 to C30 arylgermyl group, a substituted or unsubstituted C1 to C20 alkyl group and a substituted or unsubstituted C6 to C30 aryl group.

In the present disclosure, without specific definition, a C6 to C30 aryl group may be selected from the group consisting of phenyl, biphenyl, terphenyl, naphthyl, anthracenyl, pentacenyl, indenyl, indenoindenyl, heptalenyl, biphenylenyl, indacenyl, phenanthrenyl, benzophenanthrenyl, dibenzophenanthrenyl, azulenyl, pyrenyl, fluoranthenyl, triphenylenyl, chrysenyl, tetraphenyl, tetracenyl, picenyl, pentaphenyl, pentacenyl, fluorenyl, indenofluorenyl and spiro-fluorenyl.

In the present disclosure, without specific definition, a C3 to C60 heteroaryl group may be selected from the group consisting of pyrrolyl, pyridinyl, pyrimidinyl, pyrazinyl, pyridazinyl, triazinyl, tetrazinyl, imidazolyl, pyrazolyl, indolyl, isoindolyl, indazolyl, indolizinyl, pyrrolizinyl, carbazolyl, benzocarbazolyl, dibenzocarbazolyl, indolocarbazolyl, indenocarbazolyl, benzofurocarbazolyl, benzothienocarbazolyl, quinolinyl, isoquinolinyl, phthalazinyl, quinoxalinyl, cinnolinyl, quinazolinyl, quinozolinyl, quinolinyl, purinyl, phthalazinyl, quinoxalinyl, benzoquinolinyl, benzoisoquinolinyl, benzoquinazolinyl, benzoquinoxalinyl, acridinyl, phenanthrolinyl, perimidinyl, phenanthridinyl, pteridinyl, cinnolinyl, naphtharidinyl, furanyl, oxazinyl, oxazolyl, oxadiazolyl, triazolyl, dioxynyl, benzofuranyl, dibenzofuranyl, thiopyranyl, xanthenyl, chromanyl, isochromanyl, thioazinyl, thiophenyl, benzothiophenyl, dibenzothiophenyl, difuropyrazinyl, benzofurodibenzofuranyl, benzothienobenzothiophenyl, benzothienodibenzothiophenyl, benzothienobenzofuranyl, and benzothienodibenzofuranyl.

In an aspect of the present disclosure, in Formula 1a, n1 may be 1. Each of a1 to a8 may be 0. Alternatively, each of a1 and a4 is 3, each of a2, a3 and a5 to a8 may be 4, and each of R1 to R8 may be deuterium.

In an aspect of the present disclosure, in Formula 1b, each of b1 to b5 may be 0. Alternatively, b1 may be 3, each of b2 to b4 may be 4, b5 may be 5, and each of R11 to R15 may be deuterium.

In Formula 1 a, a linking position of a carbazole moiety in a biscarbazole moiety may be specified. For example, Formula 1a may be represented by one of Formulas 1a-1 to 1a-4.

[Formula 1a-1]

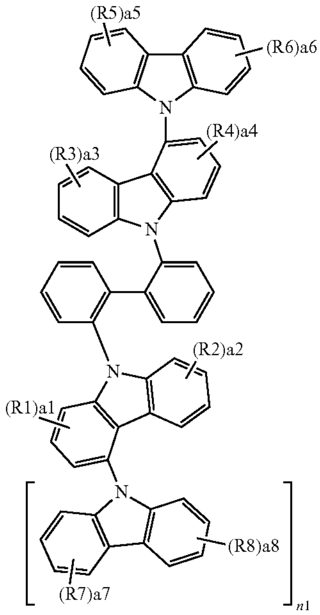

[Formula 1a-2]

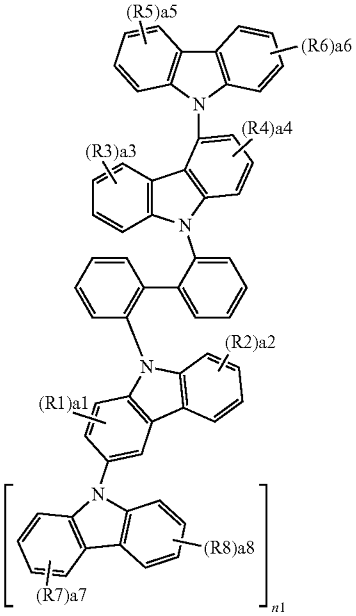

-continued

[Formula 1a-3]

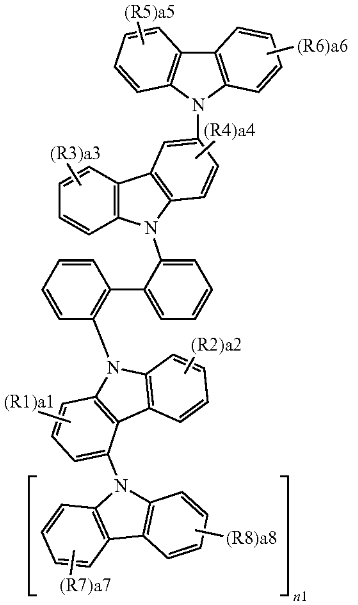

[Formula 1a-4]

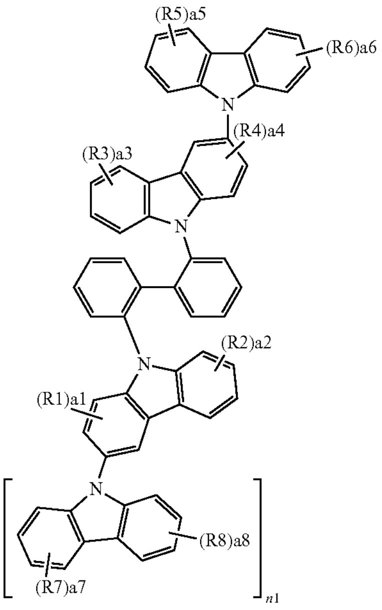

In each of Formulas 1a-1 to 1a-4, definitions of a1 to a8, n1 and R1 to R8 are same as those in Formula 1a.

In Formula 1b, a linking position of a carbazole moiety in a biscarbazole moiety may be specified. For example, Formula 1b may be represented by Formula 1b-1 or Formula 1b-2.

[Formula 1b-1]

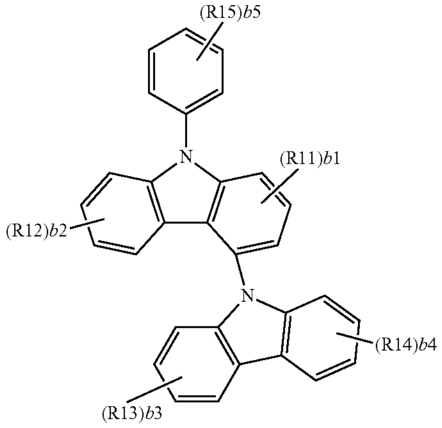

[Formula 1b-2]

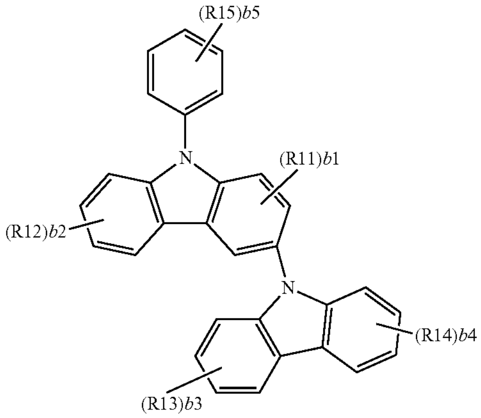

In each of Formulas 1b-1 and 1b-2, definitions of b1 to b5 and R11 to R15 are same as those in Formula 1b.

The first compound, which is one of the first p-type host 252 and the second p-type host 262, may be one of compounds in Formula 2.

[Formula 2]

1-1

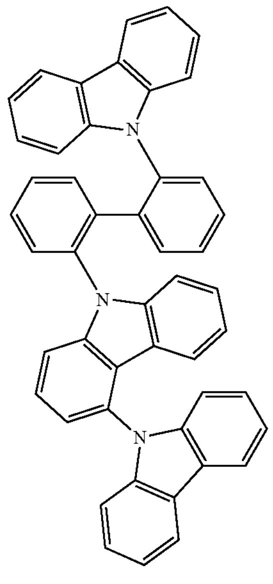

-continued
1-2
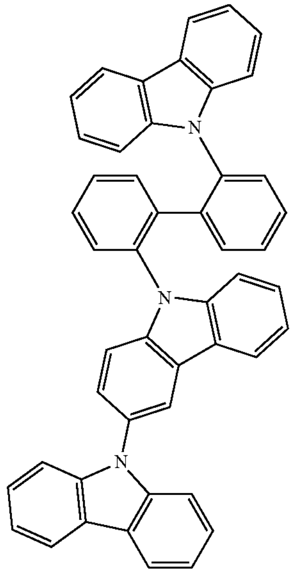
1-3
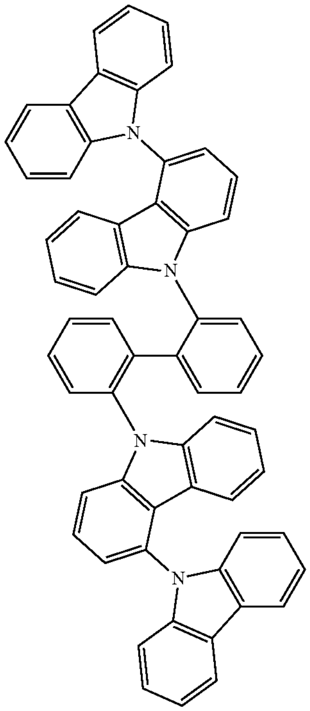
-continued
1-4
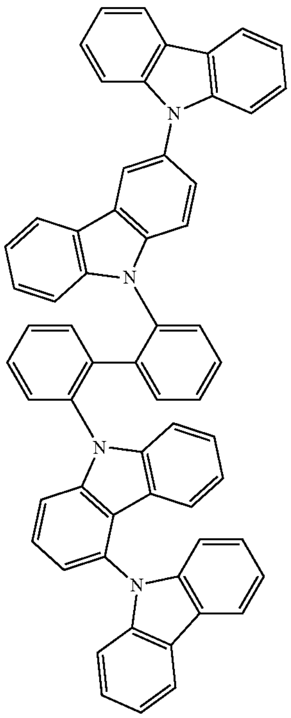
1-5
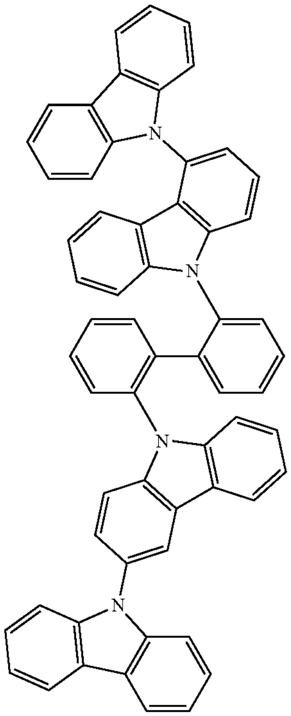

-continued
1-6
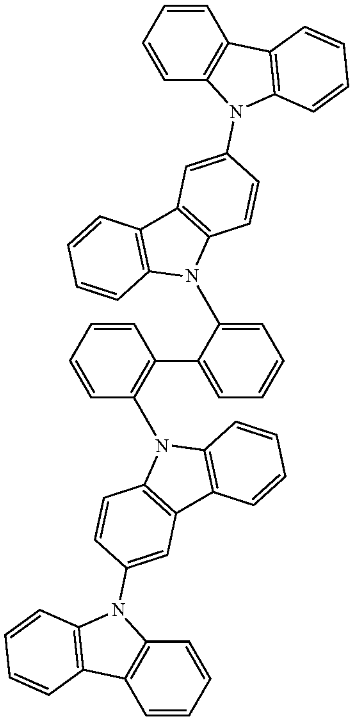
1-7
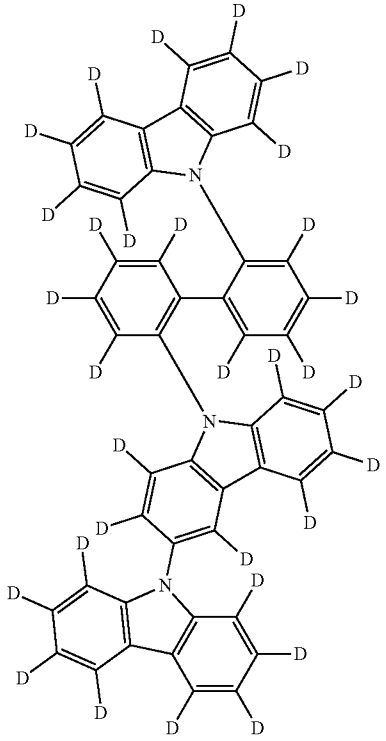
-continued
1-8
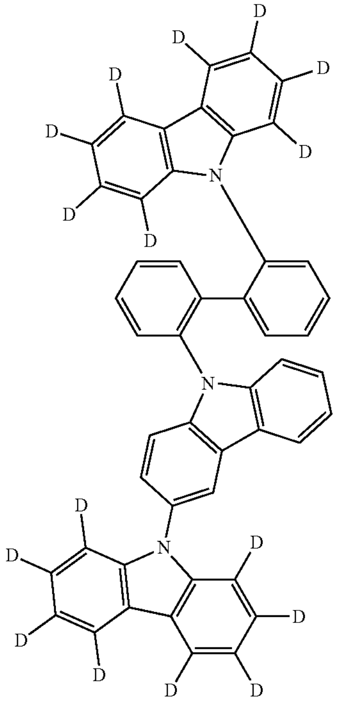
1-9
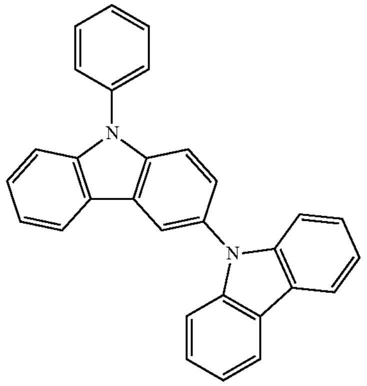
1-10
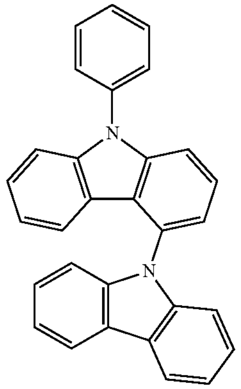

-continued 1-11

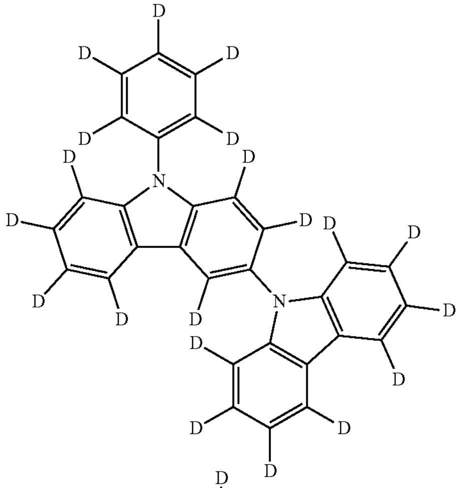

1-12

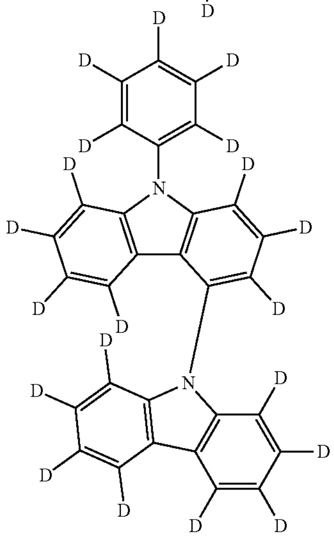

The other one of the first p-type host 252 and the second p-type host 262 is a second compound represented by one of Formula 3a and Formula 3b.

[Formula 3a]

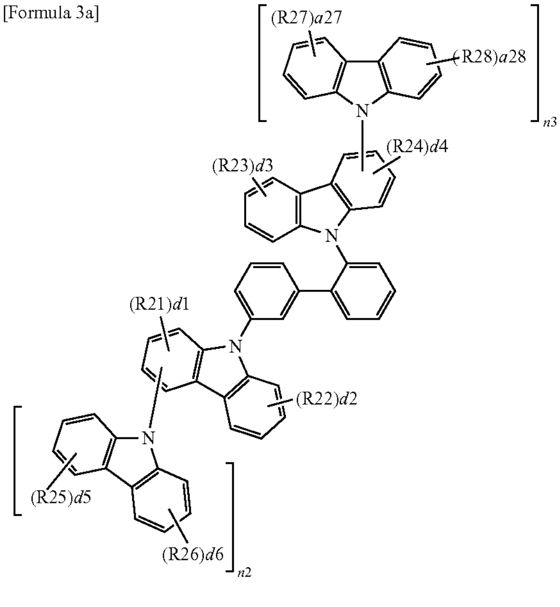

-continued

[Formula 3b]

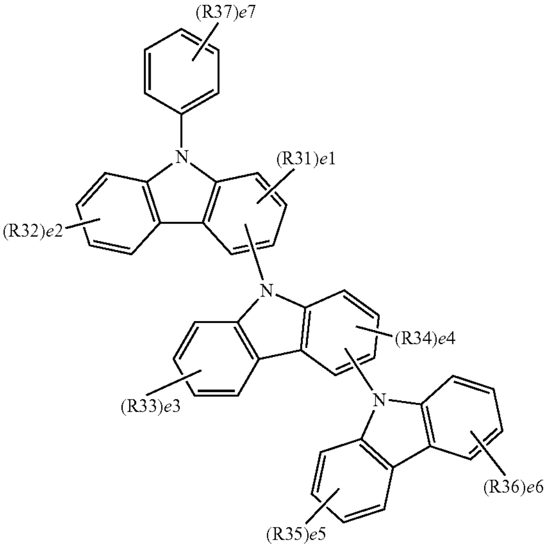

In Formula 3a, each of d1 and d4 is independently an integer of 0 to 3, each of d2, d3, d5, d6, a27 to a28 is independently an integer of 0 to 4, each of n2 and n3 is independently 0 or 1, and each of R21 to R28 is independently selected from the group consisting of deuterium, halogen, cyano, a substituted or unsubstituted C6 to C30 arylsilyl group, a substituted or unsubstituted C1 to C20 alkyl group, a substituted or unsubstituted C6 to C30 aryl group, a substituted or unsubstituted C5 to C60 heteroaryl group, a substituted or unsubstituted C1 to C30 alkylamino group and a substituted or unsubstituted C6 to C60 arylamino group.

In Formula 3b, each of e1 and e4 is independently an integer of 0 to 3, each of e2, e3, e5 and e6 is independently an integer of 0 to 4, e7 is an integer of 0 to 5, and each of R31 to R37 is independently selected from the group consisting of deuterium, halogen, cyano, a substituted or unsubstituted C6 to C30 arylsilyl group, a substituted or unsubstituted C1 to C20 alkyl group, a substituted or unsubstituted C6 to C30 aryl group, a substituted or unsubstituted C5 to C60 heteroaryl group, a substituted or unsubstituted C1 to C30 alkylamino group and a substituted or unsubstituted C6 to C60 arylamino group.

In an aspect of the present disclosure, in Formula 3a, at least one of n2 and n3 may be 1. One of n2 and n3 may be 0, and the other one of n2 and n3 may be 1. In addition, each of d1 to d6 and a27 to a28 may be 0. Alternatively, each of d1 and d4 is 3, each of d2, d3, d5, d6, a27 to a28 may be 4, and each of R21 to R28 may be deuterium.

In an aspect of the present disclosure, in Formula 3b, each of e1 to e7 may be 0. Alternatively, each of e1 and e4 may be 3, each of e2, e3, e5 and e6 may be 4, e7 may be 5, and each of R31 to R37 may be deuterium.

In Formula 3a, a linking position of a carbazole moiety in a biscarbazole moiety may be specified. For example, Formula 3a may be represented by one of Formulas 3a-1 to 3a-4.

[Formula 3a-1]
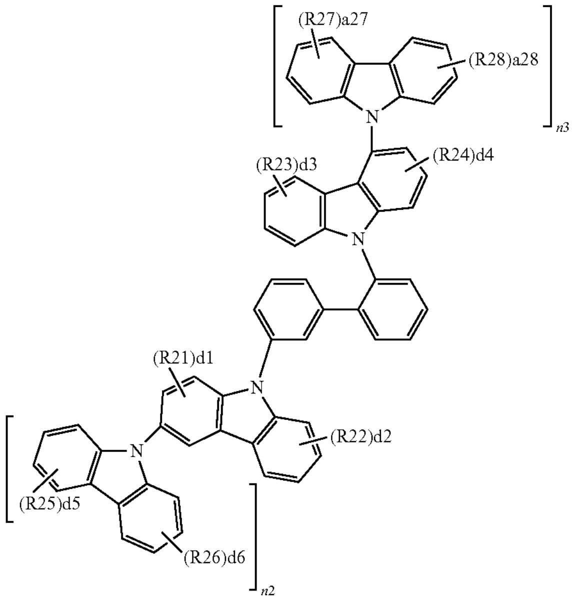
[Formula 3a-2]
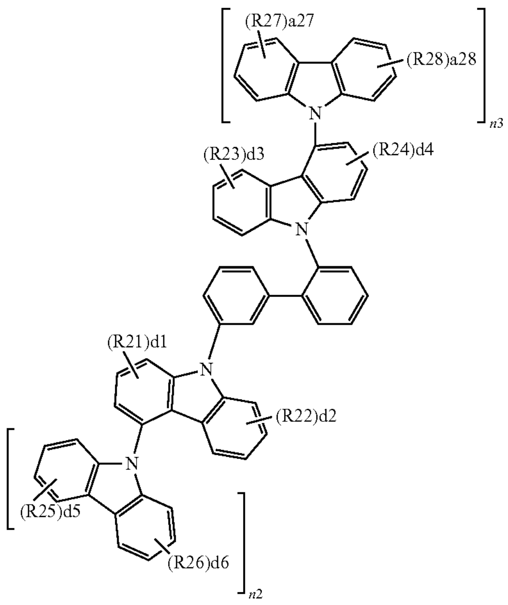
-continued
[Formula 3a-3]
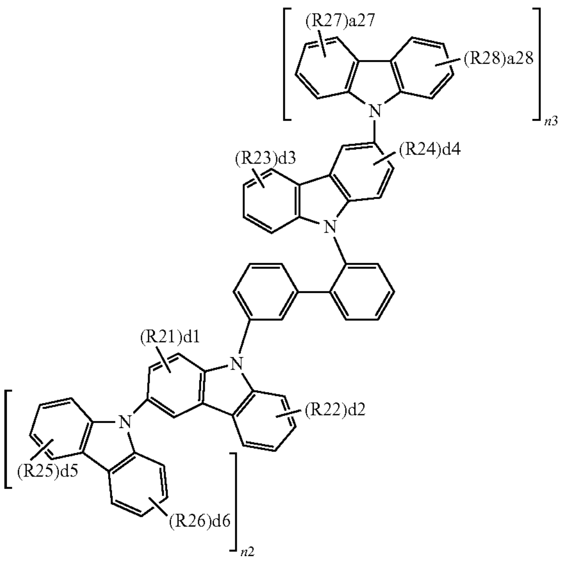
[Formula 3a-4]
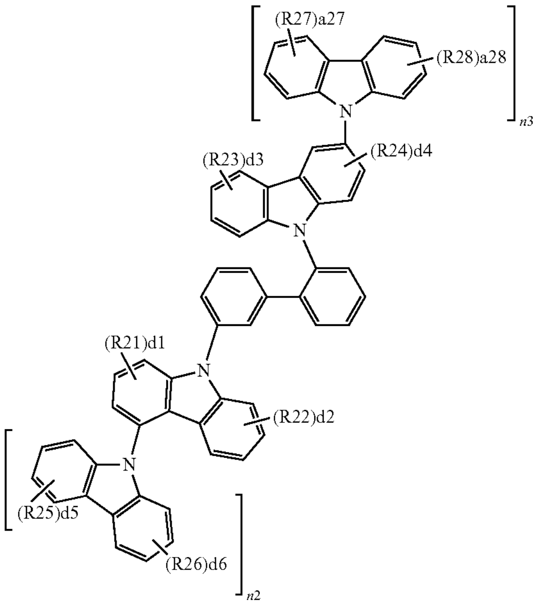
In each of Formulas 3a-1 to 3a-4, definitions of d1 to d6, a27 to a28, n2, n3 and R21 to R28 are same as those in Formula 3a.
In Formula 3b, a linking position of a carbazole moiety in a biscarbazole moiety may be specified. For example, Formula 3b may be represented by one of Formulas 3b-1 to 3b-4.

-continued
[Formula 3b-1]
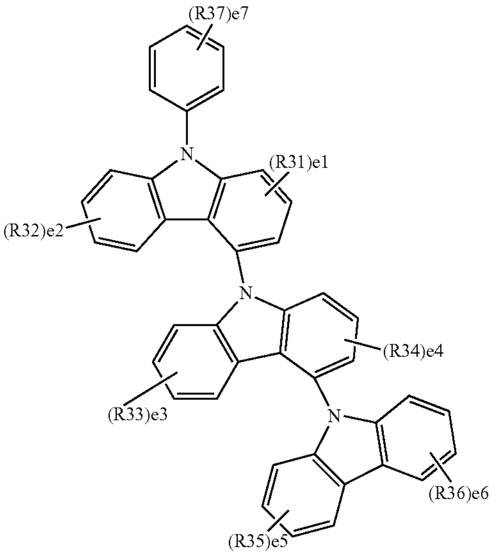
[Formula 3b-3]
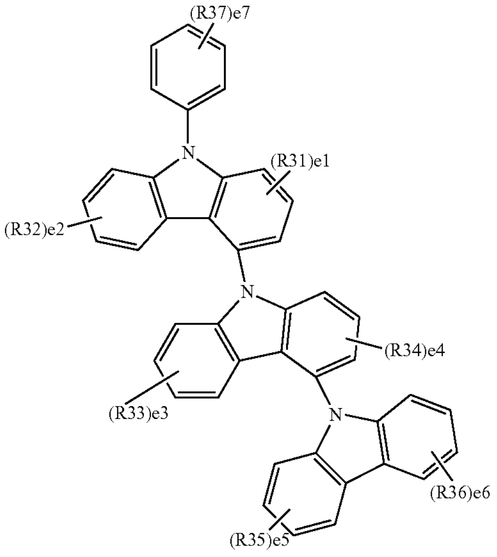
[Formula 3b-2]
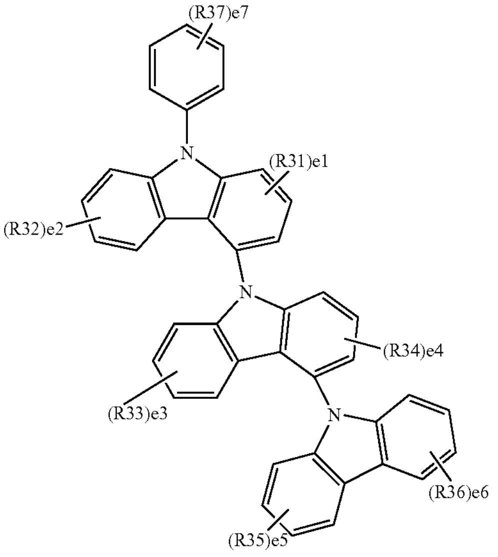
[Formula 3b-4]
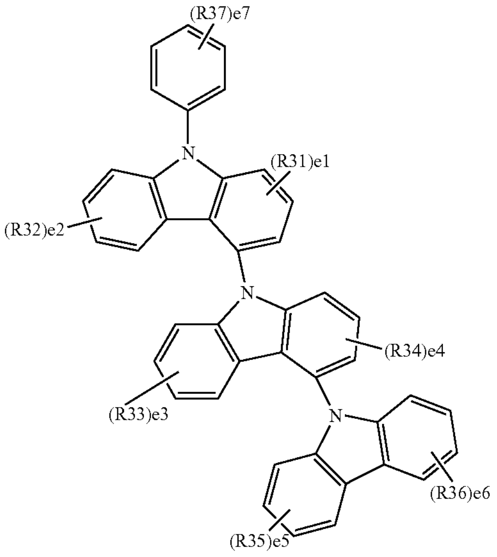
In each of Formulas 3b-1 to 3b-4, definitions of e1 to e7 and R31 to R37 are same as those in Formula 3b.
The second compound, which is the other one of the first p-type host 252 and the second p-type host 262, may be one of compounds in Formula 4.

[Formula 4]
2-1
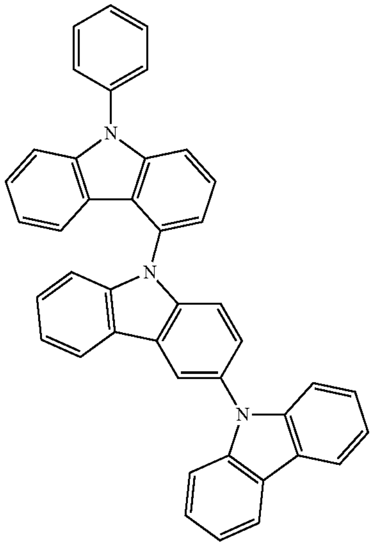
2-2
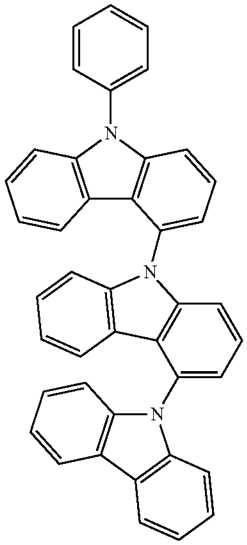
2-3
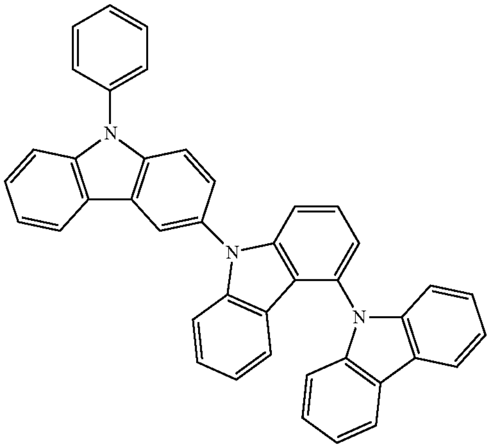
-continued
2-4
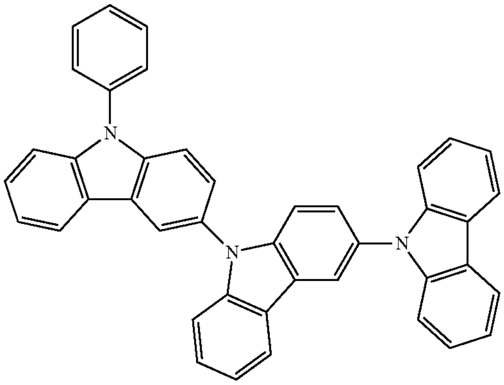
2-5
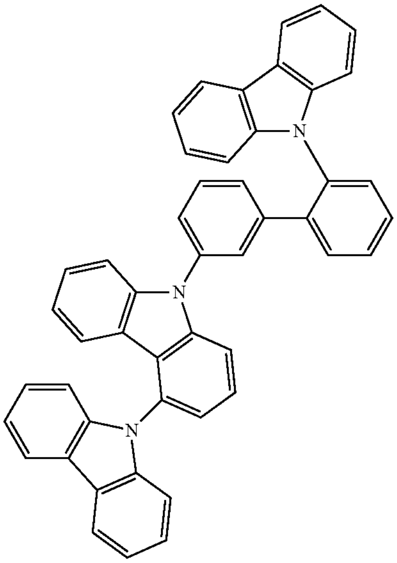
20-6
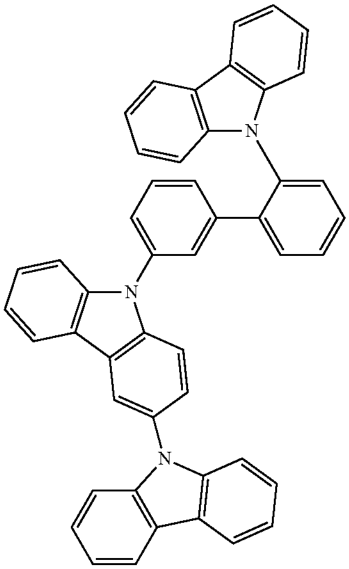

-continued
2-7
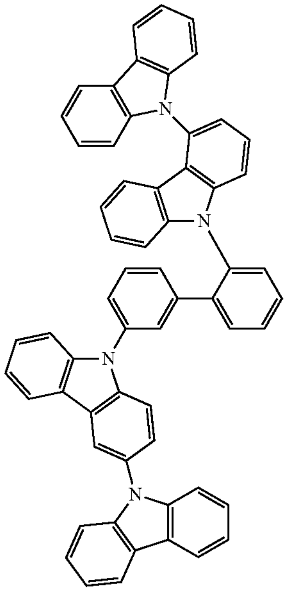
2-8
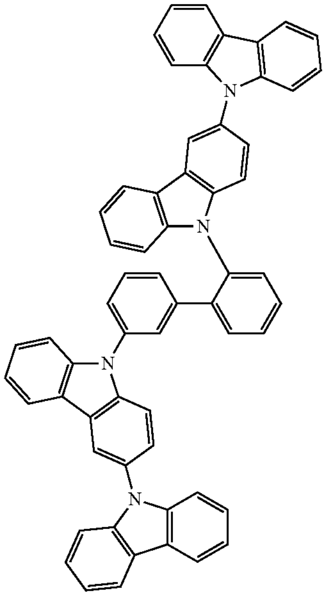
-continued
2-9
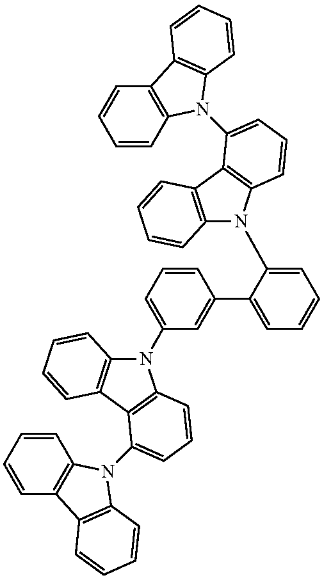
2-10
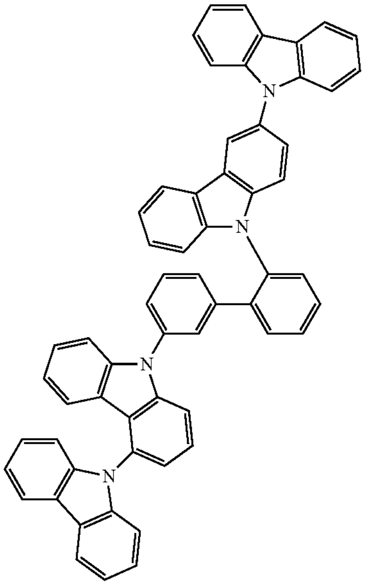

-continued 2-11

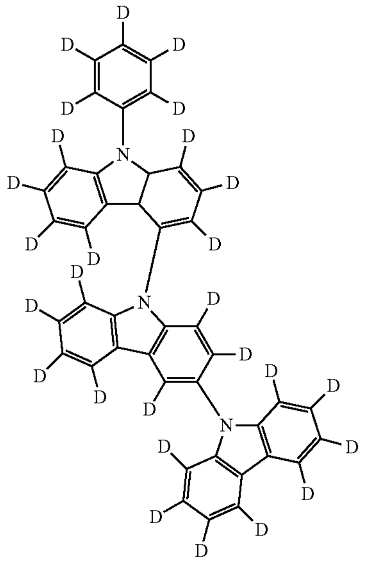

Each of the first n-type host 254 and the second n-type host 264 is a compound represented by Formula 5.

[Formula 5]

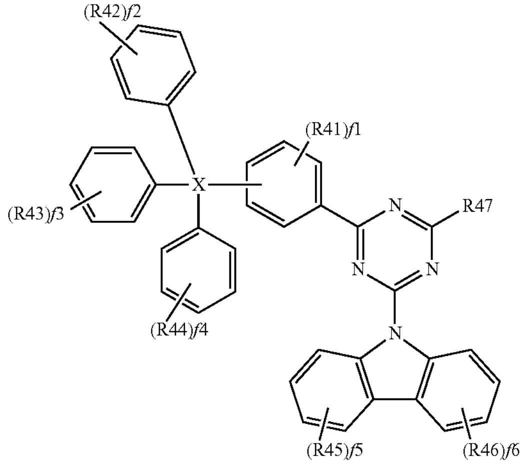

In Formula 5, each of f1, f5 and f6 is independently an integer of 0 to 4, each of f2 to f4 is independently an integer of 0 to 5, X is selected from the group consisting of C, Si and Ge, and each of R41 to R47 is independently selected from the group consisting of deuterium, halogen, cyano, a substituted or unsubstituted C6 to C30 arylsilyl group, a substituted or unsubstituted C6 to C30 arylgermyl group, a substituted or unsubstituted C1 to C20 alkyl group, a substituted or unsubstituted C6 to C30 aryl group, a substituted or unsubstituted C5 to C60 heteroaryl group, a substituted or unsubstituted C1 to C30 alkylamino group and a substituted or unsubstituted C6 to C60 arylamino group.

In an aspect of the present disclosure, R47 may be selected from the group consisting of a substituted or unsubstituted C6 to C30 aryl group, e.g., phenyl or phenyl substituted with triphenylsilyl, and a substituted or unsubstituted C5 to C60 heteroaryl group, e.g., carbazolyl or biscarbazolyl (bicarbazolyl).

In an aspect of the present disclosure, each of f2, f3 and f4 may be 5, and each of R42, R43 and R44 may be deuterium. In an aspect of the present disclosure, each of f1, f5 and f6 may be 4, and each of R41, R45 and R46 may be deuterium. Alternatively, each of f5 and f6 may be 1, each of R45 and R46 may be a substituted or unsubstituted C5 to C60 heteroaryl group, e.g., carbazolyl.

For example, each of the first n-type host 254 and the second n-type host 264 may be independently selected from compounds in Formula 6. The first n-type host 254 and the second n-type host 264 may be same or different.

[Formula 6]

3-1

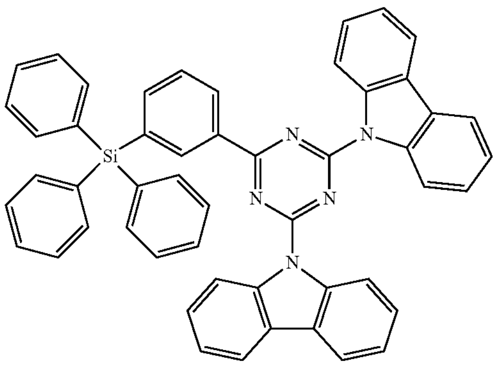

3-2

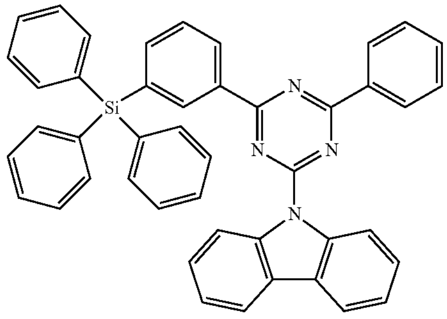

3-3

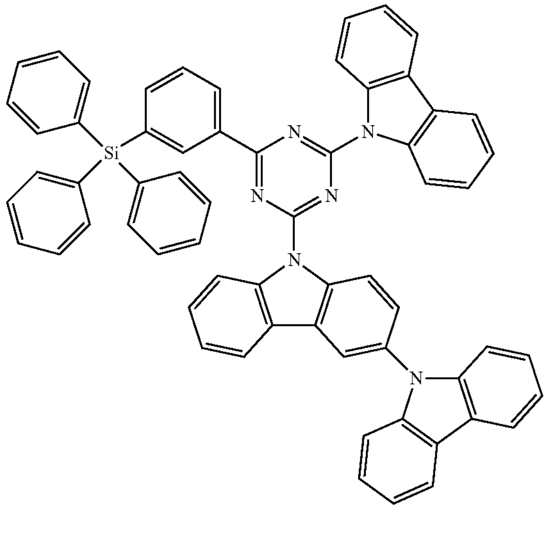

-continued
3-4
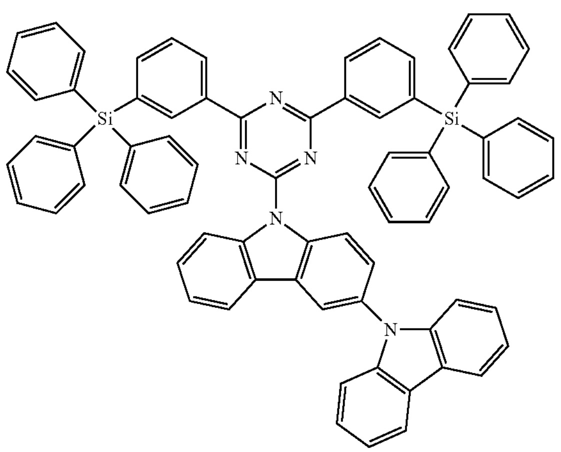
3-5
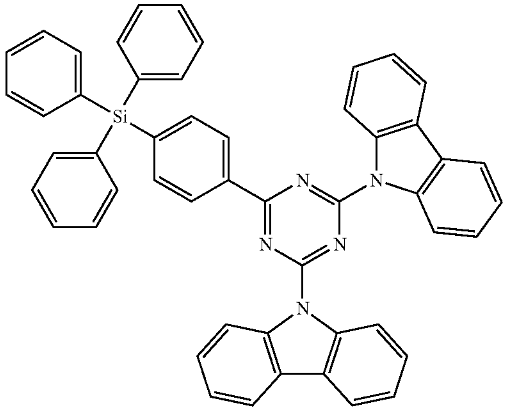
3-6
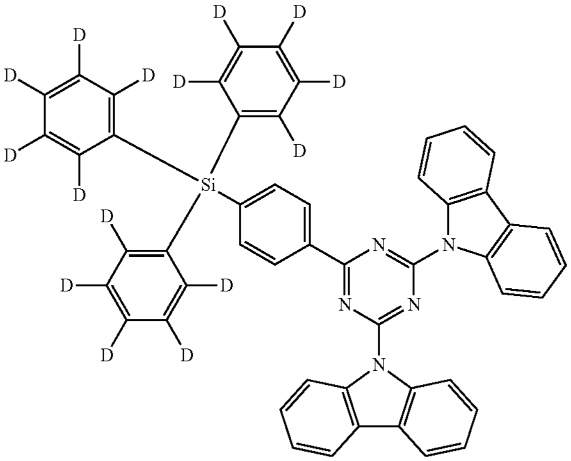
-continued
3-7
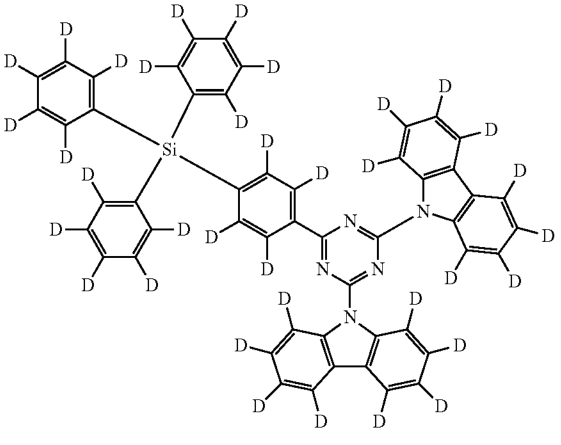
3-8
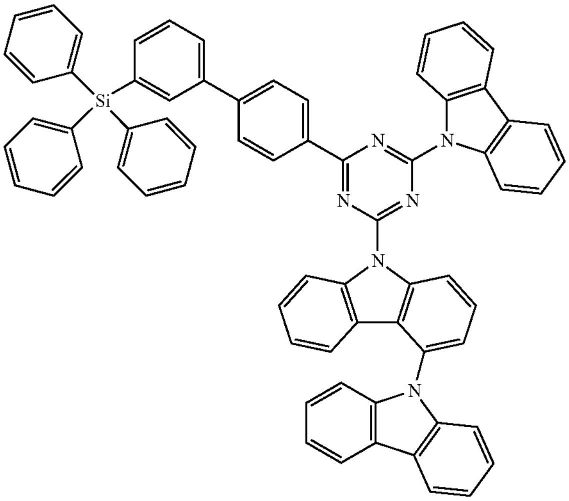
3-9
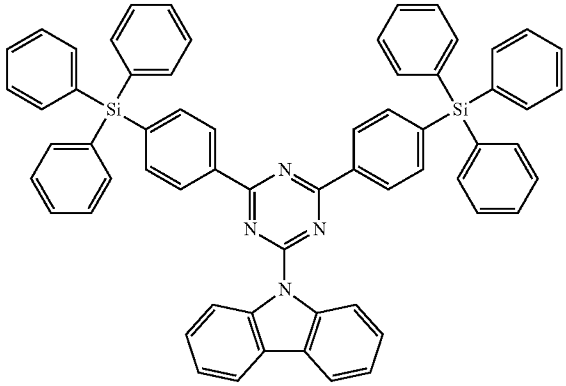

-continued 3-10

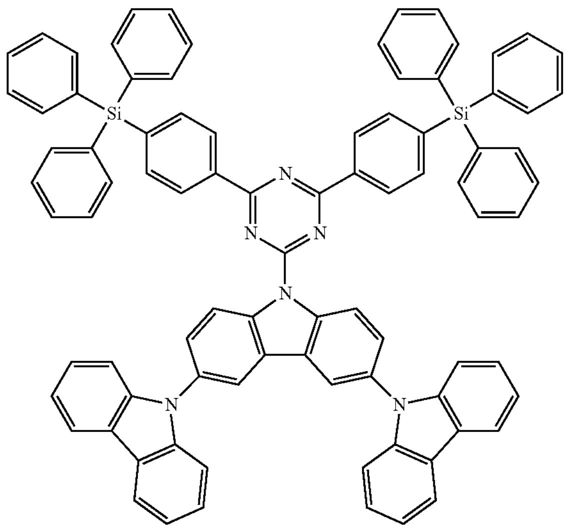

3-11

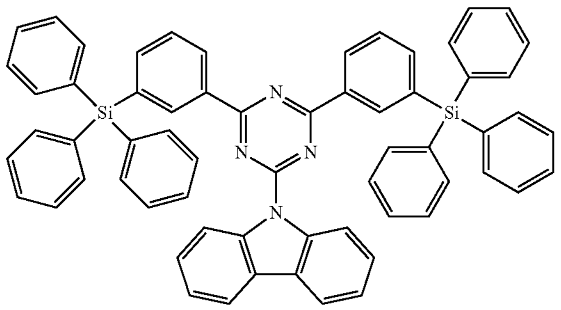

3-12

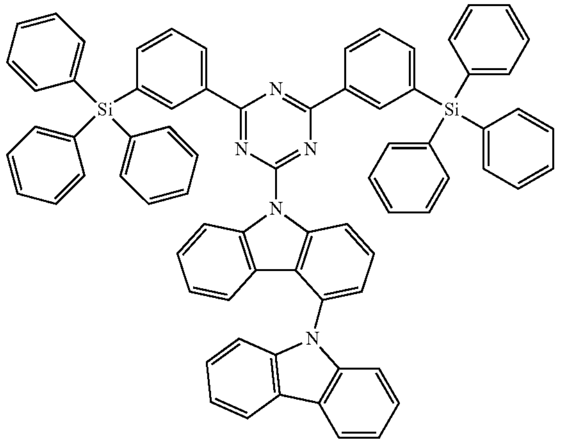

-continued 3-13

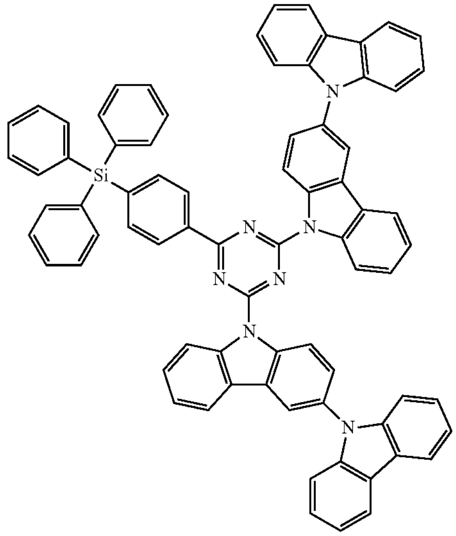

Each of the first phosphorescent dopant 256 and the second phosphorescent dopant 266 is a compound represented by Formula 7.

[Formula 7]

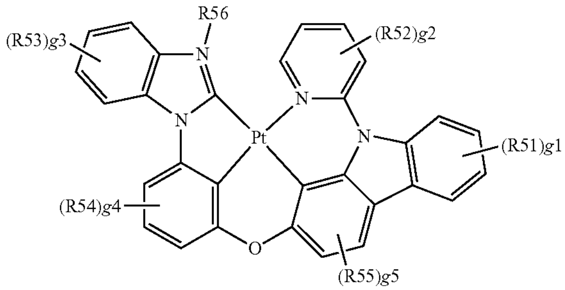

In Formula 7, each of R51 to R56 is independently selected from the group consisting of deuterium, halogen, cyano, a substituted or unsubstituted C1 to C20 alkyl group, a substituted or unsubstituted C3 to C20 cycloalkyl group, a substituted or unsubstituted C1 to C20 alkylsilyl group, a substituted or unsubstituted C1 to C20 alkylamino group, a substituted or unsubstituted C6 to C30 arylamino group, a substituted or unsubstituted C6 to C30 arylsilyl group, a substituted or unsubstituted C6 to C30 aryl group and a substituted or unsubstituted C3 to C30 heteroaryl group, each of g1, g2 and g3 is independently an integer of 0 to 4, and g4 is an integer of 0 to 3, and g5 is an integer of 0 to 2.

In an aspect of the present disclosure, each of R51 to R56 may be independently selected from the group consisting of a substituted or unsubstituted C1 to C20 alkyl group, e.g., methyl or tert-butyl, a substituted or unsubstituted C3 to C20 cycloalkyl group, e.g., adamantanyl, and a substituted or unsubstituted C6 to C30 aryl group, e.g., phenyl. In an aspect of the present disclosure, at least one of g1 to g5 may be a positive integer.

For example, each of the first phosphorescent dopant 256 and the second phosphorescent dopant 266 may be independently selected from compounds in Formula 8. The first phosphorescent dopant 256 and the second phosphorescent dopant 266 may be same or different.
[Formula 8]
4-1
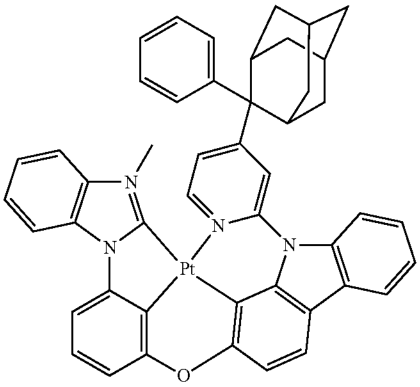
4-2
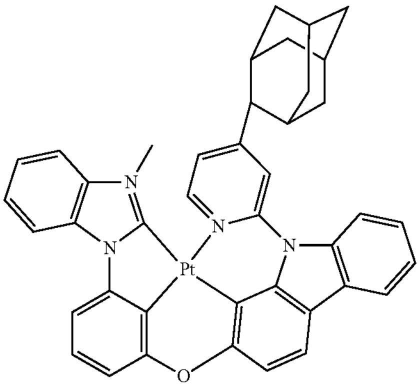
4-3
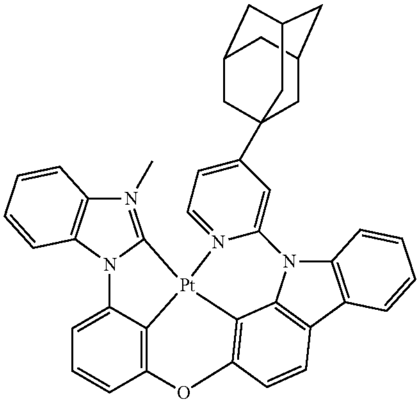
4-4
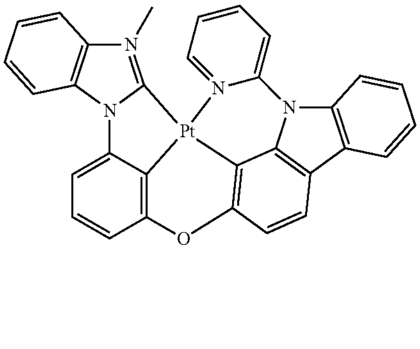
-continued
4-5
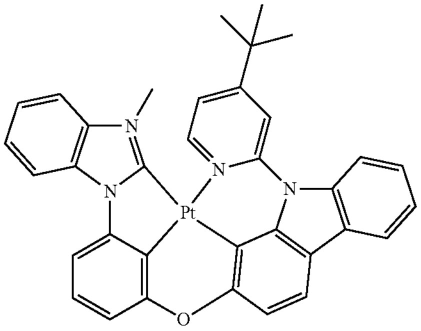
4-6
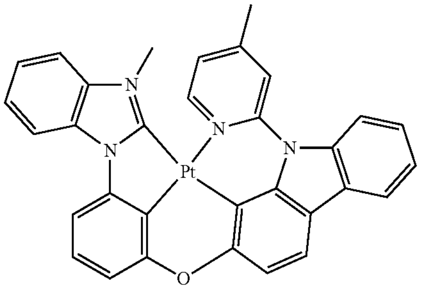
4-7
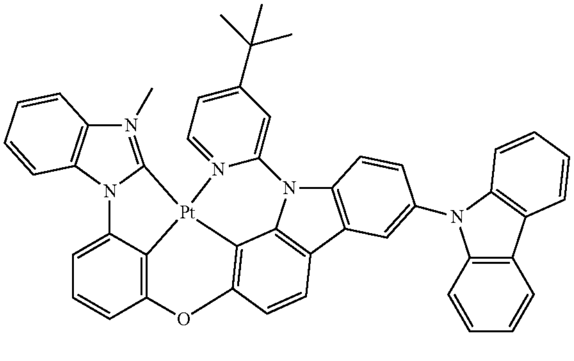
4-8
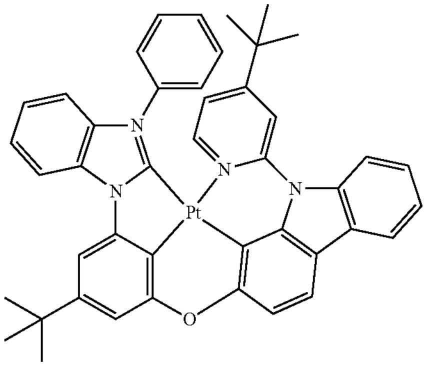

-continued 4-9

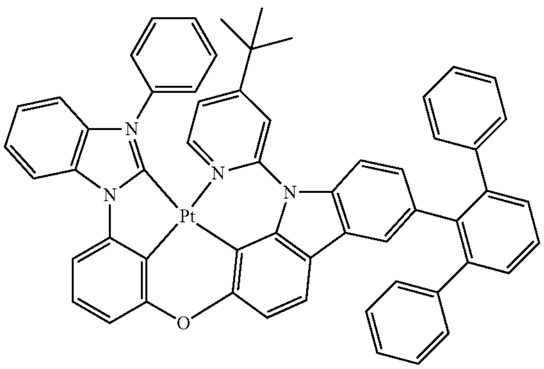

4-10

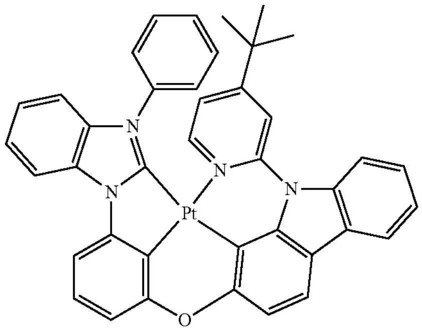

4-11

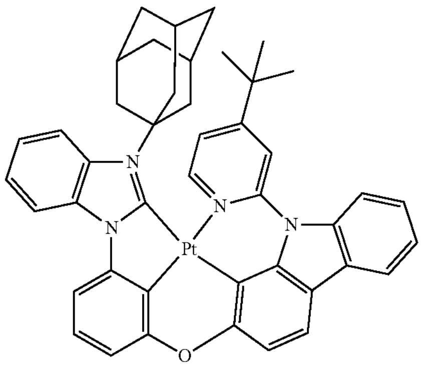

4-12

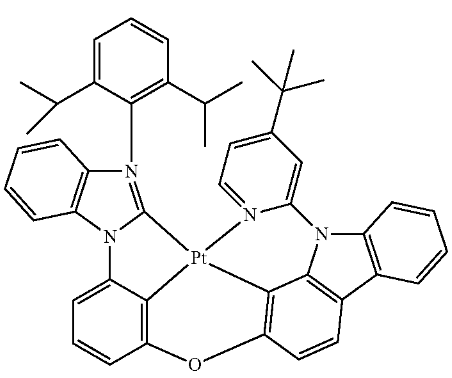

-continued 4-13

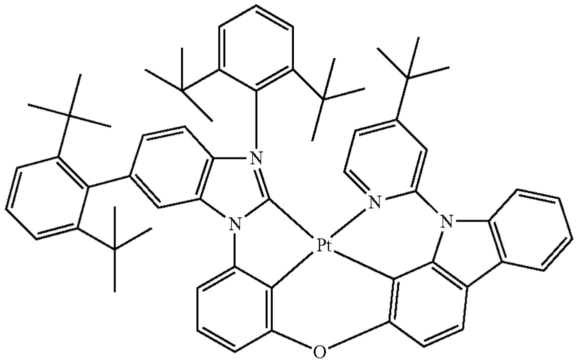

In the first blue emitting layer 250, a weight % of each of the first p-type host 252 and the first n-type host 254 may be greater than that of the first phosphorescent dopant 256, and the weight % of the first p-type host 252 and the weight % of the first n-type host 254 may be same or different. For example, in the first blue emitting layer 250, the first p-type host 252 and the first n-type host 254 may have the same weight %, and each of the first p-type host 252 and the first n-type host 254 may have a part by weight of 200 to 600 with respect to the first phosphorescent dopant 256.

In the second blue emitting layer 260, a weight % of each of the second p-type host 262 and the second n-type host 264 may be greater than that of the second phosphorescent dopant 266, and the weight % of the second p-type host 262 and the weight % of the second n-type host 264 may be same or different. For example, in the second blue emitting layer 260, the second p-type host 262 and the second n-type host 264 may have the same weight %, and each of the second p-type host 262 and the second n-type host 264 may have a part by weight of 200 to 600 with respect to the second phosphorescent dopant 266.

The blue EML 240 may have a thickness of 10 to 100 nm, and each of the first and second blue emitting layers 250 and 260 may have a thickness of 5 to 50 nm. For example, the blue EML 240 may have a thickness of 20 to 40 nm, and each of the first and second blue emitting layers 250 and 260 may have a thickness of 5 to 30 nm. The thickness of the first blue emitting layer 250 and the thickness of the second blue emitting layer 260 may be same or different.

For example, the HIL 272 may include a hole injection material selected from the group consisting of 4,4',4"-tris(3-methylphenylamino)triphenylamine (MTDATA), 4,4',4"-tris(N,N-diphenyl-amino)triphenylamine (NATA), 4,4',4"-tris(N-(naphthalene-1-yl)-N-phenyl-amino)triphenylamine (1T-NATA), 4,4',4"-tris(N-(naphthalene-2-yl)-N-phenyl-amino)triphenylamine (2T-NATA), copper phthalocyanine (CuPc), tris(4-carbazoyl-9-yl-phenyl)amine (TCTA), N,N'-diphenyl-N,N'-bis(1-naphthyl)-1,1'-biphenyl-4,4"-diamine (NPB orNPD), 1,4,5,8,9,11-hexaazatriphenylenehexacarbonitrile(dipyrazino[2,3-f:2' 3'-h]quinoxaline-2,3,6,7,10,11-hexacarbonitrile (HAT-CN)), 1,3,5-tris[4-(diphenylamino)phenyl]benzene (TDAPB), poly(3,4-ethylenedioxythiphene)polystyrene sulfonate (PEDOT/PSS), and N-(biphenyl-4-yl)-9,9-dimethyl-N-(4-(9-phenyl-9H-carbazol-3-yl)phenyl)-9H-fluoren-2-amine.

Alternatively, the hole injection material of the HIL 272 may include a compound in Formula 9 as a host and a compound in Formula 10 as a dopant. In this case, the compound in Formula 10 may have a weight % of 1 to 10. For example, the HIL 272 may have a thickness of 1 to 30 nm.

The HTL 274 may include a hole transporting material selected from the group consisting of N,N'-diphenyl-N,N'-bis(3-methylphenyl)-1,1'-biphenyl-4,4'-diamine (TPD), NPB(NPD), 4,4'-bis(N-carbazolyl)-1,1'-biphenyl (CBP), poly[N,N'-bis(4-butylphenyl)-N,N'-bis(phenyl)-benzidine] (poly-TPD), (poly[(9,9-dioctylfluorenyl-2,7-diyl)-co-(4,4'-(N-(4-sec-butylphenyl)diphenylamine))] (TFB), di-[4-(N,N-di-p-tolyl-amino)-phenyl]cyclohexane (TAPC), 3,5-di(9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine, and N-(biphenyl-4-yl)-N-(4-(9-phenyl-9H-carbazol-3-yl)phenyl)biphenyl-4-amine. Alternatively, the hole transporting material of the HTL 274 may include the compound in Formula 9. For example, the HTL 274 may a thickness of 10 to 100 nm.

The ETL 282 may include an electron transporting material selected from the group consisting of tris-(8-hydroxyquinoline) aluminum ($Alq_3$), 2-biphenyl-4-yl-5-(4-t-butylphenyl)-1,3,4-oxadiazole (PBD), spiro-PBD, lithium quinolate (Liq), 1,3,5-tris(N-phenylbenzimidazol-2-yl)benzene (TPBi), bis(2-methyl-8-quinolinolato-N1,08)-(1,1'-biphenyl-4-olato)aluminum (BA1q), 4,7-diphenyl-1,10-phenanthroline (Bphen), 2,9-bis(naphthalene-2-yl)4,7-diphenyl-1,10-phenanthroline (NBphen), 2,9-dimethyl-4,7-diphenyl-1,10-phenanthroline (BCP), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 1,3,5-tri(p-pyrid-3-yl-phenyl)benzene (TpPyPB), 2,4,6-tris(3'-(pyridin-3-yl)biphenyl-3-yl)1,3,5-triazine (TmPPPyTz), Poly[9,9-bis(3'-((N,N-dimethyl)-N-ethylammonium)-propyl)-2,7-fluorene]-alt-2,7-(9,9-dioctylfluorene)] (PFNBr), tris(phenylquinoxaline (TPQ), and diphenyl-4-triphenylsilyl-phenylphosphine oxide (TSPO1). Alternatively, the electron transporting material of the ETL 282 may include a compound in Formula 11. For example, the ETL 282 may have a thickness of 10 to 100 nm.

The EIL 284 may include an electron injection material selected from an alkali halide compound, such as LiF, CsF, NaF, or $BaF_2$, and an organo-metallic compound, such as Liq, lithium benzoate, or sodium stearate. For example, the EIL 284 may have a thickness of 0.1 to 10 nm.

The EBL 276 may include an electron blocking material selected from the group consisting of TCTA, tris[4-(diethylamino)phenyl]amine, N-(biphenyl-4-yl)-9,9-dimethyl-N-(4-(9-phenyl-9H-carbazol-3-yl)phenyl)-9H-fluoren-2-amine, TAPC, MTDATA, 1,3-bis(carbazol-9-yl)benzene (mCP), 3,3'-bis(N-carbazolyl)-1,1'-biphenyl (mCBP), CuPc, N,N'-bis[4-[bis(3-methylphenyl)amino]phenyl]-N,N'-diphenyl-[1,1'-biphenyl]-4,4'-diamine (DNTPD), TDAPB, DCDPA, and 2,8-bis(9-phenyl-9H-carbazol-3-yl)dibenzo[b,d]thiophene. Alternatively, the electron blocking material of the EBL 276 may be the same as the first p-type host 252 in the first blue emitting layer 250 or the second p-type host 262 in the second blue emitting layer 260. For example, the EBL 276 may have a thickness of 5 to 40 nm.

The HBL 286 may include a hole blocking material selected from the group consisting of BCP, BA1q, Alq3, PBD, spiro-PBD, Liq, bis-4,6-(3,5-di-3-pyridylphenyl)-2-methylpyrimidine (B3PYMPM), bis[2-(diphenylphosphino) phenyl]ether oxide (DPEPO), 9-(6-9H-carbazol-9-yl)pyridine-3-yl)-9H-3,9'-bicarbazole, and TSPO1. Alternatively, the hole blocking material of the HBL 286 may be the same as the first n-type host 254 in the first blue emitting layer 250 or the second n-type host 264 in the second blue emitting layer 260. For example, the HBL 286 may have a thickness of 1 to 20 nm.

The first p-type host 252 and the second p-type host 262 have different hole mobilities. For example, a hole mobility of the first compound, which is represented by one of Formulas 1a and 1b, is greater than that of the second compound, which is represented one of Formulas 3a and 3b. Accordingly, since a recombination zone of the hole and the electron in the blue EML 240 is expanded, in the OLED D1 and the organic light emitting display device 100, the driving voltage is decreased, and the lifespan is increased. [hole only device (HOD)]

An anode (ITO, 50 nm), an HIL (the compound in Formula 9 and the compound in Formula 10 (5 wt % doping), 10 nm), an HTL (the compound in Formula 9, 40 nm), a first EBL (15 nm), a blue EML (30 nm), a second EBL (15 nm), an HTL (the compound in Formula 9, 40 nm) and a cathode (Al, 100 nm) were sequentially stacked.

(1) HOD 1

The compound 1-1 ("PH-A-1", 44 wt %) in Formula 2, the compound 3-1 (NH-A, 44 wt %) in Formula 6 and the compound 4-1 ("PD", 12 wt %) in Formula 8 were used to form the blue EML, and the compound 1-1 in Formula 2 were used to form the first and second EBLs.

(2) HOD 2

The compound 2-5 ("PH-B-1", 44 wt %) in Formula 4, the compound 3-1 (NH-A, 44 wt %) in Formula 6 and the compound 4-1 ("PD", 12 wt %) in Formula 8 were used to form the blue EML, and the compound 2-5 in Formula 4 were used to form the first and second EBLs.

[Formula 9]

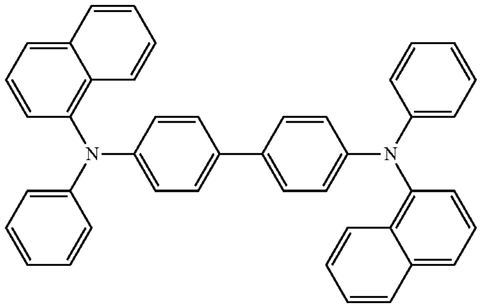

[Formula 10]

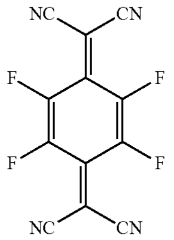

Figure 4A:
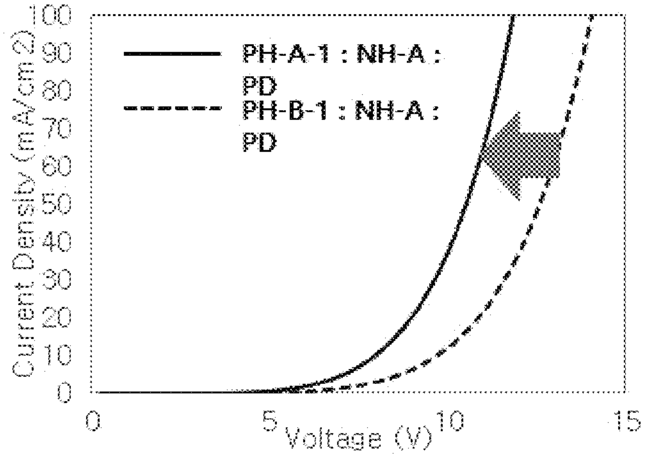
FIGS. 4A and 4B are each a graph showing a hole mobility and an electron mobility by a host, respectively.

The charge current measured in the device of HOD1 and HOD2 is shown in FIG. 4A. As shown in FIG. 4A, the hole mobility depends on a p-type host, and the hole mobility of the first compound, which is represented by one of the Formulas Ta and Tb, is greater than that of the second compound, which is represented by one of the Formulas 3a and 3b.

[Electron Only Device (EOD)]

An anode (ITO, 50 nm), an ETL (the compound in Formula 11, 30 nm), a first HBL (5 nm), a blue EML (30 nm), a second HBL (5 nm), an ETL (the compound in Formula 11, 30 nm), an EIL (LiF, 1 nm) and a cathode (Al, 100 nm) were sequentially stacked.

(1) EOD 1

The compound 1-1 ("PH-A-1", 44 wt %) in Formula 2, the compound 3-1 (NH-A, 44 wt %) in Formula 6 and the compound 4-1 ("PD", 12 wt %) in Formula 8 were used to form the blue EML, and the compound 3-1 in Formula 6 were used to form the first and second HBLs.

(2) EOD 2

The compound 2-5 ("PH-B-1", 44 wt %) in Formula 4, the compound 3-1 (NH-A, 44 wt %) in Formula 6 and the compound 4-1 ("PD", 12 wt %) in Formula 8 were used to form the blue EML, and the compound 3-1 in Formula 6 were used to form the first and second HBLs.

[Formula 11]

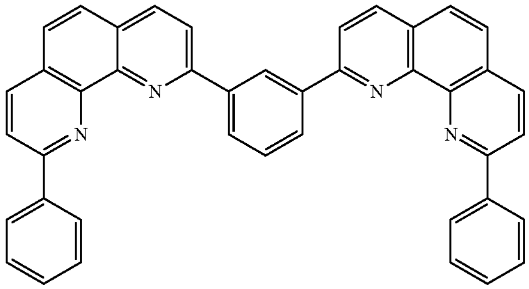

Figure 4B:
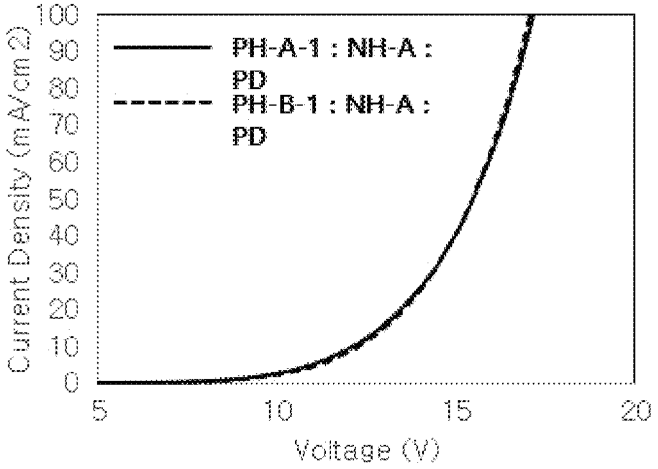

The charge current measured in the device of EOD1 and EOD2 is shown in FIG. 4B. As shown in FIG. 4B, the electron mobility does not depend on a p-type host.

In each of the first and second blue emitting layers 250 and 260, a maximum emission wavelength ($\lambda max_{(PH:NH)}$) of a mixture of the p-type host and the n-type host may be 480 nm or less and may be greater than a maximum emission wavelength ($\lambda max_{NH}$) of the n-type host. (480 nm$\geq\lambda max_{(pH:NH)}\geq\lambda max_{NH}$)

In addition, in each of the first and second blue emitting layers 250 and 260, a difference between a LUMO (lowest unoccupied molecular orbital) energy level ($LUMO_{PH}$) of the p-type host and a LUMO energy level ($LUMO_{NH}$) of the n-type host is 0.2 eV or more, and a difference between a HOMO (highest occupied molecular orbital) energy level ($HOMO_{PH}$) of the p-type host and a HOMO energy level ($HOMO_{NH}$) of the n-type host is 0.3 eV or more.

Each of the first compound, which is represented by one of Formulas 1a and 1b, and the second compound, which is represented by one of Formulas 3a and 3b, has a structure including a biscarbazole group, where a carbazole group is combined (or linked) to $3^{rd}$ or $4^{th}$ position of a carbazole group, and satisfies the above conditions with the n-type host represented by Formula 5.

Accordingly, the first p-type host 252 and the first n-type host 254 generates an exciplex in the first blue emitting layer 250, and the second p-type host 262 and the second n-type host 264 generates an exciplex in the second blue emitting layer 260. As a result, in the OLED D1 and the organic light emitting display device 100, the driving voltage is decreased, and the lifespan is increased.

In each of the first and second blue emitting layers 250 and 260, a difference between an onset wavelength ($\lambda onset_{Abs}$(PD)) in an absorption spectrum of the phosphorescent dopant and an onset wavelength ($\lambda onset_{PL}$(Exciplex)) in a PL spectrum of the exciplex is 10 nm or more. ($\lambda onset_{Abs}$(PD)$-\lambda onset_{PL}$(Exciplex)$\geq$10 nm) As a result, an energy transfer efficiency from the exciplex to the phosphorescent dopant is improved.

The onset wavelength is a wavelength value at a point where the extrapolation line and the X-axis, i.e., wavelength, intersect in a linear region of a short wavelength region in each of the absorption spectrum and the PL spectrum. More specifically, the onset wavelength may be defined as a wavelength corresponding to a shorter wavelength among two wavelengths in which the emission intensity corresponds to 1/10 of the maximum value in each of the absorption spectrum and the PL spectrum.

In each of the first and second blue emitting layers 250 and 260, a difference between a LUMO energy level ($LUMO_{PD}$) of the phosphorescent dopant and a LUMO energy level ($LUMO_{NH}$) of the n-type host is 0.2 eV or more. ($LUMO_{PD}-LUMO_{NH}\geq$0.2 eV) As a result, in each of the first and second blue emitting layers 250 and 260, a charge trap into the phosphorescent dopant is suppressed, and the driving voltage is further decreased, and the lifespan is further improved.

In each of the first and second blue emitting layers 250 and 260, an onset wavelength ($\lambda onset_{PL}$ (PD)) in the PL spectrum of the phosphorescent dopant is equal to or greater than an onset wavelength ($\lambda onset_{PL}$(Exciplex)) in the PL spectrum of the exciplex. ($\lambda onset_{PL}$ (PD)$\geq\lambda onset_{PL}$(Exciplex)) For example, in each of the first and second blue emitting layers 250 and 260, the onset wavelength ($\lambda onset_{PL}$ (PD)) in the PL spectrum of the phosphorescent dopant may be greater than the onset wavelength ($\lambda onset_{PL}$(Exciplex)) in the PL spectrum of the exciplex. Accordingly, a non-emission quenching of the triplet exciton is suppressed.

Figure 5:
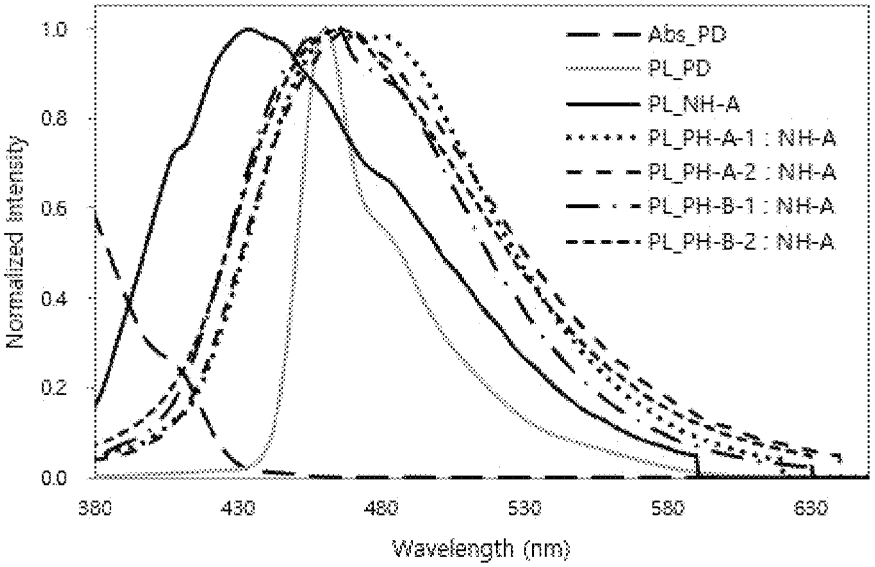
FIG. 5 is a PL spectrum of a host and an absorption spectrum of a phosphorescent dopant.

A PL spectrum of a mixture of the compound 1-1 "PH-A-1" in Formula 2 and the compound 3-1 "NH-A" in Formula 6, a PL spectrum of a mixture of the compound 1-10 "PH-A-2" in Formula 2 and the compound 3-1 "NH-A" in Formula 6, a PL spectrum of a mixture of the compound 2-5 "PH-B-1" in Formula 4 and the compound 3-1 "NH-A" in Formula 6, a PL spectrum of a mixture of the compound 2-2 "PH-B-2" in Formula 4 and the compound 3-1 "NH-A" in Formula 6, a PL spectrum of the compound 3-1 "NH-A" in Formula 6, and a PL spectrum and an absorption spectrum of the compound 4-1 "PD" in Formula 8 are measured and shown in FIG. 5. The measured results are listed in Table 1. In addition, a HOMO energy level and a LUMO energy level of each of the compound 1-1 "PH-A-1", the compound 1-10 "PH-A-2" in Formula 2, the compound 2-5 "PH-B-1" in Formula 4, the compound 2-2 "PH-B-2" in Formula 4, the compound 3-1 "NH-A" in Formula 6, and the compound 4-1 "PD" in Formula 8 are listed in Table 2.

The PL spectrum may be measured using an organic solvent, e.g., toluene, at the room temperature, i.e., 25° C. For example, a thin film having a thickness of 30 nm is formed using a compound solution, which includes a compound dissolved in an organic solvent, e.g., toluene, with a concentration of about $1*10^{-5}$ M, and the PL spectrum can be measured using a fluorescence spectrometer, e.g., a FS-5 fluorescence spectrometer (Edinburgh Instruments).

Various methods of determining the HOMO energy level are known to the skilled person. For example, the HOMO energy level can be determined using a conventional surface analyser such as an AC3 surface analyser made by RKI instruments. The surface analyser may be used to interrogate a single film (neat film) of a compound with a thickness of 50 nm. The LUMO energy level can be calculated as follows:

LUMO=HOMO−bandgap.

The bandgap may be calculated using any conventional method known to the skilled person, such as from a UV-vis measurement of a single film with a thickness of 50 nm. For example, this can be done using a SCINCO S-3100 spectrophotometer. The HOMO and LUMO values of the compounds of the examples and embodiments disclosed herein may be determined in this way. Namely, the HOMO and LUMO values may be experimentally or empirically determined values of thin films, such as 50 nm films.

TABLE 1

| | PD | NH-A-1 | PH-A-1: NH-A | PH-A-2: NH-A | PH-B-1: NH-A | PH-B-2: NH-A |
|---|---|---|---|---|---|---|
| λmax (nm) | | 434 | 465 | 469 | 463 | 465 |
| $\lambda onset_{PL}$ (nm) | 442 | 375 | 410 | 410 | 400 | 404 |
| $\lambda onset_{ABS}$ (nm) | 430 | | | | | |

TABLE 2

| | PD | PH-A-1 | PH-A-2 | PH-B-1 | PH-B-2 | NH-A |
|---|---|---|---|---|---|---|
| LUMO (eV) | −2.6 | −2.6 | −2.7 | −2.7 | −2.8 | −3.0 |
| HOMO (eV) | −5.5 | −6.0 | −6.1 | −6.1 | −6.1 | −6.5 |

As described above, in the OLED D1 in the blue pixel region, the organic light emitting layer 220 includes the first blue emitting layer 250 including the first p-type host 252 and the first n-type host 254 and the second blue emitting layer 260 including the second p-type host 262 and the second n-type host 264. One of the first and second p-type hosts 252 and 262 is the first compound represented by Formula 1a or Formula 1b, and the other one of the first and second p-type hosts 252 and 262 is the second compound represented by Formula 3a or Formula 3b. Namely, he first and second p-type hosts 252 and 262 have different hole mobilities. Accordingly, in the OLED D1 and the organic light emitting display device 100 of the present disclosure, a recombination zone of the hole and the electron in the EML is expanded so that the driving voltage is decreased, and the lifespan is significantly increased.

In addition, in each of the first and second blue emitting layers 250 and 260, an exciplex is generated by the p-type hosts 252 and 262 and the n-type hosts 254 and 264, and a charge trap into the phosphorescent dopant in each of the first and second blue emitting layers 250 and 260 is suppressed. Accordingly, in the OLED D1 and the organic light emitting display device 100 of the present disclosure, the driving voltage is further decreased, and the lifespan is further improved.

[OLED]

An anode (ITO, 50 nm), an HIL (the compound in Formula 9 and the compound in Formula 10 (5 wt % doping), 10 nm), an HTL (the compound in Formula 9, 40 nm), an EBL (15 nm), a blue EML (30 nm), an HBL (5 nm), an ETL (the compound in Formula 11, 30 nm), an EIL (LiF, 1 nm) and a cathode (Al, 100 nm) are sequentially deposited to form a blue OLED.

1. COMPARATIVE EXAMPLES (1) Comparative Example 1 (Ref1)

The compound 1-1 in Formula 2 (44 wt %), the compound 3-1 in Formula 6 (44 wt %) and the compound 4-1 in Formula 8 (12 wt %) were used to form the blue EML. The compound 1-1 in Formula 2 was used to form the EBL, and the compound 3-1 in Formula 6 was used to form the HBL.

(2) Comparative Example 2 (Ref2)

The compound 2-5 in Formula 4 (44 wt %), the compound 3-1 in Formula 6 (44 wt %) and the compound 4-1 in Formula 8 (12 wt %) were used to form the blue EML. The compound 2-5 in Formula 4 was used to form the EBL, and the compound 3-1 in Formula 6 was used to form the HBL.

(3) Comparative Example 3 (Ref3)

The compound in Formula 12 (44 wt %), the compound 3-1 in Formula 6 (44 wt %) and the compound 4-1 in Formula 8 (12 wt %) were used to form the blue EML. The compound in Formula 12 was used to form the EBL, and the compound 3-1 in Formula 6 was used to form the HBL.

(4) Comparative Example 4 (Ref4)

The compound 1-1 in Formula 2 (44 wt %), the compound in Formula 13 (44 wt %) and the compound 4-1 in Formula 8 (12 wt %) were used to form the blue EML. The compound 1-1 in Formula 2 was used to form the EBL, and the compound in Formula 13 was used to form the HBL.

(5) Comparative Example 5 (Ref5)

The compound 2-5 in Formula 4 (44 wt %), the compound in Formula 13 (44 wt %) and the compound 4-1 in Formula 8 (12 wt %) were used to form the blue EML. The compound 2-5 in Formula 4 was used to form the EBL, and the compound in Formula 13 was used to form the HBL.

[Formula 12]

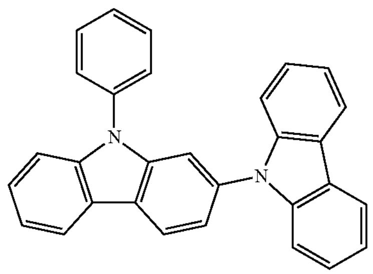

[Formula 13]

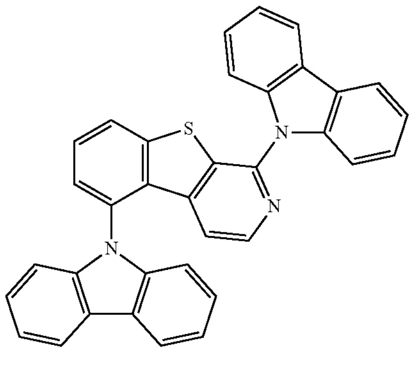

2. EXAMPLES

(1) Example 1 (Ex1)

The compound 1-1 in Formula 2 (44 wt %), the compound 3-1 in Formula 6 (44 wt %) and the compound 4-1 in Formula 8 (12 wt %) were used to form a first blue emitting layer (5 nm), and the compound 2-5 in Formula 4 (44 wt %), the compound 3-1 in Formula 6 (44 wt %) and the compound 4-1 in Formula 8 (12 wt %) were used to form a second blue emitting layer (25 nm). The compound 1-1 in Formula 2 was used to form the EBL, and the compound 3-1 in Formula 6 was used to form the HBL.

(2) Example 2 (Ex2)

The compound 1-1 in Formula 2 (44 wt %), the compound 3-1 in Formula 6 (44 wt %) and the compound 4-1 in Formula 8 (12 wt %) were used to form a first blue emitting layer (10 nm), and the compound 2-5 in Formula 4 (44 wt %), the compound 3-1 in Formula 6 (44 wt %) and the compound 4-1 in Formula 8 (12 wt %) were used to form a second blue emitting layer (20 nm). The compound 1-1 in Formula 2 was used to form the EBL, and the compound 3-1 in Formula 6 was used to form the HBL.

(3) Example 3 (Ex3)

The compound 1-1 in Formula 2 (44 wt %), the compound 3-1 in Formula 6 (44 wt %) and the compound 4-1 in Formula 8 (12 wt %) were used to form a first blue emitting layer (15 nm), and the compound 2-5 in Formula 4 (44 wt %), the compound 3-1 in Formula 6 (44 wt %) and the compound 4-1 in Formula 8 (12 wt %) were used to form a second blue emitting layer (15 nm). The compound 1-1 in Formula 2 was used to form the EBL, and the compound 3-1 in Formula 6 was used to form the HBL.

(4) Example 4 (Ex4)

The compound 1-1 in Formula 2 (44 wt %), the compound 3-1 in Formula 6 (44 wt %) and the compound 4-1 in Formula 8 (12 wt %) were used to form a first blue emitting layer (20 nm), and the compound 2-5 in Formula 4 (44 wt %), the compound 3-1 in Formula 6 (44 wt %) and the compound 4-1 in Formula 8 (12 wt %) were used to form a second blue emitting layer (10 nm). The compound 1-1 in Formula 2 was used to form the EBL, and the compound 3-1 in Formula 6 was used to form the HBL.

(5) Example 5 (Ex5)

The compound 1-1 in Formula 2 (44 wt %), the compound 3-1 in Formula 6 (44 wt %) and the compound 4-1 in Formula 8 (12 wt %) were used to form a first blue emitting layer (25 nm), and the compound 2-5 in Formula 4 (44 wt %), the compound 3-1 in Formula 6 (44 wt %) and the compound 4-1 in Formula 8 (12 wt %) were used to form a second blue emitting layer (5 nm). The compound 1-1 in Formula 2 was used to form the EBL, and the compound 3-1 in Formula 6 was used to form the HBL.

(6) Example 6 (Ex6)

The compound 2-5 in Formula 4 (44 wt %), the compound 3-1 in Formula 6 (44 wt %) and the compound 4-1 in Formula 8 (12 wt %) were used to form a first blue emitting layer (5 nm), and the compound 1-1 in Formula 2 (44 wt %), the compound 3-1 in Formula 6 (44 wt %) and the compound 4-1 in Formula 8 (12 wt %) were used to form a second blue emitting layer (25 nm). The compound 2-5 in Formula 4 was used to form the EBL, and the compound 3-1 in Formula 6 was used to form the HBL.

(7) Example 7 (Ex7)

The compound 2-5 in Formula 4 (44 wt %), the compound 3-1 in Formula 6 (44 wt %) and the compound 4-1 in Formula 8 (12 wt %) were used to form a first blue emitting layer (10 nm), and the compound 1-1 in Formula 2 (44 wt %), the compound 3-1 in Formula 6 (44 wt %) and the compound 4-1 in Formula 8 (12 wt %) were used to form a second blue emitting layer (20 nm). The compound 2-5 in Formula 4 was used to form the EBL, and the compound 3-1 in Formula 6 was used to form the HBL.

(8) Example 8 (Ex8)

The compound 2-5 in Formula 4 (44 wt %), the compound 3-1 in Formula 6 (44 wt %) and the compound 4-1 in Formula 8 (12 wt %) were used to form a first blue emitting layer (15 nm), and the compound 1-1 in Formula 2 (44 wt %), the compound 3-1 in Formula 6 (44 wt %) and the compound 4-1 in Formula 8 (12 wt %) were used to form a second blue emitting layer (15 nm). The compound 2-5 in Formula 4 was used to form the EBL, and the compound 3-1 in Formula 6 was used to form the HBL.

(9) Example 9 (Ex9)

The compound 2-5 in Formula 4 (44 wt %), the compound 3-1 in Formula 6 (44 wt %) and the compound 4-1 in Formula 8 (12 wt %) were used to form a first blue emitting layer (20 nm), and the compound 1-1 in Formula 2 (44 wt %), the compound 3-1 in Formula 6 (44 wt %) and the compound 4-1 in Formula 8 (12 wt %) were used to form a second blue emitting layer (10 nm). The compound 2-5 in Formula 4 was used to form the EBL, and the compound 3-1 in Formula 6 was used to form the HBL.

(10) Example 10 (Ex10)

The compound 2-5 in Formula 4 (44 wt %), the compound 3-1 in Formula 6 (44 wt %) and the compound 4-1 in Formula 8 (12 wt %) were used to form a first blue emitting layer (25 nm), and the compound 1-1 in Formula 2 (44 wt %), the compound 3-1 in Formula 6 (44 wt %) and the compound 4-1 in Formula 8 (12 wt %) were used to form a second blue emitting layer (5 nm). The compound 2-5 in Formula 4 was used to form the EBL, and the compound 3-1 in Formula 6 was used to form the HBL.

The emitting properties, i.e., a driving voltage (V), an external quantum efficiency (EQE), a color coordinate index (CIEx, CIEy) and a lifespan (LT95), of the OLED in Comparative Examples 1 to 5 and Examples 1 to 10 are measured and listed in Table 3.

TABLE 3

| | V (%) | EQE (%) | CIEx | CIEy | LT95 (%) |
|---|---|---|---|---|---|
| Ref1 | 100 | 20 | 0.135 | 0.140 | 100 |
| Ref2 | 109 | 19 | 0.136 | 0.142 | 145 |
| Ref3 | 101 | 17 | 0.135 | 0.140 | 77 |

TABLE 3-continued

| | V (%) | EQE (%) | CIEx | CIEy | LT95 (%) |
|---|---|---|---|---|---|
| Ref4 | 91 | 21 | 0.135 | 0.140 | 31 |
| Ref5 | 94 | 21 | 0.137 | 0.141 | 38 |
| Ex1 | 108 | 19 | 0.136 | 0.142 | 172 |
| Ex2 | 107 | 20 | 0.135 | 0.141 | 180 |
| Ex3 | 104 | 20 | 0.135 | 0.141 | 186 |
| Ex4 | 103 | 20 | 0.135 | 0.141 | 176 |
| Ex5 | 101 | 20 | 0.136 | 0.140 | 152 |
| Ex6 | 103 | 20 | 0.136 | 0.141 | 147 |
| Ex7 | 105 | 20 | 0.135 | 0.141 | 157 |
| Ex8 | 107 | 20 | 0.135 | 0.142 | 172 |
| Ex9 | 109 | 19 | 0.135 | 0.142 | 153 |
| Ex10 | 109 | 19 | 0.135 | 0.142 | 151 |

As shown in Table 3, in comparison to the OLED of Comparative Examples 1 to 5, the lifespan of the OLED of Examples 1 to 10 including the first and second blue emitting layers as the blue EML, in which the first blue emitting layer includes a p-type host being one of the first compound in Formula 1a or Formula 1b or the second compound in Formula 3a or Formula 3b, an n-type host of Formula 5 and a phosphorescent dopant in Formula 7, and the second blue emitting layer includes a p-type host being the other one of the first compound in Formula 1a or Formula 1b or the second compound in Formula 3a or Formula 3b, an n-type host of Formula 5 and a phosphorescent dopant in Formula 7, is significantly increased.

In particular, in the OLED of Comparative Examples 3 to 5 using the compound in Formula 12 and the compound in Formula 13, the lifespan of the OLED is significantly decreased because an exciplex is not generated between the p-type host and the n-type host.

3. COMPARATIVE EXAMPLES

(1) Comparative Example 6 (Ref6)

In Comparative Example 1, the compound 1-10 in Formula 2 was used instead of the compound 1-1 in Formula 2.

(2) Comparative Example 7 (Ref7)

In Comparative Example 2, the compound 2-2 in Formula 4 was used instead of the compound 2-5 in Formula 4.

4. EXAMPLES

(1) Example 11 (Ex11)

In Example 1, the compound 1-10 in Formula 2 and the compound 2-2 in Formula 4 were used instead of the compound 1-1 in Formula 2 and the compound 2-5 in Formula 4, respectively.

(2) Example 12 (Ex12)

In Example 2, the compound 1-10 in Formula 2 and the compound 2-2 in Formula 4 were used instead of the compound 1-1 in Formula 2 and the compound 2-5 in Formula 4, respectively.

(3) Example 13 (Ex13)

In Example 3, the compound 1-10 in Formula 2 and the compound 2-2 in Formula 4 were used instead of the compound 1-1 in Formula 2 and the compound 2-5 in Formula 4, respectively.

(4) Example 14 (Ex14)

In Example 4, the compound 1-10 in Formula 2 and the compound 2-2 in Formula 4 were used instead of the compound 1-1 in Formula 2 and the compound 2-5 in Formula 4, respectively.

(5) Example 15 (Ex15)

In Example 5, the compound 1-10 in Formula 2 and the compound 2-2 in Formula 4 were used instead of the compound 1-1 in Formula 2 and the compound 2-5 in Formula 4, respectively.

(6) Example 16 (Ex16)

In Example 6, the compound 1-10 in Formula 2 and the compound 2-2 in Formula 4 were used instead of the compound 1-1 in Formula 2 and the compound 2-5 in Formula 4, respectively.

(7) Example 17 (Ex17)

In Example 7, the compound 1-10 in Formula 2 and the compound 2-2 in Formula 4 were used instead of the compound 1-1 in Formula 2 and the compound 2-5 in Formula 4, respectively.

(8) Example 18 (Ex18)

In Example 8, the compound 1-10 in Formula 2 and the compound 2-2 in Formula 4 were used instead of the compound 1-1 in Formula 2 and the compound 2-5 in Formula 4, respectively.

(9) Example 19 (Ex19)

In Example 9, the compound 1-10 in Formula 2 and the compound 2-2 in Formula 4 were used instead of the compound 1-1 in Formula 2 and the compound 2-5 in Formula 4, respectively.

(10) Example 20 (Ex20)

In Example 10, the compound 1-10 in Formula 2 and the compound 2-2 in Formula 4 were used instead of the compound 1-1 in Formula 2 and the compound 2-5 in Formula 4, respectively.

The emitting properties, i.e., a driving voltage (V), an external quantum efficiency (EQE), a color coordinate index (CIEx, CIEy) and a lifespan (LT95), of the OLED in Comparative Examples 6 and 7 and Examples 11 to 20 are measured and listed in Table 4.

TABLE 4

| | V (%) | EQE (%) | CIEx | CIEy | LT95 (%) |
|---|---|---|---|---|---|
| Ref6 | 100 | 21 | 0.135 | 0.139 | 100 |
| Ref7 | 113 | 21 | 0.136 | 0.142 | 131 |
| Ex11 | 110 | 21 | 0.136 | 0.142 | 145 |
| Ex12 | 108 | 21 | 0.135 | 0.141 | 157 |
| Ex13 | 105 | 21 | 0.135 | 0.141 | 163 |
| Ex14 | 103 | 20 | 0.135 | 0.141 | 151 |
| Ex15 | 102 | 20 | 0.136 | 0.140 | 140 |
| Ex16 | 103 | 20 | 0.136 | 0.141 | 138 |
| Ex17 | 107 | 21 | 0.135 | 0.141 | 152 |
| Ex18 | 109 | 21 | 0.135 | 0.142 | 160 |

TABLE 4-continued

| | V (%) | EQE (%) | CIEx | CIEy | LT95 (%) |
|---|---|---|---|---|---|
| Ex19 | 110 | 21 | 0.135 | 0.142 | 155 |
| Ex20 | 111 | 21 | 0.135 | 0.142 | 142 |

As shown in Table 4, in comparison to the OLED of Comparative Examples 6 and 7, the lifespan of the OLED of Examples 11 to 20 including the first and second blue emitting layers as the blue EML, in which the first blue emitting layer includes a p-type host being one of the first compound in Formula 1a or Formula 1b or the second compound in Formula 3a or Formula 3b, an n-type host of Formula 5 and a phosphorescent dopant in Formula 7, and the second blue emitting layer includes a p-type host being the other one of the first compound in Formula 1a or Formula 1b or the second compound in Formula 3a or Formula 3b, an n-type host of Formula 5 and a phosphorescent dopant in Formula 7, is significantly increased.

Figure 6:
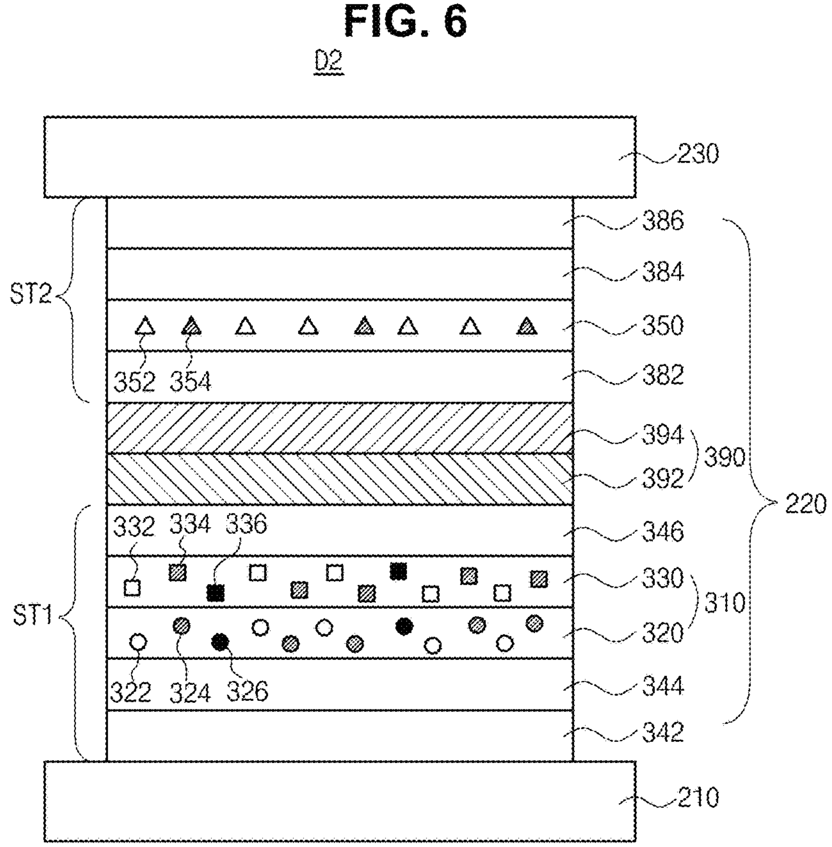
FIG. 6 is a schematic cross-sectional view of an OLED according to a third embodiment of the present disclosure.

FIG. 6 is a schematic cross-sectional view of an OLED according to a third embodiment of the present disclosure.

As illustrated in FIG. 6, the OLED D2 includes first and second electrodes 210 and 230 facing each other and an organic light emitting layer 220 therebetween. The organic light emitting layer 220 includes a first emitting part ST1 including a first blue EML 310 and a second emitting part ST2 including a second blue EML 350. The organic light emitting layer 220 may include a CGL 390 between the first and second emitting parts ST1 and ST2. The OLED D2 may further include a capping layer on the second electrode 230 to enhance a light extraction efficiency. In one embodiment, the second emitting part may be positioned between the first emitting part and the first electrode or between the first emitting part and the second electrode.

The organic light emitting display device 100 may include a red pixel region, a green pixel region and a blue pixel region, and the OLED D2 may be positioned in the blue pixel region.

The first electrode 210 may be an anode, and the second electrode 230 may be a cathode. One of the first and second electrodes 210 and 230 may be a reflective electrode, and the other one of the first and second electrodes 210 and 230 may be a transparent (or a semi-transparent) electrode. For example, the first electrode 210 may have a single-layered structure of ITO, and the second electrode 230 may be formed of Al.

The first emitting part ST1 may further include at least one of a first HTL 344 under the first blue EML 310 and a first ETL 346 over the first blue EML 310.

In addition, the first emitting part ST1 may further include an HIL 342 between the first electrode 210 and the first HTL 344.

Moreover, the first emitting part ST1 may further include at least one of a first EBL between the first HTL 344 and the first blue EML 310 and a first HBL between the first blue EML 310 and the first ETL 346.

The second emitting part ST2 may further include at least one of a second HTL 382 under the second blue EML 350 and a second ETL 384 over the second blue EML 350.

In addition, the second emitting part ST2 may further include an EIL 386 between the second electrode 230 and the second ETL 384.

Moreover, the second emitting part ST2 may further include at least one of a second EBL between the second HTL 382 and the second blue EML 350 and a second HBL between the second blue EML 350 and the second ETL 384.

For example, the HIL 342 may include the above-mentioned hole injection material and may have a thickness of 1 to 30 nm.

Each of the first and second HTLs 344 and 382 may include the above-mentioned hole transporting material and may have a thickness of 10 to 100 nm.

Each of the first and second ETLs 346 and 384 may include the above-mentioned electron transporting material and may have a thickness of 10 to 100 nm.

The EIL 386 may include the above-mentioned electron injection material and may have a thickness of 0.1 to 10 nm.

Each of the first and second EBLs may include the above-mentioned electron blocking material and may have a thickness of 5 to 40 nm.

Each of the first and second HBLs may include the above-mentioned hole blocking material and may have a thickness of 1 to 20 nm.

The CGL 390 is positioned between the first and second emitting parts ST1 and ST2. Namely, the first and second emitting parts ST1 and ST2 is connected to each other through the CGL 390. The CGL 390 may be a PN-junction CGL of an N-type CGL 392 and a P-type CGL 394.

The N-type CGL 392 is positioned between the first ETL 346 and the second HTL 382, and the P-type CGL 394 is positioned between the N-type CGL 392 and the second HTL 382.

The N-type CGL 392 provides an electron into the first blue EML 310 of the first emitting part ST1, and the P-type CGL 394 provides a hole into the second blue EML 350 of the second emitting part ST2.

The N-type CGL 392 may be an organic layer doped with an alkali metal, e.g., Li, Na, K and Cs, and/or an alkali earth metal, e.g., Mg, Sr, Ba and Ra. For example, the N-type CGL 392 may be formed of an N-type charge generation material including a host being the organic material, e.g., 4,7-dipheny-1,10-phenanthroline (Bphen) and MTDATA, a dopant being an alkali metal and/or an alkali earth metal, and the dopant may be doped with a weight % of 0.01 to 30.

The P-type CGL 394 may be formed of a P-type charge generation material including an inorganic material, e.g., tungsten oxide (WOx), molybdenum oxide (MoOx), beryllium oxide ($Be_2O_3$) or vanadium oxide ($V_2O_5$), an organic material, e.g., NPD, HAT-CN, F4TCNQ, TPD, TNB, TCTA, N,N'-dioctyl-3,4,9,10-perylenedicarboximide (PTCDI-C8) or their combination.

The first blue EML 310 includes a first blue emitting layer 320 and a second blue emitting layer 330. For example, the first blue emitting layer 320 is positioned between the first electrode 210 and the second blue emitting layer 330.

In the first blue EML 310, the second blue emitting layer 330 contacts and disposed on the first blue emitting layer 320 so that the first blue EML 310 has a double-layered structure.

The first blue emitting layer 320 includes a first p-type host 322 and a first n-type host 324, and the second blue emitting layer 330 includes a second p-type host 332 and a second n-type host 334. The first blue emitting layer 320 may further include a first phosphorescent dopant (e.g., phosphorescent emitter) 326 and the second blue emitting layer 330 may further include a second phosphorescent dopant 336.

One of the first p-type host 322 and the second p-type host 332 is a first compound represented by one of Formula 1a and Formula 1b, and the other one of the first p-type host 322 and the second p-type host 332 is a second compound represented by one of Formula 3a and Formula 3b. For example, one of the first p-type host 322 and the second p-type host 332 may be selected from the compounds in Formula 2, and the other one of the first p-type host 322 and the second p-type host 332 may be selected from the compounds in Formula 4.

Each of the first and second n-type hosts 324 and 334 is a compound represented by Formula 5. For example, each of the first and second n-type hosts 324 and 334 may be independently selected from the compounds in Formula 6. The first and second n-type hosts 324 and 334 may be same or different.

Each of the first and second phosphorescent dopants 326 and 336 is a compound represented by Formula 7. For example, each of the first and second phosphorescent dopants 326 and 336 may be independently selected from the compounds in Formula 8. The first and second phosphorescent dopants 326 and 336 may be same or different.

In the first blue emitting layer 320, a weight % of each of the first p-type host 322 and the first n-type host 324 may be greater than that of the first phosphorescent dopant 326, and the weight % of the first p-type host 322 and the weight % of the first n-type host 324 may be same or different. For example, in the first blue emitting layer 320, the first p-type host 322 and the first n-type host 324 may have the same weight %, and each of the first p-type host 322 and the first n-type host 324 may have a part by weight of 200 to 600 with respect to the first phosphorescent dopant 326.

In the second blue emitting layer 330, a weight % of each of the second p-type host 332 and the second n-type host 334 may be greater than that of the second phosphorescent dopant 336, and the weight % of the second p-type host 332 and the weight % of the second n-type host 334 may be same or different. For example, in the second blue emitting layer 330, the second p-type host 332 and the second n-type host 334 may have the same weight %, and each of the second p-type host 332 and the second n-type host 334 may have a part by weight of 200 to 600 with respect to the second phosphorescent dopant 336.

The first blue EML 310 may have a thickness of 10 to 100 nm, and each of the first and second blue emitting layers 320 and 330 may have a thickness of 5 to 50 nm. For example, the first blue EML 310 may have a thickness of 20 to 40 nm, and each of the first and second blue emitting layers 320 and 330 may have a thickness of 5 to 30 nm. The thickness of the first blue emitting layer 320 and the thickness of the second blue emitting layer 330 may be same or different.

The second blue EML 350 may have a single-layered structure. The second blue EML 350 may have a thickness of 10 to 100 nm.

The second blue EML 350 may include a blue host 352 and a blue dopant (e.g., an emitter) 354. The second blue EML 350 may further include an auxiliary dopant (or an auxiliary host). In the second blue EML 350, a weight % of the blue dopant 354 may be smaller than that of each of the blue host 352 and the auxiliary dopant.

For example, the blue host 352 may be selected from the group consisting of mCP, 9-(3-(9H-carbazol-9-yl)phenyl)-9H-carbazole-3-carbonitrile (mCP-CN), mCBP, CBP-CN, 9-(3-(9H-Carbazol-9-yl)phenyl)-3-(diphenylphosphoryl)-9H-carbazole (mCPPO1) 3,5-Di(9H-carbazol-9-yl)biphenyl (Ph-mCP), TSPO1, 9-(3'-(9H-carbazol-9-yl)-[1,1'-biphenyl]-3-yl)-9H-pyrido[2,3-b]indole (CzBPCb), bis(2-methylphenyl)diphenylsilane (UGH-1), 1,4-bis(triphenylsilyl) benzene (UGH-2), 1,3-bis(triphenylsilyl)benzene (UGH-3), 9,9-spiorobifluoren-2-yl-diphenyl-phosphine oxide (SPPO1), and 9,9'-(5-(triphenylsilyl)-1,3-phenylene)bis(9H-carbazole) (SimCP).

For example, the blue dopant 354 may be selected from the group consisting of perylene, 4,4'-bis[4-(di-p-tolylamino)styryl]biphenyl (DPAVBi), 4-(di-p-tolylamino)-4-4'-[(di-p-tolylamino)styryl]stilbene (DPAVB), 4,4'-bis[4-(di-phenylamino)styryl]biphenyl (BDAVBi), 2,7-bis(4-diphenylamino)styryl)-9,9-spiorfluorene (spiro-DPVBi), [1,4-bis[2-[4-[N,N-di(p-tolyl)amino]phenyl]vinyl] benzene (DSB), 1-4-di-[4-(N,N-diphenyl)amino]styryl-benzene (DSA), 2,5,8,11-tetra-tert-butylperylene (TBPe), bis(2-hydroxylphenyl)-pyridine)beryllium (Bepp2) and 9-(9-Phenylcarbazole-3-yl)-10-(naphthalene-1-yl)anthracene (PCAN).

In an aspect of the present disclosure, the blue host 352 may include at least one of compounds in Formula 14.

[Formula 14]

H-1

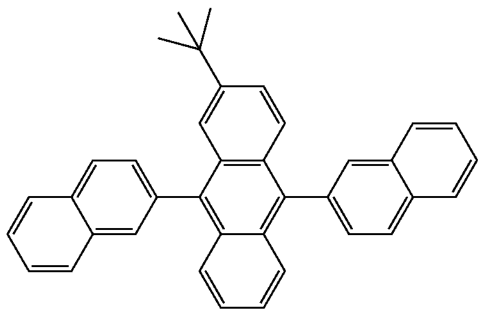

H-2

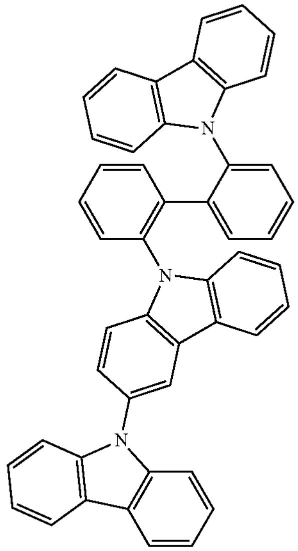

H-3

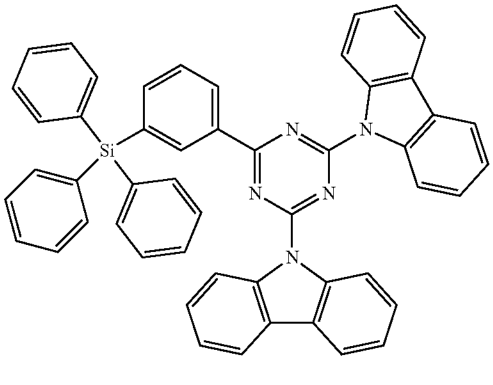

In an aspect of the present disclosure, the blue dopant 354 may be selected from compounds in Formula 15.

[Formula 15]

FD-1

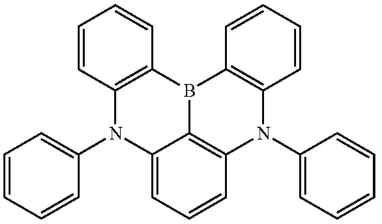

FD-2

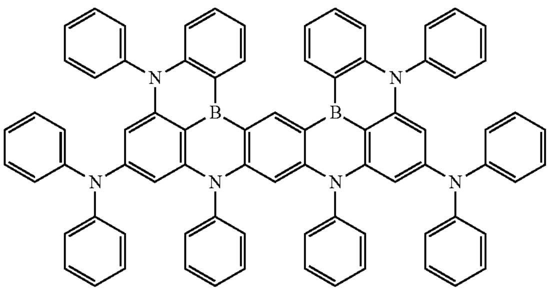

In an aspect of the present disclosure, the auxiliary dopant may be a phosphorescent compound or a delayed fluorescent compound. For example, the auxiliary dopant may be selected from compounds in Formula 16.

[Formula 16]

A-1

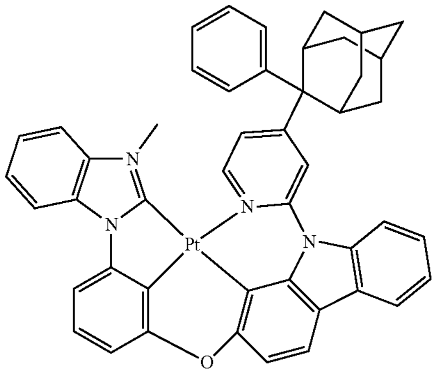

A-2

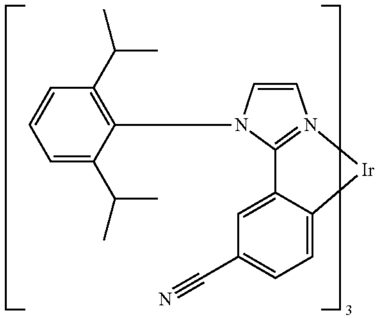

-continued

A-3

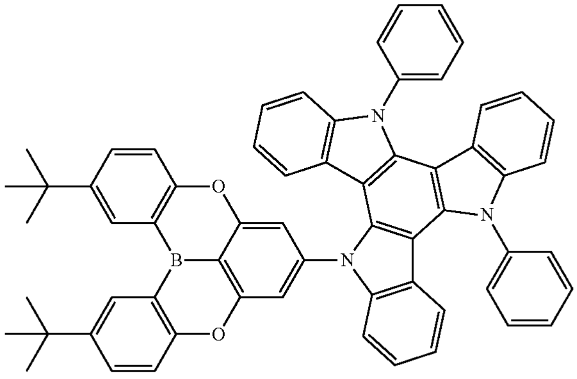

In an aspect of the present disclosure, the second blue EML 350 may be a fluorescent emitting layer including the compound H-1 in Formula 14 and the compound FD-1 in Formula 15.

In an aspect of the present disclosure, the second blue EML 350 may be a phosphor-sensitized fluorescence (PSF) emitting layer including the compound H-2 in Formula 14, the compound H-3 in Formula 14, the compound FD-2 in Formula 15 and one of the compound A-1 and the compound A-2 in Formula 16.

In an aspect of the present disclosure, the second blue EML 350 may be a hyper-fluorescence emitting layer including the compound H-2 in Formula 14, the compound H-3 in Formula 14, the compound FD-2 in Formula 15 and the compound A-3 in Formula 16.

In the blue pixel region, the organic light emitting layer 220 of the OLED D2 includes the first blue EML 310 and the second blue EML 350 to have a tandem structure.

The first blue EML 310 includes the first blue emitting layer 320, which includes the first p-type host 322, the first n-type host 324 and the first phosphorescent dopant 326, and the second blue emitting layer 330, which includes the second p-type host 332, the second n-type host 334 and the second phosphorescent dopant 336. One of the first and second p-type hosts 322 and 332 is the first compound represented by Formula 1a or Formula 1b, and the other one of the first and second p-type hosts 322 and 332 is the second compound represented by Formula 3a or Formula 3b. In addition, each of the first and second n-type hosts 324 and 334 is a compound represented by Formula 5, and each of the first and second phosphorescent dopants 326 and 336 is a compound represented by Formula 7.

Accordingly, the OLED D2 and the organic light emitting display device 100 of the present disclosure have advantages in the driving voltage and the lifespan.

Figure 7:
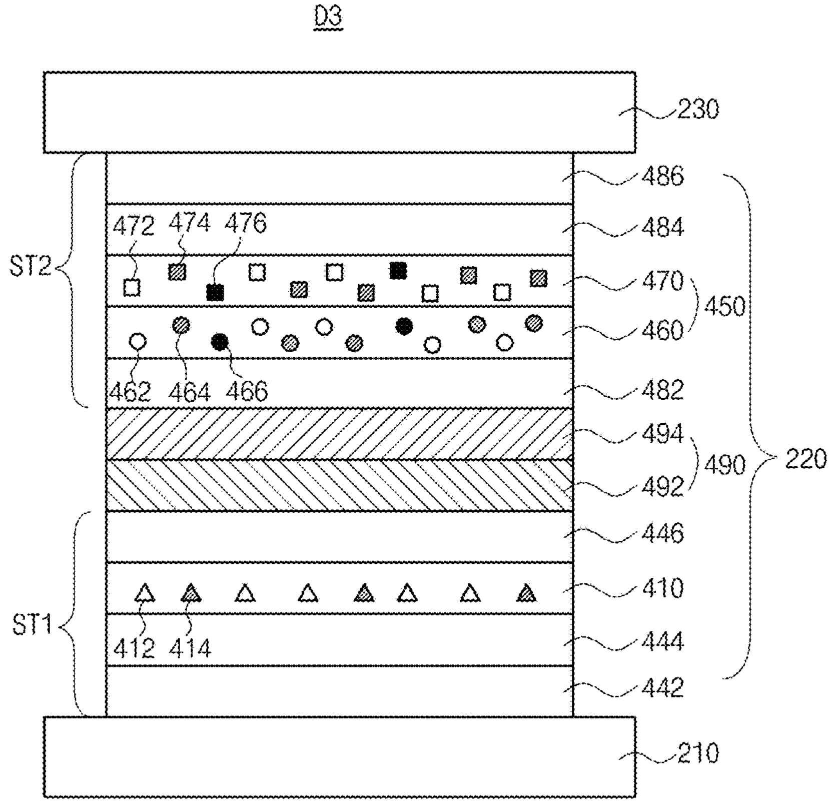
FIG. 7 is a schematic cross-sectional view of an OLED according to a fourth embodiment of the present disclosure.

FIG. 7 is a schematic cross-sectional view of an OLED according to a fourth embodiment of the present disclosure.

As illustrated in FIG. 7, the OLED D3 includes first and second electrodes 210 and 230 facing each other and an organic light emitting layer 220 therebetween. The organic light emitting layer 220 includes a first emitting part ST1 including a first blue EML 410 and a second emitting part ST2 including a second blue EML 450. The organic light emitting layer 220 may include a CGL 490 between the first and second emitting parts ST1 and ST2. The OLED D3 may further include a capping layer on the second electrode 230 to enhance a light extraction efficiency.

The organic light emitting display device 100 may include a red pixel region, a green pixel region and a blue pixel region, and the OLED D3 may be positioned in the blue pixel region.

The first electrode 210 may be an anode, and the second electrode 230 may be a cathode. One of the first and second electrodes 210 and 230 may be a reflective electrode, and the other one of the first and second electrodes 210 and 230 may be a transparent (or a semi-transparent) electrode. For example, the first electrode 210 may have a single-layered structure of ITO, and the second electrode 230 may be formed of Al.

The first emitting part ST1 may further include at least one of a first HTL 444 under the first blue EML 410 and a first ETL 446 over the first blue EML 410.

In addition, the first emitting part ST1 may further include an HIL 442 between the first electrode 210 and the first HTL 444.

Moreover, the first emitting part ST1 may further include at least one of a first EBL between the first HTL 444 and the first blue EML 410 and a first HBL between the first blue EML 410 and the first ETL 446.

The second emitting part ST2 may further include at least one of a second HTL 482 under the second blue EML 450 and a second ETL 484 over the second blue EML 450.

In addition, the second emitting part ST2 may further include an EIL 486 between the second electrode 230 and the second ETL 484.

Moreover, the second emitting part ST2 may further include at least one of a second EBL between the second HTL 482 and the second blue EML 450 and a second HBL between the second blue EML 450 and the second ETL 484.

For example, the HIL 442 may include the above-mentioned hole injection material and may have a thickness of 1 to 30 nm.

Each of the first and second HTLs 444 and 482 may include the above-mentioned hole transporting material and may have a thickness of 10 to 100 nm.

Each of the first and second ETLs 446 and 484 may include the above-mentioned electron transporting material and may have a thickness of 10 to 100 nm.

The EIL 486 may include the above-mentioned electron injection material and may have a thickness of 0.1 to 10 nm.

Each of the first and second EBLs may include the above-mentioned electron blocking material and may have a thickness of 5 to 40 nm.

Each of the first and second HBLs may include the above-mentioned hole blocking material and may have a thickness of 1 to 20 nm.

The CGL 490 is positioned between the first and second emitting parts ST1 and ST2. Namely, the first and second emitting parts ST1 and ST2 is connected to each other through the CGL 490. The CGL 490 may be a PN-junction CGL of an N-type CGL 492 and a P-type CGL 494.

The N-type CGL 492 is positioned between the first ETL 446 and the second HTL 482, and the P-type CGL 494 is positioned between the N-type CGL 492 and the second HTL 482.

The N-type CGL 492 provides an electron into the first blue EML 410 of the first emitting part ST1, and the P-type CGL 494 provides a hole into the second blue EML 450 of the second emitting part ST2.

The N-type CGL 492 may be an organic layer doped with an alkali metal, e.g., Li, Na, K and Cs, and/or an alkali earth metal, e.g., Mg, Sr, Ba and Ra. For example, the N-type CGL 492 may be formed of an N-type charge generation material including a host being the organic material, e.g., 4,7-dipheny-1,10-phenanthroline (Bphen) and MTDATA, a dopant being an alkali metal and/or an alkali earth metal, and the dopant may be doped with a weight % of 0.01 to 30.

The P-type CGL 494 may be formed of a P-type charge generation material including an inorganic material, e.g., tungsten oxide (Wox), molybdenum oxide (MoOx), beryllium oxide ($Be_2O_3$) or vanadium oxide ($V_2O_5$), an organic material, e.g., NPD, HAT-CN, F4TCNQ, TPD, TNB, TCTA, N,N'-dioctyl-3,4,9,10-perylenedicarboximide (PTCDI-C8) or their combination.

The first blue EML 410 may have a single-layered structure. The first blue EML 410 may have a thickness of 10 to 100 nm.

The first blue EML 410 may include a blue host 412 and a blue dopant (e.g., an emitter) 414. The first blue EML 410 may further include an auxiliary dopant (or an auxiliary host). In the first blue EML 410, a weight % of the blue dopant 414 may be smaller than that of each of the blue host 412 and the auxiliary dopant.

For example, the blue host 412 may include at least one of the compounds in Formula 14, the blue dopant 414 may be selected from the compounds in Formula 15, and the auxiliary dopant may be selected from the compounds in Formula 16.

The first blue EML 410 may be one of a fluorescent emitting layer, a phosphor-sensitized fluorescence (PSF) emitting layer and a hyper-fluorescence emitting layer.

The second blue EML 450 includes a first blue emitting layer 460 and a second blue emitting layer 470. For example, the second blue emitting layer 470 is positioned between the second electrode 230 and the first blue emitting layer 460.

In the second blue EML 450, the second blue emitting layer 470 contacts and disposed on the first blue emitting layer 460 so that the second blue EML 450 has a double-layered structure.

The first blue emitting layer 460 includes a first p-type host 462 and a first n-type host 464, and the second blue emitting layer 470 includes a second p-type host 472 and a second n-type host 474. The first blue emitting layer 460 may further include a first phosphorescent dopant (e.g., phosphorescent emitter) 466 and the second blue emitting layer 470 may further include a second phosphorescent dopant 476.

One of the first p-type host 462 and the second p-type host 472 is a first compound represented by one of Formula 1a and Formula 1b, and the other one of the first p-type host 462 and the second p-type host 472 is a second compound represented by one of Formula 3a and Formula 3b. For example, one of the first p-type host 462 and the second p-type host 472 may be selected from the compounds in Formula 2, and the other one of the first p-type host 462 and the second p-type host 472 may be selected from the compounds in Formula 4.

Each of the first and second n-type hosts 464 and 474 is a compound represented by Formula 5. For example, each of the first and second n-type hosts 464 and 474 may be independently selected from the compounds in Formula 6. The first and second n-type hosts 464 and 474 may be same or different.

Each of the first and second phosphorescent dopants 466 and 476 is a compound represented by Formula 7. For example, each of the first and second phosphorescent dopants 466 and 476 may be independently selected from the compounds in Formula 8. The first and second phosphorescent dopants 466 and 476 may be same or different.

In the first blue emitting layer 460, a weight % of each of the first p-type host 462 and the first n-type host 464 may be greater than that of the first phosphorescent dopant 466, and the weight % of the first p-type host 462 and the weight % of the first n-type host 464 may be same or different. For example, in the first blue emitting layer 460, the first p-type host 462 and the first n-type host 464 may have the same weight %, and each of the first p-type host 462 and the first n-type host 464 may have a part by weight of 200 to 600 with respect to the first phosphorescent dopant 466.

In the second blue emitting layer 470, a weight % of each of the second p-type host 472 and the second n-type host 474 may be greater than that of the second phosphorescent dopant 476, and the weight % of the second p-type host 472 and the weight % of the second n-type host 474 may be same or different. For example, in the second blue emitting layer 470, the second p-type host 472 and the second n-type host 474 may have the same weight %, and each of the second p-type host 472 and the second n-type host 474 may have a part by weight of 200 to 600 with respect to the second phosphorescent dopant 476.

The second blue EML 450 may have a thickness of 10 to 100 nm, and each of the first and second blue emitting layers 460 and 470 may have a thickness of 5 to 50 nm. For example, the second blue EML 450 may have a thickness of 20 to 40 nm, and each of the first and second blue emitting layers 460 and 470 may have a thickness of 5 to 30 nm. The thickness of the first blue emitting layer 460 and the thickness of the second blue emitting layer 470 may be same or different.

In the blue pixel region, the organic light emitting layer 220 of the OLED D3 includes the first blue EML 410 and the second blue EML 450 to have a tandem structure.

The second blue EML 450 includes the first blue emitting layer 460, which includes the first p-type host 462, the first n-type host 464 and the first phosphorescent dopant 466, and the second blue emitting layer 470, which includes the second p-type host 472, the second n-type host 474 and the second phosphorescent dopant 476. One of the first and second p-type hosts 462 and 472 is the first compound represented by Formula 1a or Formula 1b, and the other one of the first and second p-type hosts 462 and 472 is the second compound represented by Formula 3a or Formula 3b. In addition, each of the first and second n-type hosts 464 and 474 is a compound represented by Formula 5, and each of the first and second phosphorescent dopants 466 and 476 is a compound represented by Formula 7.

Accordingly, the OLED D3 and the organic light emitting display device 100 of the present disclosure have advantages in the driving voltage and the lifespan.

Figure 8:
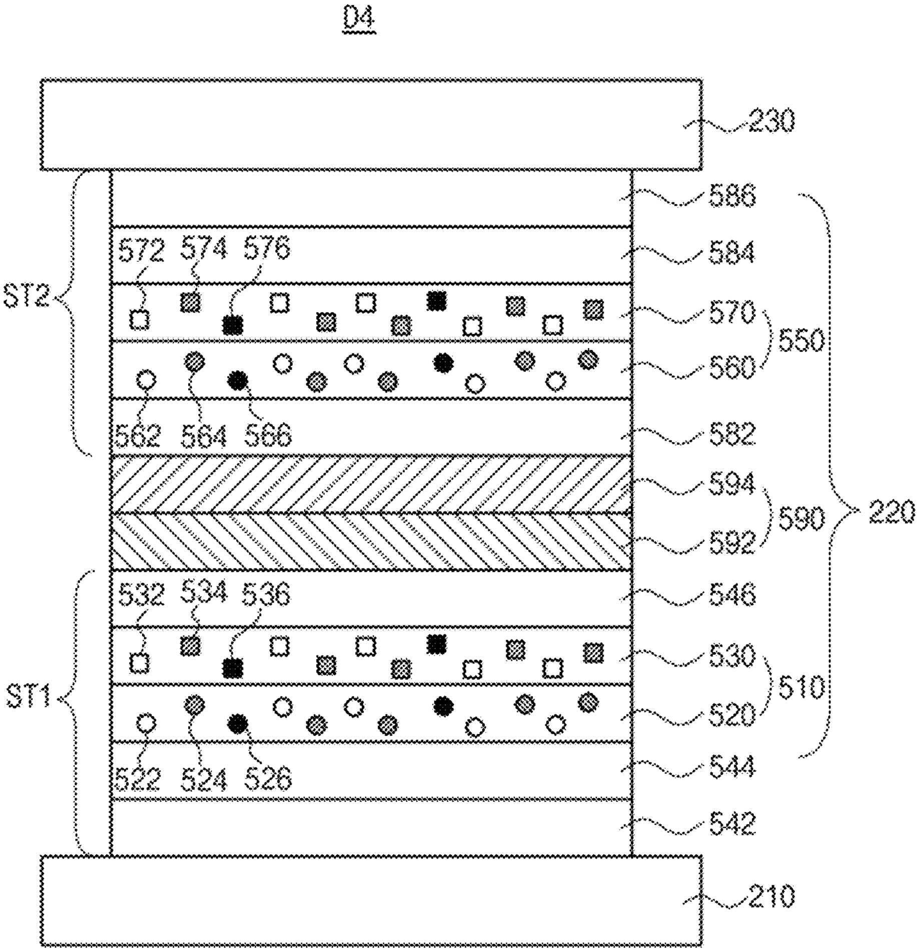
FIG. 8 is a schematic cross-sectional view of an OLED according to a fifth embodiment of the present disclosure.

FIG. 8 is a schematic cross-sectional view of an OLED according to a fifth embodiment of the present disclosure.

As illustrated in FIG. 8, the OLED D4 includes first and second electrodes 210 and 230 facing each other and an organic light emitting layer 220 therebetween. The organic light emitting layer 220 includes a first emitting part ST1 including a first blue EML 510 and a second emitting part ST2 including a second blue EML 550. The organic light emitting layer 220 may include a CGL 590 between the first and second emitting parts ST1 and ST2. The OLED D4 may further include a capping layer on the second electrode 230 to enhance a light extraction efficiency.

The organic light emitting display device 100 may include a red pixel region, a green pixel region and a blue pixel region, and the OLED D4 may be positioned in the blue pixel region.

The first electrode 210 may be an anode, and the second electrode 230 may be a cathode. One of the first and second electrodes 210 and 230 may be a reflective electrode, and the other one of the first and second electrodes 210 and 230 may be a transparent (or a semi-transparent) electrode. For example, the first electrode 210 may have a single-layered structure of ITO, and the second electrode 230 may be formed of Al.

The first emitting part ST1 may further include at least one of a first HTL 544 under the first blue EML 510 and a first ETL 546 over the first blue EML 510.

In addition, the first emitting part ST1 may further include an HIL 542 between the first electrode 210 and the first HTL 544.

Moreover, the first emitting part ST1 may further include at least one of a first EBL between the first HTL 544 and the first blue EML 510 and a first HBL between the first blue EML 510 and the first ETL 546.

The second emitting part ST2 may further include at least one of a second HTL 582 under the second blue EML 550 and a second ETL 584 over the second blue EML 550.

In addition, the second emitting part ST2 may further include an EIL 586 between the second electrode 230 and the second ETL 584.

Moreover, the second emitting part ST2 may further include at least one of a second EBL between the second HTL 582 and the second blue EML 550 and a second HBL between the second blue EML 550 and the second ETL 584.

For example, the HIL 542 may include the above-mentioned hole injection material and may have a thickness of 1 to 30 nm.

Each of the first and second HTLs 544 and 582 may include the above-mentioned hole transporting material and may have a thickness of 10 to 100 nm.

Each of the first and second ETLs 546 and 584 may include the above-mentioned electron transporting material and may have a thickness of 10 to 100 nm.

The EIL 586 may include the above-mentioned electron injection material and may have a thickness of 0.1 to 10 nm.

Each of the first and second EBLs may include the above-mentioned electron blocking material and may have a thickness of 5 to 40 nm.

Each of the first and second HBLs may include the above-mentioned hole blocking material and may have a thickness of 1 to 20 nm.

The CGL 590 is positioned between the first and second emitting parts ST1 and ST2. Namely, the first and second emitting parts ST1 and ST2 is connected to each other through the CGL 590. The CGL 590 may be a PN-junction CGL of an N-type CGL 592 and a P-type CGL 594.

The N-type CGL 592 is positioned between the first ETL 546 and the second HTL 582, and the P-type CGL 594 is positioned between the N-type CGL 592 and the second HTL 582.

The N-type CGL 592 provides an electron into the first blue EML 510 of the first emitting part ST1, and the P-type CGL 594 provides a hole into the second blue EML 550 of the second emitting part ST2.

The N-type CGL 592 may be an organic layer doped with an alkali metal, e.g., Li, Na, K and Cs, and/or an alkali earth metal, e.g., Mg, Sr, Ba and Ra. For example, the N-type CGL 592 may be formed of an N-type charge generation material including a host being the organic material, e.g., 4,7-dipheny-1,10-phenanthroline (Bphen) and MTDATA, a dopant being an alkali metal and/or an alkali earth metal, and the dopant may be doped with a weight % of 0.01 to 30.

The P-type CGL 594 may be formed of a P-type charge generation material including an inorganic material, e.g., tungsten oxide (Wox), molybdenum oxide (MoOx), beryllium oxide ($Be_2O_3$) or vanadium oxide ($V_2O_5$), an organic material, e.g., NPD, HAT-CN, F4TCNQ, TPD, TNB, TCTA, N,N'-dioctyl-3,4,9,10-perylenedicarboximide (PTCDI-C8) or their combination.

The first blue EML 510 includes a first blue emitting layer 520 and a second blue emitting layer 530. For example, the first blue emitting layer 520 is positioned between the first electrode 210 and the second blue emitting layer 530.

In the first blue EML 510, the second blue emitting layer 530 contacts and disposed on the first blue emitting layer 520 so that the first blue EML 510 has a double-layered structure.

The first blue emitting layer 520 includes a first p-type host 522 and a first n-type host 524, and the second blue emitting layer 530 includes a second p-type host 532 and a second n-type host 534. The first blue emitting layer 520 may further include a first phosphorescent dopant (e.g., phosphorescent emitter) 526 and the second blue emitting layer 530 may further include a second phosphorescent dopant 536.

One of the first p-type host 522 and the second p-type host 532 is a first compound represented by one of Formula 1a and Formula 1b, and the other one of the first p-type host 522 and the second p-type host 532 is a second compound represented by one of Formula 3a and Formula 3b. For example, one of the first p-type host 522 and the second p-type host 532 may be selected from the compounds in Formula 2, and the other one of the first p-type host 522 and the second p-type host 532 may be selected from the compounds in Formula 4.

Each of the first and second n-type hosts 524 and 534 is a compound represented by Formula 5. For example, each of the first and second n-type hosts 524 and 534 may be independently selected from the compounds in Formula 6. The first and second n-type hosts 524 and 534 may be same or different.

Each of the first and second phosphorescent dopants 526 and 536 is a compound represented by Formula 7. For example, each of the first and second phosphorescent dopants 526 and 536 may be independently selected from the compounds in Formula 8. The first and second phosphorescent dopants 526 and 536 may be same or different.

In the first blue emitting layer 520, a weight % of each of the first p-type host 522 and the first n-type host 524 may be greater than that of the first phosphorescent dopant 526, and the weight % of the first p-type host 522 and the weight % of the first n-type host 524 may be same or different. For example, in the first blue emitting layer 520, the first p-type host 522 and the first n-type host 524 may have the same weight %, and each of the first p-type host 522 and the first n-type host 524 may have a part by weight of 200 to 600 with respect to the first phosphorescent dopant 526.

In the second blue emitting layer 530, a weight % of each of the second p-type host 532 and the second n-type host 534 may be greater than that of the second phosphorescent dopant 536, and the weight % of the second p-type host 532 and the weight % of the second n-type host 534 may be same or different. For example, in the second blue emitting layer 530, the second p-type host 532 and the second n-type host 534 may have the same weight %, and each of the second p-type host 532 and the second n-type host 534 may have a part by weight of 200 to 600 with respect to the second phosphorescent dopant 536.

The first blue EML 510 may have a thickness of 10 to 100 nm, and each of the first and second blue emitting layers 520 and 530 may have a thickness of 5 to 50 nm. For example, the first blue EML 510 may have a thickness of 20 to 40 nm, and each of the first and second blue emitting layers 520 and 530 may have a thickness of 5 to 30 nm. The thickness of the first blue emitting layer 520 and the thickness of the second blue emitting layer 530 may be same or different.

The second blue EML 550 includes a third blue emitting layer 560 and a fourth blue emitting layer 570. For example, the third blue emitting layer 560 is positioned between the first electrode 210 and the fourth blue emitting layer 570.

In the second blue EML 550, the fourth blue emitting layer 570 contacts and disposed on the third blue emitting layer 560 so that the second blue EML 550 has a double-layered structure.

The third blue emitting layer 560 includes a third p-type host 562 and a third n-type host 564, and the fourth blue emitting layer 570 includes a fourth p-type host 572 and a fourth n-type host 574. The third blue emitting layer 560 may further include a third phosphorescent dopant (e.g., phosphorescent emitter) 566 and the fourth blue emitting layer 570 may further include a fourth phosphorescent dopant 576.

One of the third p-type host 562 and the fourth p-type host 572 is a first compound represented by one of Formula 1a and Formula 1b, and the other one of the third p-type host 562 and the fourth p-type host 572 is a second compound represented by one of Formula 3a and Formula 3b. For example, one of the third p-type host 562 and the fourth p-type host 572 may be selected from the compounds in Formula 2, and the other one of the third p-type host 562 and the fourth p-type host 572 may be selected from the compounds in Formula 4.

Each of the third and fourth n-type hosts 564 and 574 is a compound represented by Formula 5. For example, each of the third and fourth n-type hosts 564 and 574 may be independently selected from the compounds in Formula 6. The third and fourth n-type hosts 564 and 574 may be same or different.

Each of the third and fourth phosphorescent dopants 566 and 576 is a compound represented by Formula 7. For example, each of the third and fourth phosphorescent dopants 566 and 576 may be independently selected from the compounds in Formula 8. The third and fourth phosphorescent dopants 566 and 576 may be same or different.

In the third blue emitting layer 560, a weight % of each of the third p-type host 562 and the third n-type host 564 may be greater than that of the third phosphorescent dopant 566, and the weight % of the third p-type host 562 and the weight % of the third n-type host 564 may be same or different. For example, in the third blue emitting layer 560, the third p-type host 562 and the third n-type host 564 may have the same weight %, and each of the third p-type host 562 and the third n-type host 564 may have a part by weight of 200 to 600 with respect to the third phosphorescent dopant 566.

In the fourth blue emitting layer 570, a weight % of each of the fourth p-type host 572 and the fourth n-type host 574 may be greater than that of the fourth phosphorescent dopant 576, and the weight % of the fourth p-type host 572 and the weight % of the fourth n-type host 574 may be same or different. For example, in the fourth blue emitting layer 570, the fourth p-type host 572 and the fourth n-type host 574 may have the same weight %, and each of the fourth p-type host 572 and the fourth n-type host 574 may have a part by weight of 200 to 600 with respect to the fourth phosphorescent dopant 576.

The second blue EML 550 may have a thickness of 10 to 100 nm, and each of the third and fourth blue emitting layers 560 and 570 may have a thickness of 5 to 50 nm. For example, the second blue EML 550 may have a thickness of 20 to 40 nm, and each of the third and fourth blue emitting layers 560 and 570 may have a thickness of 5 to 30 nm. The thickness of the third blue emitting layer 560 and the thickness of the fourth blue emitting layer 570 may be same or different.

In the blue pixel region, the organic light emitting layer 220 of the OLED D4 includes the first blue EML 510 and the second blue EML 550 to have a tandem structure.

The first blue EML 510 includes the first blue emitting layer 520, which includes the first p-type host 522, the first n-type host 524 and the first phosphorescent dopant 526, and the second blue emitting layer 530, which includes the second p-type host 532, the second n-type host 534 and the second phosphorescent dopant 536. One of the first and second p-type hosts 522 and 532 is the first compound represented by Formula 1a or Formula 1b, and the other one of the first and second p-type hosts 522 and 532 is the second compound represented by Formula 3a or Formula 3b. In addition, each of the first and second n-type hosts 524 and 534 is a compound represented by Formula 5, and each of the first and second phosphorescent dopants 526 and 536 is a compound represented by Formula 7.

In addition, the second blue EML 550 includes the third blue emitting layer 560, which includes the third p-type host 562, the third n-type host 564 and the third phosphorescent dopant 566, and the fourth blue emitting layer 570, which includes the fourth p-type host 572, the fourth n-type host 574 and the fourth phosphorescent dopant 576. One of the third and fourth p-type hosts 562 and 572 is the first compound represented by Formula 1a or Formula 1b, and the other one of the third and fourth p-type hosts 562 and 572 is the second compound represented by Formula 3a or Formula 3b. In addition, each of the third and fourth n-type hosts 564 and 574 is a compound represented by Formula 5, and each of the third and fourth phosphorescent dopants 566 and 576 is a compound represented by Formula 7.

Accordingly, the OLED D4 and the organic light emitting display device 100 of the present disclosure have advantages in the driving voltage and the lifespan.

Figure 9:
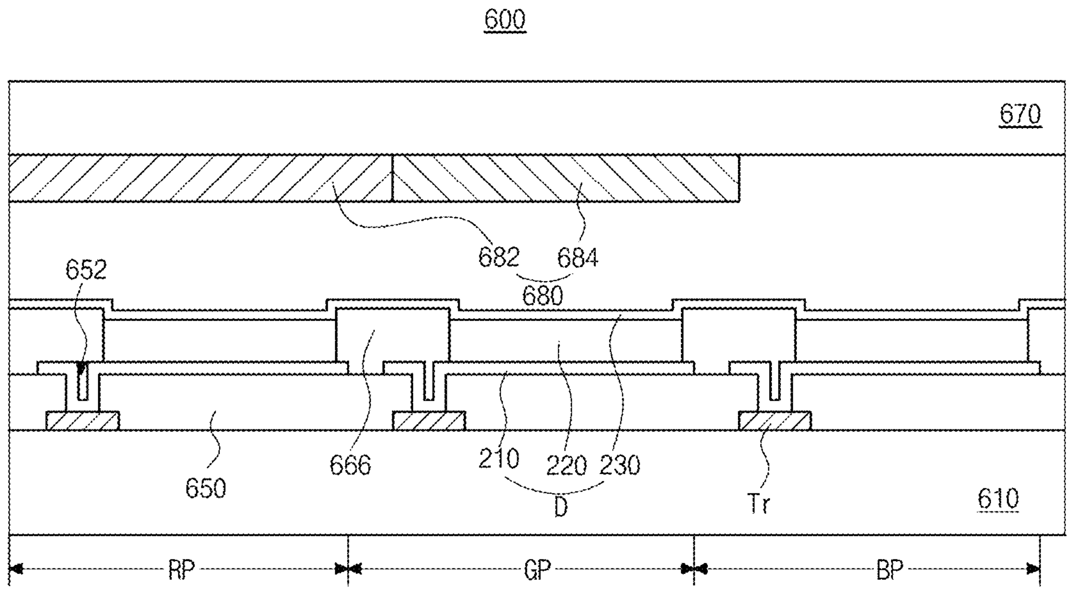
FIG. 9 is a schematic cross-sectional view of an organic light emitting display device according to a sixth embodiment of the present disclosure.

FIG. 9 is a schematic cross-sectional view illustrating an organic light emitting display device according to a sixth embodiment of the present disclosure.

As illustrated in FIG. 9, the organic light emitting display device 600 includes a first substrate 610, where a red pixel region RP, a green pixel region GP and a blue pixel region BP are defined, a second substrate 670 facing the first substrate 610, an OLED D, which is positioned between the first and second substrates 610 and 670 and providing white emission, and a color conversion layer 680 between the OLED D and the second substrate 670.

Although not shown, a color filter may be formed between the second substrate 670 and each color conversion layer 680.

Each of the first and second substrates 610 and 670 may be a glass substrate or a flexible substrate. For example, the flexible substrate may be a polyimide (PI) substrate, a polyethersulfone (PES) substrate, a polyethylenenaphthalate (PEN) substrate, a polyethylene terephthalate (PET) substrate or a polycarbonate (PC) substrate.

A TFT Tr, which corresponding to each of the red, green and blue pixel regions RP, GP and BP, is formed on the first substrate 610, and a planarization layer 650, which has a drain contact hole 652 exposing an electrode, e.g., a drain electrode, of the TFT Tr is formed to cover the TFT Tr.

The OLED D including a first electrode 210, an organic light emitting layer 220 and a second electrode 230 is formed on the planarization layer 650. In this instance, the first electrode 210 may be connected to the drain electrode of the TFT Tr through the drain contact hole 652.

The first electrode 210 may be an anode, and the second electrode 230 may be a cathode. One of the first and second electrodes 210 and 230 may be a reflective electrode, and the other one of the first and second electrodes 210 and 230 may be a transparent (or a semi-transparent) electrode. For example, the first electrode 210 may have a single-layered structure of ITO, and the second electrode 230 may be formed of Al.

A bank layer 666 is formed on the planarization layer 650 to cover an edge of the first electrode 210. Namely, the bank layer 666 is positioned at a boundary of the pixel region and exposes a center of the first electrode 210 in the pixel region.

Since the OLED D emits blue light in each of the red, green and blue pixel regions RP, GP and BP, the organic light emitting layer 220 may be integrally formed as a common layer in the red, green and blue pixel regions RP, GP and BP without separation. The bank layer 666 may be formed to prevent a current leakage at an edge of the first electrode 210 and may be omitted.

The OLED D emits a blue light and may have a structure shown in FIGS. 3, 6 to 8. Namely, the OLED D is formed in each of the red, green and blue pixel regions RP, GP and BP and provides the blue light.

For example, referring to FIG. 3, the organic light emitting layer 220 of the OLED D includes the blue EML 240, and the blue EML 240 include the first blue emitting layer 250, which includes the first p-type host 252, the first n-type host 254 and the first phosphorescent dopant 256, and the second blue emitting layer 260, which includes the second p-type host 262, the second n-type host 264 and the second phosphorescent dopant 266.

One of the first p-type host 252 and the second p-type host 262 is a first compound represented by one of Formula 1a and Formula 1b, and the other one of the first p-type host 252 and the second p-type host 262 is a second compound represented by one of Formula 3a and Formula 3b. Each of the first and second n-type hosts 254 and 264 is a compound represented by Formula 5, and each of the first and second phosphorescent dopants 256 and 266 is a compound represented by Formula 7.

The color conversion layer 680 includes a first color conversion layer 682 corresponding to the red pixel region RP and a second color conversion layer 684 corresponding to the green pixel region GP. For example, the color conversion layer 680 may include an inorganic color conversion material such as a quantum dot. The color conversion layer is not presented in the blue pixel region BP so that the OLED D in the blue pixel region BP may directly face the second substrate 670.

The blue light from the OLED D is converted into the red light by the first color conversion layer 682 in the red pixel region RP, and the blue light from the OLED D is converted into the green light by the second color conversion layer 684 in the green pixel region GP.

Accordingly, the organic light emitting display device 600 can display a full-color image.

When the light from the OLED D passes through the first substrate 610 to display an image, the color conversion layer 680 may be disposed between the OLED D and the first substrate 610.

Figure 10:
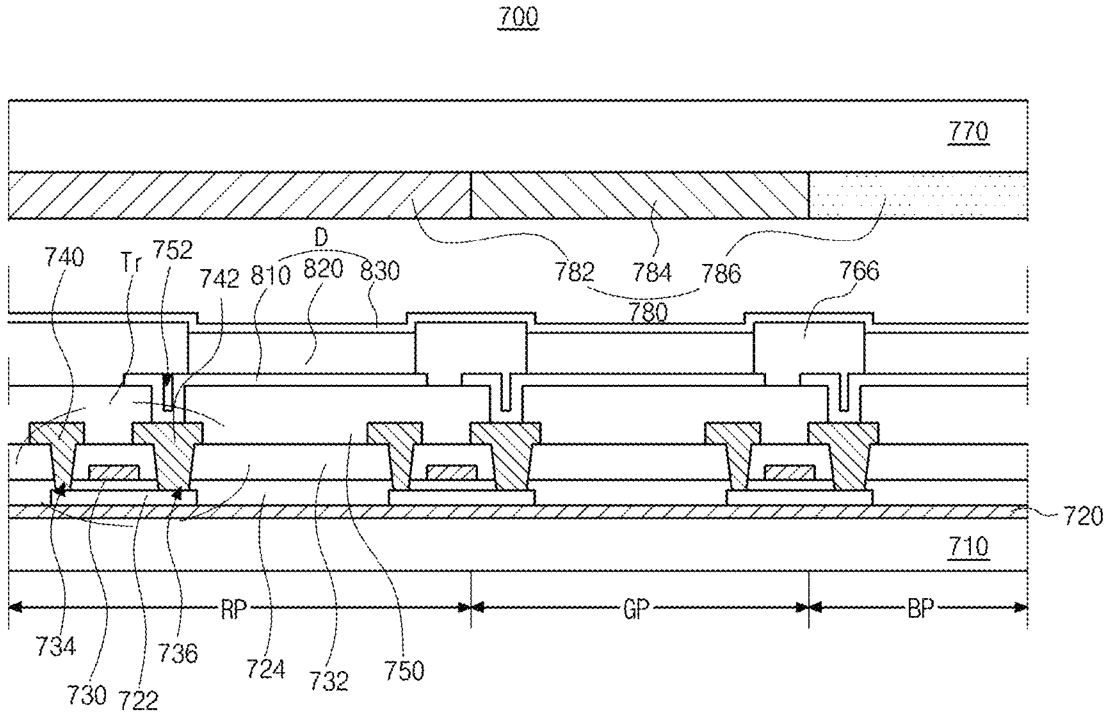
FIG. 10 is a schematic cross-sectional view of an organic light emitting display device according to a seventh embodiment of the present disclosure.

FIG. 10 is a schematic cross-sectional view illustrating an organic light emitting display device according to a seventh embodiment of the present disclosure.

As illustrated in FIG. 10, the organic light emitting display device 700 includes a first substrate 710, where a red pixel region RP, a green pixel region GP and a blue pixel region BP are defined, a second substrate 770 facing the first substrate 710, an OLED D, which is positioned between the first and second substrates 710 and 770 and providing white emission, and a color filter layer 780 between the OLED D and the second substrate 770.

Each of the first and second substrates 710 and 770 may be a glass substrate or a flexible substrate. For example, the flexible substrate may be a polyimide (PI) substrate, a polyethersulfone (PES) substrate, a polyethylenenaphthalate (PEN) substrate, a polyethylene terephthalate (PET) substrate or a polycarbonate (PC) substrate.

A buffer layer 720 is formed on the substrate, and the TFT Tr corresponding to each of the red, green and blue pixel regions RP, GP and BP is formed on the buffer layer 720. The buffer layer 720 may be omitted.

A semiconductor layer 722 is formed on the buffer layer 720. The semiconductor layer 722 may include an oxide semiconductor material or polycrystalline silicon.

A gate insulating layer 724 is formed on the semiconductor layer 722. The gate insulating layer 724 may be formed of an inorganic insulating material such as silicon oxide or silicon nitride.

A gate electrode 730, which is formed of a conductive material, e.g., metal, is formed on the gate insulating layer 724 to correspond to a center of the semiconductor layer 722.

An interlayer insulating layer 732, which is formed of an insulating material, is formed on the gate electrode 730. The interlayer insulating layer 732 may be formed of an inorganic insulating material, e.g., silicon oxide or silicon nitride, or an organic insulating material, e.g., benzocyclobutene or photo-acryl.

The interlayer insulating layer 732 includes first and second contact holes 734 and 736 exposing both sides of the semiconductor layer 722. The first and second contact holes 734 and 736 are positioned at both sides of the gate electrode 730 to be spaced apart from the gate electrode 730.

A source electrode 740 and a drain electrode 742, which are formed of a conductive material, e.g., metal, are formed on the interlayer insulating layer 732.

The source electrode 740 and the drain electrode 742 are spaced apart from each other with respect to the gate electrode 730 and respectively contact both sides of the semiconductor layer 722 through the first and second contact holes 734 and 736.

The semiconductor layer 722, the gate electrode 730, the source electrode 740 and the drain electrode 742 constitute the TFT Tr. The TFT Tr serves as a driving element. Namely, the TFT Tr may correspond to the driving TFT Td (of FIG. 1).

Although not shown, the gate line and the data line cross each other to define the pixel region, and the switching TFT is formed to be connected to the gate and data lines. The switching TFT is connected to the TFT Tr as the driving element.

In addition, the power line, which may be formed to be parallel to and spaced apart from one of the gate and data lines, and the storage capacitor for maintaining the voltage of the gate electrode of the TFT Tr in one frame may be further formed.

A planarization layer 750, which includes a drain contact hole 752 exposing the drain electrode 742 of the TFT Tr, is formed to cover the TFT Tr.

A first electrode 810, which is connected to the drain electrode 742 of the TFT Tr through the drain contact hole 752, is separately formed in each pixel region and on the planarization layer 750. The first electrode 810 may be an anode and may be formed of a conductive material having a relatively high work function. For example, the first electrode 810 may include a transparent conductive oxide layer formed of a transparent conductive oxide (TCO).

For example, the transparent conductive oxide material layer of the first electrode 810 may be formed of one of indium-tin-oxide (ITO), indium-zinc-oxide (IZO), indium-tin-zinc-oxide (ITZO), tin oxide (SnO), zinc oxide (ZnO), indium-copper-oxide (ICO) and aluminum-zinc-oxide (Al:ZnO, AZO).

The first electrode 810 may further include a reflective layer to have a double-layered structure or a triple-layered structure. Namely, the first electrode 810 may be a reflective electrode.

For example, the reflective layer may be formed of one of silver (Ag), an alloy of Ag and one of palladium (Pd), copper (Cu), indium (In) and neodymium (Nd), and aluminum-palladium-copper (APC) alloy. For example, the first electrode 810 may have a double-layered structure of Ag/ITO or APC/ITO or a triple-layered structure of ITO/Ag/ITO or ITO/APC/ITO.

A bank layer 766 is formed on the planarization layer 750 to cover an edge of the first electrode 810. Namely, the bank layer 766 is positioned at a boundary of the pixel region and exposes a center of the first electrode 810 in the pixel region. Since the OLED D emits blue light in each of the red, green and blue pixel regions RP, GP and BP, the organic light emitting layer 820 may be integrally formed as a common layer in the red, green and blue pixel regions RP, GP and BP without separation. The bank layer 766 may be formed to prevent a current leakage at an edge of the first electrode 810 and may be omitted.

An organic emitting layer 820 is formed on the first electrode 810.

A second electrode 830 is formed over the substrate 710 where the organic emitting layer 820 is formed.

In the organic light emitting display device 700, since the light emitted from the organic emitting layer 820 is incident to the color filter layer 780 through the second electrode 830, the second electrode 830 has a thin profile for transmitting the light.

The first electrode 810, the organic emitting layer 820 and the second electrode 830 constitute the OLED D.

The color filter layer 780 is disposed over the OLED D and includes a red color filter 782, a green color filter 784 and a blue color filter 786 respectively corresponding to the red pixel region RP, the green pixel region GP and the blue pixel region BP. The red color filter 782 includes at least one of a red dye and a red pigment, the green color filter 784 includes at least one of a green dye and a green pigment, and the blue color filter 786 includes at least one of a blue dye and a blue pigment.

The color filter layer 780 may be attached to the OLED D using an adhesive layer. Alternatively, the color filter layer 780 may be formed directly on the OLED D. When an encapsulation layer (or an encapsulation film) is formed to cover the OLED D, the color filter layer 780 may be formed on the encapsulation layer.

An encapsulation layer (or an encapsulation film) may be formed to prevent penetration of moisture into the OLED D. For example, the encapsulation film may include a first inorganic insulating layer, an organic insulating layer and a second inorganic insulating layer sequentially stacked, but it is not limited thereto. The encapsulation film may be omitted.

In the bottom-emission type organic light emitting display device 700, a metal plate may be disposed over the second electrode 830. The metal plate may be attached to the OLED D using an adhesive layer.

A polarization plate for reducing an ambient light reflection may be disposed over an outer side of the second substrate 770 of the top-emission type OLED D. For example, the polarization plate may be a circular polarization plate.

In the OLED D of FIG. 10, the first electrode 810 and the second electrode 830 are a reflective electrode and a transparent (a semitransparent) electrode, respectively, and the color filter layer 780 is disposed over the OLED D.

Alternatively, the first electrode 810 and the second electrode 830 may be a transparent (a semitransparent) electrode and a reflective electrode, respectively, and the color filter layer 780 may be disposed between the OLED D and the first substrate 710. In this case, first electrode 810 may have a single-layered structure of the transparent conductive oxide layer.

A color conversion layer may be formed between the OLED D and the color filter layer 780. The color conversion layer may include a red color conversion layer, a green color conversion layer and a blue color conversion layer respectively corresponding to the red, green and blue pixel regions RP, GP and BP. The white light from the OLED D is converted into the red light, the green light and the blue light by the red, green and blue color conversion layer, respectively.

The color conversion layer may be included instead of the color filter layer 780.

As described above, in the organic light emitting display device 700, the OLED D in the red, green and blue pixel regions RP, GP and BP emits the white light, and the white light from the organic light emitting diode D passes through the red color filter 782, the green color filter 784 and the blue color filter 786. As a result, the red light, the green light and the blue light are provided from the red pixel region RP, the green pixel region GP and the blue pixel region BP, respectively.

In FIG. 10, the OLED D emitting the white light is used for a display device. Alternatively, the OLED D may be formed on an entire surface of a substrate without at least one of the driving element and the color filter layer to be used for a lightening device. The display device and the lightening device each including the OLED D of the present disclosure may be referred to as an organic light emitting device.

Figure 11:
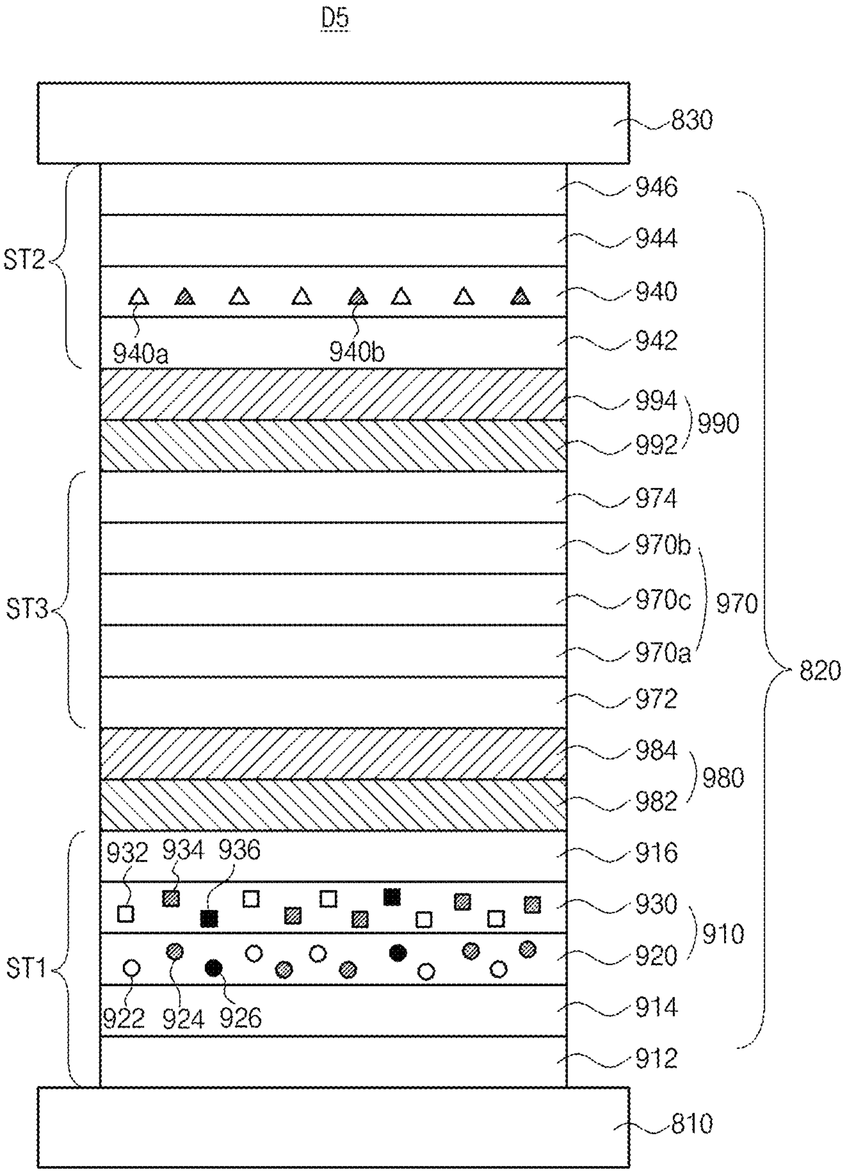
FIG. 11 is a schematic cross-sectional view of an OLED according to an eighth embodiment of the present disclosure.

FIG. 11 is a schematic cross-sectional view of an OLED according to an eighth embodiment of the present disclosure.

As illustrated in FIG. 11, the OLED D5 includes first and second electrodes 810 and 830, which face each other and an organic light emitting layer 820 therebetween. The organic light emitting layer 820 includes a first emitting part ST1 including a first EML, e.g., a first blue EML 910, a second emitting part ST2 including a second EML, e.g., a second blue EML, 940, and a third emitting part ST3 including a third EML 970. The organic light emitting layer 820 may further includes a first CGL 980 between the first and third emitting parts ST1 and ST3 and a second CGL 990 between the second and third emitting parts ST2 and ST3. The OLED D5 may further include a capping layer on the second electrode 830 to enhance a light extraction efficiency.

The organic light emitting display device 700 may include a red pixel region, a green pixel region and a blue pixel region, and the OLED D5 may be positioned in the red, green and blue pixel regions RP, GP and BP and emits blue light.

The first electrode 810 may be an anode, and the second electrode 830 may be a cathode. One of the first and second electrodes 810 and 830 may be a reflective electrode, and the other one of the first and second electrodes 810 and 830 may be a transparent (or a semi-transparent) electrode. For example, the first electrode 810 may have a single-layered structure of ITO, and the second electrode 830 may be formed of Al.

The first emitting part ST1 may further include at least one of a first HTL 914 under the first blue EML 910 and a first ETL 916 over the first blue EML 910.

In addition, the first emitting part ST1 may further include an HIL 912 between the first electrode 810 and the first HTL 914.

Moreover, the first emitting part ST1 may further include at least one of a first EBL between the first HTL 914 and the first blue EML 910 and a first HBL between the first blue EML 910 and the first ETL 916.

The second emitting part ST2 may further include at least one of a second HTL 942 under the second blue EML 940 and a second ETL 944 over the second blue EML 940.

In addition, the second emitting part ST2 may further include an EIL 946 between the second electrode 830 and the second ETL 944.

Moreover, the second emitting part ST2 may further include at least one of a second EBL between the second HTL 942 and the second blue EML 940 and a second HBL between the second blue EML 940 and the second ETL 944.

In the third emitting part ST3, the third EML 970 may include a red EML **970*a*, a yellow-green EML 970*c* and a green EML 970*b*. In this case, the yellow-green EML 970*c* is disposed between the red and green EMLs 970*a* and 970*b*. Alternatively, the yellow-green EML 970*c* may be omitted, and the third EML 970 may have a double-layered structure including the red and green EMLs 970*a* and 970*b***.

The red EML **970*a* includes a red host and a red dopant, the green EML 970*b* includes a green host and a green dopant, and the yellow-green EML 970*c*** includes a yellow-green host and a yellow-green dopant. Each of the red dopant, the green dopant and the yellow-green dopant may be one of a fluorescent compound, a phosphorescent compound and a delayed fluorescent compound.

The third emitting part ST3 may include at least one of a third HTL 972 under the third EML 970 and a third ETL 974 over the third EML 970.

In addition, the third emitting part ST3 may further include at least one of a third EBL between the third HTL 972 and the third EML 970 and a third HBL between the third EML 970 and the third ETL 974.

For example, the HIL 912 may include the above-mentioned hole injection material and may have a thickness of 1 to 30 nm.

Each of the first to third HTLs 914, 942 and 972 may include the above-mentioned hole transporting material and may have a thickness of 10 to 100 nm.

Each of the first to third ETLs 916, 944 and 974 may include the above-mentioned electron transporting material and may have a thickness of 10 to 100 nm.

The EIL 946 may include the above-mentioned electron injection material and may have a thickness of 0.1 to 10 nm.

Each of the first to third EBLs may include the above-mentioned electron blocking material and may have a thickness of 5 to 40 nm.

Each of the first to third HBLs may include the abovementioned hole blocking material and may have a thickness of 1 to 20 nm.

The first CGL 980 is positioned between the first and third emitting parts ST1 and ST3, and the second CGL 990 is positioned between the second and third emitting parts ST2 and ST3. Namely, the first emitting part ST1, the first CGL 980, the third emitting part ST3, the second CGL 990 and the second emitting part ST2 are sequentially stacked on the first electrode 810. In other words, the first emitting part ST1 is positioned between the first electrode 810 and the first CGL 980, the third emitting part ST3 is positioned between the first and second CGLs 980 and 990, and the second emitting part ST2 is positioned between the second CGL 990 and the second electrode 830.

The first CGL 980 may be a P-N junction CGL of a first N-type CGL 982 and a first P-type CGL 984, and the second CGL 990 may be a P-N junction CGL of a second N-type CGL 992 and a second P-type CGL 994.

In the first CGL 980, the first N-type CGL 982 is positioned between the first ETL 916 and the third HTL 972, and the first P-type CGL 984 is positioned between the first N-type CGL 982 and the third HTL 972.

In the second CGL 990, the second N-type CGL 992 is positioned between the third ETL 974 and the second HTL 942, and the second P-type CGL 994 is positioned between the second N-type CGL 992 and the second HTL 942.

Each of the first and second N-type CGLs 982 and 992 may be an organic layer doped with an alkali metal, e.g., Li, Na, K and Cs, and/or an alkali earth metal, e.g., Mg, Sr, Ba and Ra. For example, each of the first and second N-type CGLs 982 and 992 may be formed of an N-type charge generation material including a host being the organic material, e.g., 4,7-dipheny-1,10-phenanthroline (Bphen) and MTDATA, a dopant being an alkali metal and/or an alkali earth metal, and the dopant may be doped with a weight % of 0.01 to 30.

Each of the first and second P-type CGLs 984 and 994 may be formed of a P-type charge generation material including an inorganic material, e.g., tungsten oxide (Wox), molybdenum oxide (MoOx), beryllium oxide ($Be_2O_3$) or vanadium oxide (V2O5), an organic material, e.g., NPD, HAT-CN, F4TCNQ, TPD, TNB, TCTA, N,N'-dioctyl-3,4,9,10-perylenedicarboximide (PTCDI-C8) or their combination.

The first blue EML 910 includes a first blue emitting layer 920 and a second blue emitting layer 930. For example, the first blue emitting layer 920 is positioned between the first electrode 810 and the second blue emitting layer 930.

In the first blue EML 910, the second blue emitting layer 930 contacts and disposed on the first blue emitting layer 920 so that the first blue EML 910 has a double-layered structure.

The first blue emitting layer 920 includes a first p-type host 922 and a first n-type host 924, and the second blue emitting layer 930 includes a second p-type host 932 and a second n-type host 934. The first blue emitting layer 920 may further include a first phosphorescent dopant (e.g., phosphorescent emitter) 926 and the second blue emitting layer 930 may further include a second phosphorescent dopant 936.

One of the first p-type host 922 and the second p-type host 932 is a first compound represented by one of Formula 1a and Formula 1b, and the other one of the first p-type host 922 and the second p-type host 932 is a second compound represented by one of Formula 3a and Formula 3b. For example, one of the first p-type host 922 and the second p-type host 932 may be selected from the compounds in Formula 2, and the other one of the first p-type host 922 and the second p-type host 932 may be selected from the compounds in Formula 4.

Each of the first and second n-type hosts 924 and 934 is a compound represented by Formula 5. For example, each of the first and second n-type hosts 924 and 934 may be independently selected from the compounds in Formula 6. The first and second n-type hosts 924 and 934 may be same or different.

Each of the first and second phosphorescent dopants 926 and 936 is a compound represented by Formula 7. For example, each of the first and second phosphorescent dopants 926 and 936 may be independently selected from the compounds in Formula 8. The first and second phosphorescent dopants 926 and 936 may be same or different.

In the first blue emitting layer 920, a weight % of each of the first p-type host 922 and the first n-type host 924 may be greater than that of the first phosphorescent dopant 926, and the weight % of the first p-type host 922 and the weight % of the first n-type host 924 may be same or different. For example, in the first blue emitting layer 920, the first p-type host 922 and the first n-type host 924 may have the same weight %, and each of the first p-type host 922 and the first n-type host 924 may have a part by weight of 200 to 600 with respect to the first phosphorescent dopant 926.

In the second blue emitting layer 930, a weight % of each of the second p-type host 932 and the second n-type host 934 may be greater than that of the second phosphorescent dopant 936, and the weight % of the second p-type host 932 and the weight % of the second n-type host 934 may be same or different. For example, in the second blue emitting layer 930, the second p-type host 932 and the second n-type host 934 may have the same weight %, and each of the second p-type host 932 and the second n-type host 934 may have a part by weight of 200 to 600 with respect to the second phosphorescent dopant 936.

The first blue EML 910 may have a thickness of 10 to 100 nm, and each of the first and second blue emitting layers 920 and 930 may have a thickness of 5 to 50 nm. For example, the first blue EML 910 may have a thickness of 20 to 40 nm, and each of the first and second blue emitting layers 920 and 930 may have a thickness of 5 to 30 nm. The thickness of the first blue emitting layer 920 and the thickness of the second blue emitting layer 930 may be same or different.

The second blue EML 940 may have a single-layered structure. The second blue EML 940 may have a thickness of 10 to 100 nm.

The second blue EML 940 may include a blue host 940*a* and a blue dopant (e.g., an emitter) 940*b*. The second blue EML 940 may further include an auxiliary dopant (or an auxiliary host). In the second blue EML 940, a weight % of the blue dopant 940*b* may be smaller than that of each of the blue host 940*a* and the auxiliary dopant.

For example, the blue host 940*a* may include at least one of the compounds in Formula 14, the blue dopant 940*b* may be selected from the compounds in Formula 15, and the auxiliary dopant may be selected from the compounds in Formula 16.

The second blue EML 940 may be one of a fluorescent emitting layer, a phosphor-sensitized fluorescence (PSF) emitting layer and a hyper-fluorescence emitting layer.

The organic light emitting layer 820 of the OLED D5 includes the first emitting part ST1 including the first blue EML 910, the second emitting part ST2 including the second blue EML 940 and the third emitting part ST3 including the red, yellow-green and green EMLs 970*a*, 970*c* and 970*b* so that the OLED D5 has a tandem structure.

In this case, the first blue EML 910 includes the first blue emitting layer 920, which includes the first p-type host 922, the first n-type host 924 and the first phosphorescent dopant 926, and the second blue emitting layer 930, which includes the second p-type host 932, the second n-type host 934 and the second phosphorescent dopant 936. One of the first and second p-type hosts 922 and 932 is the first compound represented by Formula 1a or Formula 1b, and the other one of the first and second p-type hosts 922 and 932 is the second compound represented by Formula 3a or Formula 3b. In addition, each of the first and second n-type hosts 924 and 934 is a compound represented by Formula 5, and each of the first and second phosphorescent dopants 926 and 936 is a compound represented by Formula 7.

Accordingly, in the OLED D5 and the organic light emitting display device 700 of the present disclosure, the driving voltage is reduced, and the emitting efficiency, the color purity and the lifespan are improved.

Figure 12:
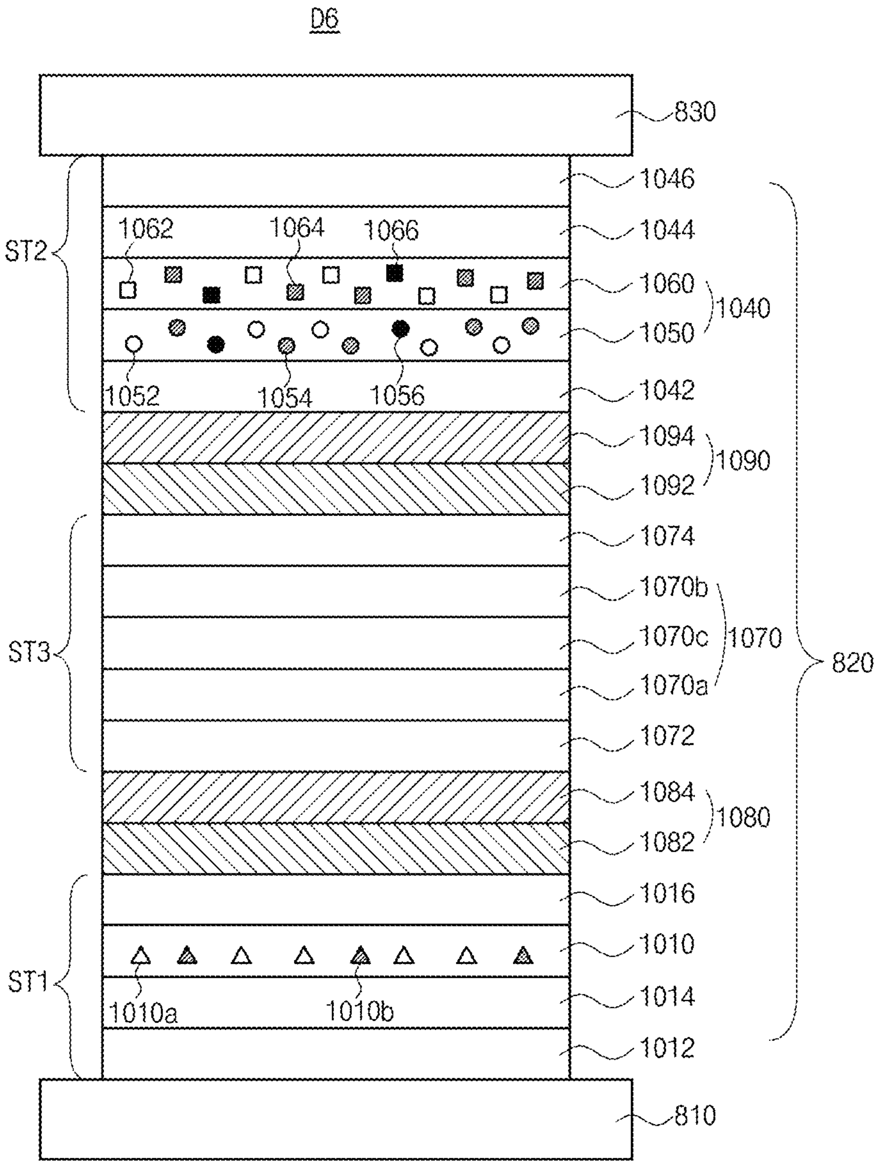
FIG. 12 is a schematic cross-sectional view of an OLED according to a ninth embodiment of the present disclosure.

FIG. 12 is a schematic cross-sectional view of an OLED according to a ninth embodiment of the present disclosure.

As illustrated in FIG. 12, the OLED D6 includes first and second electrodes 810 and 830, which face each other and an organic light emitting layer 820 therebetween. The organic light emitting layer 820 includes a first emitting part STT including a first EML 1010, e.g., a first blue EML, a second emitting part ST2 including a second EML 1040, e.g., a second blue EML, and a third emitting part ST3 including a third EML 1070. The organic light emitting layer 820 may further includes a first CGL 1080 between the first and third emitting parts STT and ST3 and a second CGL 1090 between the second and third emitting parts ST2 and ST3. The OLED D6 may further include a capping layer on the second electrode 830 to enhance a light extraction efficiency.

The organic light emitting display device 700 may include a red pixel region, a green pixel region and a blue pixel region, and the OLED D6 may be positioned in the red, green and blue pixel regions RP, GP and BP and emits blue light.

The first electrode 810 may be an anode, and the second electrode 830 may be a cathode. One of the first and second electrodes 810 and 830 may be a reflective electrode, and the other one of the first and second electrodes 810 and 830 may be a transparent (or a semi-transparent) electrode. For example, the first electrode 810 may have a single-layered structure of ITO, and the second electrode 830 may be formed of Al.

The first emitting part ST1 may further include at least one of a first HTL 1014 under the first blue EML 1010 and a first ETL 1016 over the first blue EML 1010.

In addition, the first emitting part ST1 may further include an HIL 1012 between the first electrode 810 and the first HTL 1014.

Moreover, the first emitting part ST1 may further include at least one of a first EBL between the first HTL 1014 and the first blue EML 1010 and a first HBL between the first blue EML 1010 and the first ETL 1016.

The second emitting part ST2 may further include at least one of a second HTL 1042 under the second blue EML 1040 and a second ETL 1044 over the second blue EML 1040.

In addition, the second emitting part ST2 may further include an EIL 1046 between the second electrode 830 and the second ETL 1044.

Moreover, the second emitting part ST2 may further include at least one of a second EBL between the second HTL 1042 and the second EML 1040 and a second HBL between the second EML 1040 and the second ETL 1044.

In the third emitting part ST3, the third EML 1070 may include a red EML 1070*a*, a yellow-green EML 1070*c* and a green EML 1070*b*. In this case, the yellow-green EML 1070*c* is disposed between the red and green EMLs 1070*a* and 1070*b*. Alternatively, the yellow-green EML 1070*c* may be omitted, and the third EML 1070 may have a double-layered structure including the red and green EMLs 1070*a* and 1070*b*.

The red EML 1070*a* includes a red host and a red dopant, the green EML 1070*b* includes a green host and a green dopant, and the yellow-green EML 1070*c* includes a yellow-green host and a yellow-green dopant. Each of the red dopant, the green dopant and the yellow-green dopant may be one of a fluorescent compound, a phosphorescent compound and a delayed fluorescent compound.

The third emitting part ST3 may include at least one of a third HTL 1072 under the third EML 1070 and a third ETL 1074 over the third EML 1070.

In addition, the third emitting part ST3 may further include at least one of a third EBL between the third HTL 1072 and the third EML 1070 and a third HBL between the third EML 1070 and the third ETL 1074.

For example, the HIL 1012 may include the above-mentioned hole injection material and may have a thickness of 1 to 30 nm.

Each of the first to third HTLs 1014, 1042 and 1072 may include the above-mentioned hole transporting material and may have a thickness of 10 to 100 nm.

Each of the first to third ETLs 1016, 1044 and 1074 may include the above-mentioned electron transporting material and may have a thickness of 10 to 100 nm.

The EIL 1046 may include the above-mentioned electron injection material and may have a thickness of 0.1 to 10 nm.

Each of the first to third EBLs may include the above-mentioned electron blocking material and may have a thickness of 5 to 40 nm.

Each of the first to third HBLs may include the above-mentioned hole blocking material and may have a thickness of 1 to 20 nm.

The first CGL 1080 is positioned between the first and third emitting parts ST1 and ST3, and the second CGL 1090 is positioned between the second and third emitting parts ST2 and ST3. Namely, the first emitting part ST1, the first CGL 1080, the third emitting part ST3, the second CGL 1090 and the second emitting part ST2 are sequentially stacked on the first electrode 810. In other words, the first emitting part ST1 is positioned between the first electrode 810 and the first CGL 1080, the third emitting part ST3 is positioned between the first and second CGLs 1080 and 1090, and the second emitting part ST2 is positioned between the second CGL 1090 and the second electrode 830.

The first CGL 1080 may be a P-N junction CGL of a first N-type CGL 1082 and a first P-type CGL 1084, and the second CGL 1090 may be a P-N junction CGL of a second N-type CGL 1092 and a second P-type CGL 1094.

In the first CGL 1080, the first N-type CGL 1082 is positioned between the first ETL 1016 and the third HTL 1072, and the first P-type CGL 1084 is positioned between the first N-type CGL 1082 and the third HTL 1072.

In the second CGL 1090, the second N-type CGL 1092 is positioned between the third ETL 1074 and the second HTL 1042, and the second P-type CGL 1094 is positioned between the second N-type CGL 1092 and the second HTL 1042.

Each of the first and second N-type CGLs 1082 and 1092 may be an organic layer doped with an alkali metal, e.g., Li, Na, K and Cs, and/or an alkali earth metal, e.g., Mg, Sr, Ba and Ra. For example, each of the first and second N-type CGLs 1082 and 1092 may be formed of an N-type charge generation material including a host being the organic material, e.g., 4,7-dipheny-1,10-phenanthroline (Bphen) and MTDATA, a dopant being an alkali metal and/or an alkali earth metal, and the dopant may be doped with a weight % of 0.01 to 30.

Each of the first and second P-type CGLs 1084 and 1094 may be formed of a P-type charge generation material including an inorganic material, e.g., tungsten oxide (Wox), molybdenum oxide (MoOx), beryllium oxide (Be2O3) or vanadium oxide (V2O5), an organic material, e.g., NPD, HAT-CN, F4TCNQ, TPD, TNB, TCTA, N,N'-dioctyl-3,4,9,10-perylenedicarboximide (PTCDI-C8) or their combination.

The first blue EML 1010 may have a single-layered structure. The first blue EML 1010 may have a thickness of 10 to 100 nm.

The first blue EML 1010 may include a blue host 1010*a* and a blue dopant (e.g., an emitter) 1010*b*. The first blue EML 1010 may further include an auxiliary dopant (or an auxiliary host). In the first blue EML 1010, a weight % of the blue dopant 1010*b* may be smaller than that of each of the blue host 1010*a* and the auxiliary dopant.

For example, the blue host 1010*a* may include at least one of the compounds in Formula 14, the blue dopant 1010*b* may be selected from the compounds in Formula 15, and the auxiliary dopant may be selected from the compounds in Formula 16.

The first blue EML 1010 may be one of a fluorescent emitting layer, a phosphor-sensitized fluorescence (PSF) emitting layer and a hyper-fluorescence emitting layer.

The second blue EML 1040 includes a first blue emitting layer 1050 and a second blue emitting layer 1060 adjacent to each other. For example, the second blue emitting layer 1060 is positioned between the second electrode 830 and the first blue emitting layer 1050.

In the second blue EML 1040, the second blue emitting layer 1060 contacts and disposed on the first blue emitting layer 1050 so that the second blue EML 1040 has a double-layered structure.

The first blue emitting layer 1050 includes a first p-type host 1052 and a first n-type host 1054, and the second blue emitting layer 1060 includes a second p-type host 1062 and a second n-type host 1064. The first blue emitting layer 1050 may further include a first phosphorescent dopant (e.g., phosphorescent emitter) 1056 and the second blue emitting layer 1060 may further include a second phosphorescent dopant 1066.

One of the first p-type host 1052 and the second p-type host 1062 is a first compound represented by one of Formula 1a and Formula 1b, and the other one of the first p-type host 1052 and the second p-type host 1062 is a second compound represented by one of Formula 3a and Formula 3b. For example, one of the first p-type host 1052 and the second p-type host 1062 may be selected from the compounds in Formula 2, and the other one of the first p-type host 1052 and the second p-type host 1062 may be selected from the compounds in Formula 4.

Each of the first and second n-type hosts 1054 and 1064 is a compound represented by Formula 5. For example, each of the first and second n-type hosts 1054 and 1064 may be independently selected from the compounds in Formula 6. The first and second n-type hosts 1054 and 1064 may be same or different.

Each of the first and second phosphorescent dopants 1056 and 1066 is a compound represented by Formula 7. For example, each of the first and second phosphorescent dopants 1056 and 1066 may be independently selected from the compounds in Formula 8. The first and second phosphorescent dopants 1056 and 1066 may be same or different.

In the first blue emitting layer 1050, a weight % of each of the first p-type host 1052 and the first n-type host 1054 may be greater than that of the first phosphorescent dopant 1056, and the weight % of the first p-type host 1052 and the weight % of the first n-type host 1054 may be same or different. For example, in the first blue emitting layer 1050, the first p-type host 1052 and the first n-type host 1054 may have the same weight %, and each of the first p-type host 1052 and the first n-type host 1054 may have a part by weight of 200 to 600 with respect to the first phosphorescent dopant 1056.

In the second blue emitting layer 1060, a weight % of each of the second p-type host 1062 and the second n-type host 1064 may be greater than that of the second phosphorescent dopant 1066, and the weight % of the second p-type host 1062 and the weight % of the second n-type host 1064 may be same or different. For example, in the second blue emitting layer 1060, the second p-type host 1062 and the second n-type host 1064 may have the same weight %, and each of the second p-type host 1062 and the second n-type host 1064 may have a part by weight of 200 to 600 with respect to the second phosphorescent dopant 1066.

The second blue EML 1040 may have a thickness of 10 to 100 nm, and each of the first and second blue emitting layers 1050 and 1060 may have a thickness of 5 to 50 nm. For example, the second blue EML 1040 may have a thickness of 20 to 40 nm, and each of the first and second blue emitting layers 1050 and 1060 may have a thickness of 5 to 30 nm. The thickness of the first blue emitting layer 1050 and the thickness of the second blue emitting layer 1060 may be same or different.

The organic light emitting layer 820 of the OLED D6 includes the first emitting part ST1 including the first blue EML 1010, the second emitting part ST2 including the second blue EML 1040 and the third emitting part ST3 including the red, yellow-green and green EMLs 1070*a*, 1070*c* and 1070*b* so that the OLED D6 has a tandem structure.

The second blue EML 1040 includes the first blue emitting layer 1050, which includes the first p-type host 1052, the first n-type host 1054 and the first phosphorescent dopant 1056, and the second blue emitting layer 1060, which includes the second p-type host 1062, the second n-type host 1064 and the second phosphorescent dopant 1066. One of the first and second p-type hosts 1052 and 1062 is the first compound represented by Formula 1a or Formula 1b, and the other one of the first and second p-type hosts 1052 and 1062 is the second compound represented by Formula 3a or Formula 3b. In addition, each of the first and second n-type hosts 1054 and 1064 is a compound represented by Formula 5, and each of the first and second phosphorescent dopants 1056 and 1066 is a compound represented by Formula 7.

Accordingly, the OLED D6 and the organic light emitting display device 700 of the present disclosure have advantages in the driving voltage and the lifespan.

Figure 13:
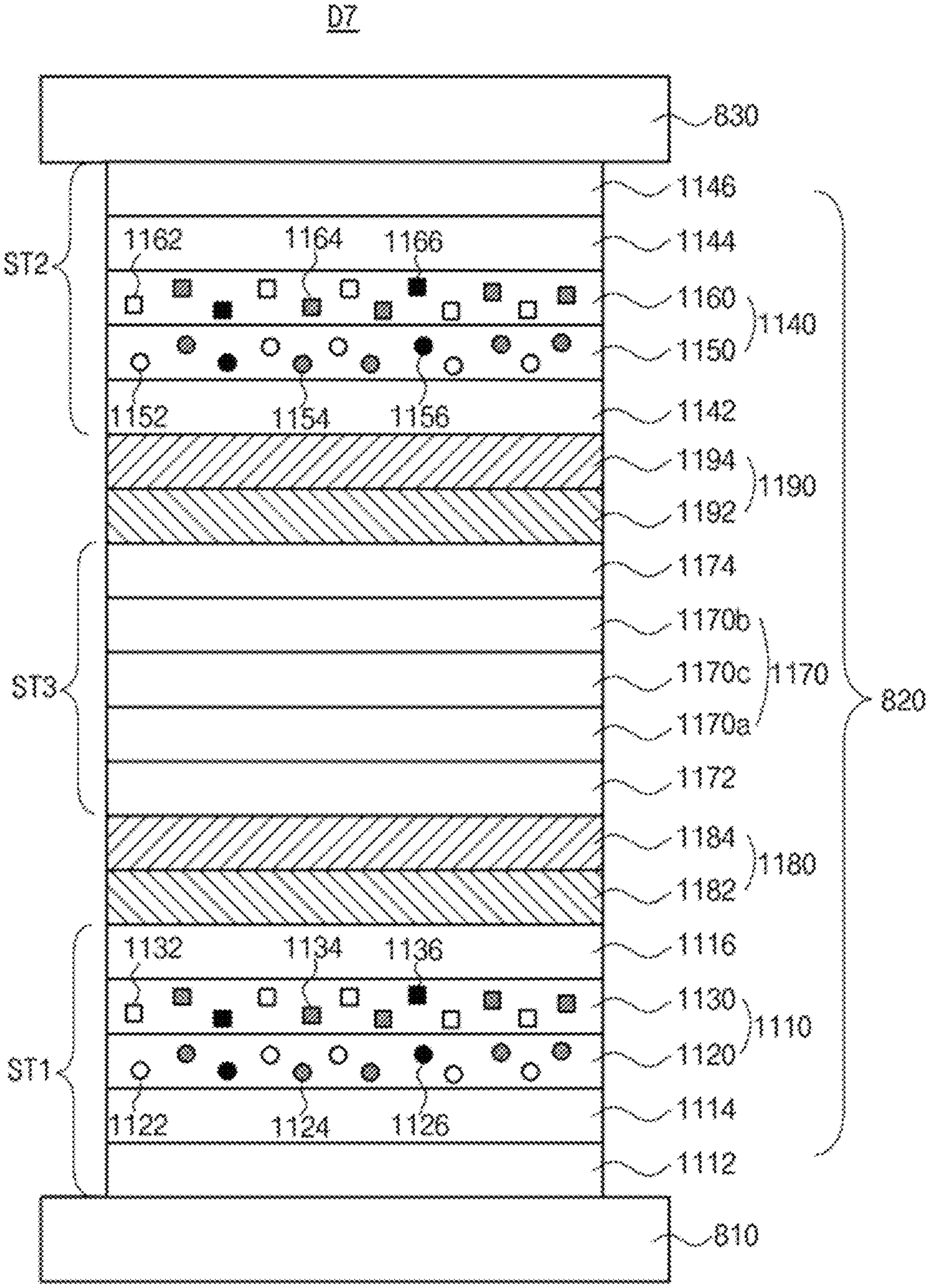
FIG. 13 is a schematic cross-sectional view of an OLED according to a tenth embodiment of the present disclosure.

FIG. 13 is a schematic cross-sectional view of an OLED according to a tenth embodiment of the present disclosure.

As illustrated in FIG. 13, the OLED D7 includes first and second electrodes 810 and 830, which face each other and an organic light emitting layer 820 therebetween. The organic light emitting layer 820 includes a first emitting part ST1 including a first EML 1110, e.g., a first blue EML, a second emitting part ST2 including a second EML 1140, e.g., a second blue EML, and a third emitting part ST3 including a third EML 1170. The organic light emitting layer 820 may further includes a first CGL 1180 between the first and third emitting parts ST1 and ST3 and a second CGL 1190 between the second and third emitting parts ST2 and ST3. The OLED D7 may further include a capping layer on the second electrode 830 to enhance a light extraction efficiency.

The organic light emitting display device 700 may include a red pixel region, a green pixel region and a blue pixel region, and the OLED D7 may be positioned in the red, green and blue pixel regions RP, GP and BP and emits blue light.

The first electrode 810 may be an anode, and the second electrode 830 may be a cathode. One of the first and second electrodes 810 and 830 may be a reflective electrode, and the other one of the first and second electrodes 810 and 830 may be a transparent (or a semi-transparent) electrode. For example, the first electrode 810 may have a single-layered structure of ITO, and the second electrode 830 may be formed of Al.

The first emitting part ST1 may further include at least one of a first HTL 1114 under the first blue EML 1110 and a first ETL 1116 over the first blue EML 1110.

In addition, the first emitting part ST1 may further include an HIL 1112 between the first electrode 810 and the first HTL 1114.

Moreover, the first emitting part ST1 may further include at least one of a first EBL between the first HTL 1114 and the first blue EML 1110 and a first HBL between the first blue EML 1110 and the first ETL 1116.

The second emitting part ST2 may further include at least one of a second HTL 1142 under the second blue EML 1140 and a second ETL 1144 over the second blue EML 1140.

In addition, the second emitting part ST2 may further include an EIL 1146 between the second electrode 830 and the second ETL 1144.

Moreover, the second emitting part ST2 may further include at least one of a second EBL between the second HTL 1142 and the second EML 1140 and a second HBL between the second EML 1140 and the second ETL 1144.

In the third emitting part ST3, the third EML 1170 may include a red EML 1170*a*, a yellow-green EML 1170*c* and a green EML 1170*b*. In this case, the yellow-green EML 1170*c* is disposed between the red and green EMLs 1170*a* and 1170*b*. Alternatively, the yellow-green EML 1170*c* may be omitted, and the third EML 1170 may have a double-layered structure including the red and green EMLs 1170*a* and 1170*b*.

The red EML 1170*a* includes a red host and a red dopant, the green EML 1170*b* includes a green host and a green dopant, and the yellow-green EML 1170*c* includes a yellow-green host and a yellow-green dopant. Each of the red dopant, the green dopant and the yellow-green dopant may be one of a fluorescent compound, a phosphorescent compound and a delayed fluorescent compound.

The third emitting part ST3 may include at least one of a third HTL 1172 under the third EML 1170 and a third ETL 1174 over the third EML 1170.

In addition, the third emitting part ST3 may further include at least one of a third EBL between the third HTL 1172 and the third EML 1170 and a third HBL between the third EML 1170 and the third ETL 1174.

For example, the HIL 1112 may include the above-mentioned hole injection material and may have a thickness of 1 to 30 nm.

Each of the first to third HTLs 1114, 1142 and 1172 may include the above-mentioned hole transporting material and may have a thickness of 10 to 100 nm.

Each of the first to third ETLs 1116, 1144 and 1174 may include the above-mentioned electron transporting material and may have a thickness of 10 to 100 nm.

The EIL 1146 may include the above-mentioned electron injection material and may have a thickness of 0.1 to 10 nm.

Each of the first to third EBLs may include the above-mentioned electron blocking material and may have a thickness of 5 to 40 nm.

Each of the first to third HBLs may include the above-mentioned hole blocking material and may have a thickness of 1 to 20 nm.

The first CGL 1180 is positioned between the first and third emitting parts ST1 and ST3, and the second CGL 1190 is positioned between the second and third emitting parts ST2 and ST3. Namely, the first emitting part ST1, the first CGL 1180, the third emitting part ST3, the second CGL 1190 and the second emitting part ST2 are sequentially stacked on the first electrode 810. In other words, the first emitting part ST1 is positioned between the first electrode 810 and the first CGL 1180, the third emitting part ST3 is positioned between the first and second CGLs 1180 and 1190, and the second emitting part ST2 is positioned between the second CGL 1190 and the second electrode 830.

The first CGL 1180 may be a P-N junction CGL of a first N-type CGL 1182 and a first P-type CGL 1184, and the second CGL 1190 may be a P-N junction CGL of a second N-type CGL 1192 and a second P-type CGL 1194.

In the first CGL 1180, the first N-type CGL 1182 is positioned between the first ETL 1116 and the third HTL 1172, and the first P-type CGL 1184 is positioned between the first N-type CGL 1182 and the third HTL 1172.

In the second CGL 1190, the second N-type CGL 1192 is positioned between the third ETL 1174 and the second HTL 1142, and the second P-type CGL 1194 is positioned between the second N-type CGL 1192 and the second HTL 1142.

Each of the first and second N-type CGLs 1182 and 1192 may be an organic layer doped with an alkali metal, e.g., Li, Na, K and Cs, and/or an alkali earth metal, e.g., Mg, Sr, Ba and Ra. For example, each of the first and second N-type CGLs 1182 and 1192 may be formed of an N-type charge generation material including a host being the organic material, e.g., 4,7-dipheny-1,10-phenanthroline (Bphen) and MTDATA, a dopant being an alkali metal and/or an alkali earth metal, and the dopant may be doped with a weight % of 0.01 to 30.

Each of the first and second P-type CGLs 1184 and 1194 may be formed of a P-type charge generation material including an inorganic material, e.g., tungsten oxide (Wox), molybdenum oxide (MoOx), beryllium oxide ($Be_2O_3$) or vanadium oxide (V2O5), an organic material, e.g., NPD, HAT-CN, F4TCNQ, TPD, TNB, TCTA, N,N'-dioctyl-3,4,9,10-perylenedicarboximide (PTCDI-C8) or their combination.

The first blue EML 1110 includes a first blue emitting layer 1120 and a second blue emitting layer 1130. For example, the first blue emitting layer 1120 is positioned between the first electrode 810 and the second blue emitting layer 1130.

In the first blue EML 1110, the second blue emitting layer 1130 contacts and disposed on the first blue emitting layer 1120 so that the first blue EML 1110 has a double-layered structure.

The first blue emitting layer 1120 includes a first p-type host 1122 and a first n-type host 1124, and the second blue emitting layer 1130 includes a second p-type host 1132 and a second n-type host 1134. The first blue emitting layer 1120 may further include a first phosphorescent dopant (e.g., phosphorescent emitter) 1126 and the second blue emitting layer 1130 may further include a second phosphorescent dopant 1136.

One of the first p-type host 1122 and the second p-type host 1132 is a first compound represented by one of Formula 1a and Formula Tb, and the other one of the first p-type host 1122 and the second p-type host 1132 is a second compound represented by one of Formula 3a and Formula 3b. For example, one of the first p-type host 1122 and the second p-type host 1132 may be selected from the compounds in Formula 2, and the other one of the first p-type host 1122 and the second p-type host 1132 may be selected from the compounds in Formula 4.

Each of the first and second n-type hosts 1124 and 1134 is a compound represented by Formula 5. For example, each of the first and second n-type hosts 1124 and 1134 may be independently selected from the compounds in Formula 6. The first and second n-type hosts 1124 and 1134 may be same or different.

Each of the first and second phosphorescent dopants 1126 and 1136 is a compound represented by Formula 7. For example, each of the first and second phosphorescent dopants 1126 and 1136 may be independently selected from the compounds in Formula 8. The first and second phosphorescent dopants 1126 and 1136 may be same or different.

In the first blue emitting layer 1120, a weight % of each of the first p-type host 1122 and the first n-type host 1124 may be greater than that of the first phosphorescent dopant 1126, and the weight % of the first p-type host 1122 and the weight % of the first n-type host 1124 may be same or different. For example, in the first blue emitting layer 1120, the first p-type host 1122 and the first n-type host 1124 may have the same weight %, and each of the first p-type host 1122 and the first n-type host 1124 may have a part by weight of 200 to 600 with respect to the first phosphorescent dopant 1126.

In the second blue emitting layer 1130, a weight % of each of the second p-type host 1132 and the second n-type host 1134 may be greater than that of the second phosphorescent dopant 1136, and the weight % of the second p-type host 1132 and the weight % of the second n-type host 1134 may be same or different. For example, in the second blue emitting layer 1130, the second p-type host 1132 and the second n-type host 1134 may have the same weight %, and each of the second p-type host 1132 and the second n-type host 1134 may have a part by weight of 200 to 600 with respect to the second phosphorescent dopant 1136.

The first blue EML 1110 may have a thickness of 10 to 100 nm, and each of the first and second blue emitting layers 1120 and 1130 may have a thickness of 5 to 50 nm. For example, the first blue EML 1110 may have a thickness of 20 to 40 nm, and each of the first and second blue emitting layers 1120 and 1130 may have a thickness of 5 to 30 nm. The thickness of the first blue emitting layer 1120 and the thickness of the second blue emitting layer 1130 may be same or different.

The second blue EML 1140 includes a third blue emitting layer 1150 and a fourth blue emitting layer 1160. For example, the third blue emitting layer 1150 is positioned between the first electrode 810 and the fourth blue emitting layer 1160.

In the second blue EML 1140, the fourth blue emitting layer 1160 contacts and disposed on the third blue emitting layer 1150 so that the second blue EML 1140 has a double-layered structure.

The third blue emitting layer 1150 includes a third p-type host 1152 and a third n-type host 1154, and the fourth blue emitting layer 1160 includes a fourth p-type host 1162 and a fourth n-type host 1164. The third blue emitting layer 1150 may further include a third phosphorescent dopant (e.g., phosphorescent emitter) 1156 and the fourth blue emitting layer 1160 may further include a fourth phosphorescent dopant 1166.

One of the third p-type host 1152 and the fourth p-type host 1162 is a first compound represented by one of Formula Ta and Formula Tb, and the other one of the third p-type host 1152 and the fourth p-type host 1162 is a second compound represented by one of Formula 3a and Formula 3b. For example, one of the third p-type host 1152 and the fourth p-type host 1162 may be selected from the compounds in Formula 2, and the other one of the third p-type host 1152 and the fourth p-type host 1162 may be selected from the compounds in Formula 4.

Each of the third and fourth n-type hosts 1154 and 1164 is a compound represented by Formula 5. For example, each of the third and fourth n-type hosts 1154 and 1164 may be independently selected from the compounds in Formula 6. The third and fourth n-type hosts 1154 and 1164 may be same or different.

Each of the third and fourth phosphorescent dopants 1156 and 1166 is a compound represented by Formula 7. For example, each of the third and fourth phosphorescent dopants 1156 and 1166 may be independently selected from the compounds in Formula 8. The third and fourth phosphorescent dopants 1156 and 1166 may be same or different.

In the third blue emitting layer 1150, a weight % of each of the third p-type host 1152 and the third n-type host 1154 may be greater than that of the third phosphorescent dopant 1156, and the weight % of the third p-type host 1152 and the weight % of the third n-type host 1154 may be same or different. For example, in the third blue emitting layer 1150, the third p-type host 1152 and the third n-type host 1154 may have the same weight %, and each of the third p-type host 1152 and the third n-type host 1154 may have a part by weight of 200 to 600 with respect to the third phosphorescent dopant 1156.

In the fourth blue emitting layer 1160, a weight % of each of the fourth p-type host 1162 and the fourth n-type host 1164 may be greater than that of the fourth phosphorescent dopant 1166, and the weight % of the fourth p-type host 1162 and the weight % of the fourth n-type host 1164 may be same or different. For example, in the fourth blue emitting layer 1160, the fourth p-type host 1162 and the fourth n-type host 1164 may have the same weight %, and each of the fourth p-type host 1162 and the fourth n-type host 1164 may have a part by weight of 200 to 600 with respect to the fourth phosphorescent dopant 1166.

The second blue EML 1140 may have a thickness of 10 to 100 nm, and each of the third and fourth blue emitting layers 1150 and 1160 may have a thickness of 5 to 50 nm. For example, the second blue EML 1140 may have a thickness of 20 to 40 nm, and each of the third and fourth blue emitting layers 1150 and 1160 may have a thickness of 5 to 30 nm. The thickness of the third blue emitting layer 1150 and the thickness of the fourth blue emitting layer 1160 may be same or different.

The organic light emitting layer 820 of the OLED D7 includes the first emitting part ST1 including the first blue EML 1110, the second emitting part ST2 including the second blue EML 1140 and the third emitting part ST3 including the red, yellow-green and green EMLs 1170*a*, 1170*c* and 1170*b* so that the OLED D7 has a tandem structure.

The first blue EML 1110 includes the first blue emitting layer 1120, which includes the first p-type host 1122, the first n-type host 1124 and the first phosphorescent dopant 1126, and the second blue emitting layer 1130, which includes the second p-type host 1132, the second n-type host 1134 and the second phosphorescent dopant 1136. One of the first and second p-type hosts 1122 and 1132 is the first compound represented by Formula 1a or Formula 1b, and the other one of the first and second p-type hosts 1122 and 1132 is the second compound represented by Formula 3a or Formula 3b. In addition, each of the first and second n-type hosts 1124 and 1134 is a compound represented by Formula 5, and each of the first and second phosphorescent dopants 1126 and 1136 is a compound represented by Formula 7.

In addition, the second blue EML 1140 includes the third blue emitting layer 1150, which includes the third p-type host 1152, the third n-type host 1154 and the third phosphorescent dopant 1156, and the fourth blue emitting layer 1160, which includes the fourth p-type host 1162, the fourth n-type host 1164 and the fourth phosphorescent dopant 1166. One of the third and fourth p-type hosts 1152 and 1162 is the first compound represented by Formula 1a or Formula Tb, and the other one of the third and fourth p-type hosts 1152 and 1162 is the second compound represented by Formula 3a or Formula 3b. In addition, each of the third and fourth n-type hosts 1154 and 1164 is a compound represented by Formula 5, and each of the third and fourth phosphorescent dopants 1156 and 1166 is a compound represented by Formula 7.

Accordingly, the OLED D7 and the organic light emitting display device 700 of the present disclosure have advantages in the driving voltage and the lifespan.

It will be apparent to those skilled in the art that various modifications and variations can be made in the OLED and the organic light emitting device of the present disclosure without departing from the spirit or scope of the present disclosure. Thus, it is intended that the present disclosure cover the modifications and variations of this disclosure provided they come within the scope of the appended claims and their equivalents.

What is claimed is:

1. An organic light emitting diode, comprising:

a first electrode;

a second electrode facing the first electrode; and a first emitting part including a first blue emitting material layer and positioned between the first and second electrodes, the first blue emitting material layer including a first blue emitting layer and a second blue emitting layer, wherein the first blue emitting layer includes a first p-type host and a first n-type host, and the second blue emitting layer includes a second p-type host and a second n-type host, wherein one of the first p-type host and the second p-type host is a first compound represented by one of Formula 1a and Formula 1b:

[Formula 1a]

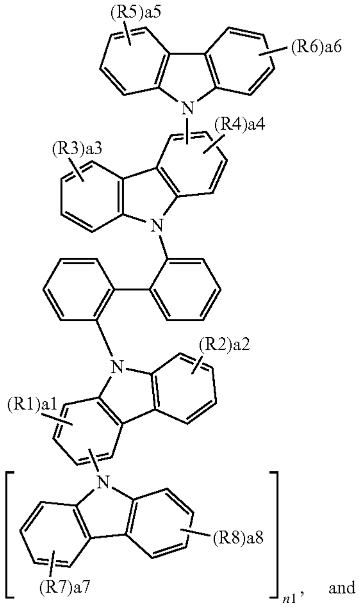

, and

[Formula 1b]

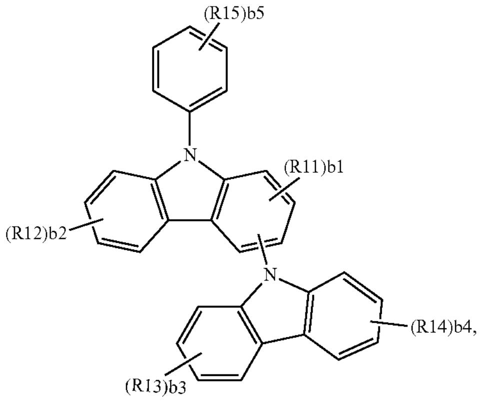

wherein in the Formula 1a, each of a1 and a4 is independently an integer of 0 to 3, each of a2, a3 and a5 to a8 is independently an integer of 0 to 4, n1 is 0 or 1, and each of R1 to R8 is independently selected from the group consisting of deuterium, halogen, cyano, a substituted or unsubstituted C6 to C30 arylsilyl group, a substituted or unsubstituted C1 to C20 alkyl group, a substituted or unsubstituted C6 to C30 aryl group, a substituted or unsubstituted C5 to C60 heteroaryl group, a substituted or unsubstituted C1 to C30 alkylamino group and a substituted or unsubstituted C6 to C60 arylamino group, wherein in the Formula 1b, b1 is an integer of 0 to 3, each of b2 to b4 is independently an integer of 0 to 4, b5 is an integer of 0 to 5, and each of R11 to R15 is independently selected from the group consisting of deuterium, halogen, cyano, a substituted or unsubstituted C6 to C30 arylsilyl group, a substituted or unsubstituted C1 to C20 alkyl group, a substituted or unsubstituted C6 to C30 aryl group, a substituted or unsubstituted C5 to C60 heteroaryl group, a substituted or unsubstituted C1 to C30 alkylamino group and a substituted or unsubstituted C6 to C60 arylamino group, wherein the other one of the first p-type host and the second p-type host is a second compound represented by one of Formula 3a and Formula 3b:

[Formula 3a]

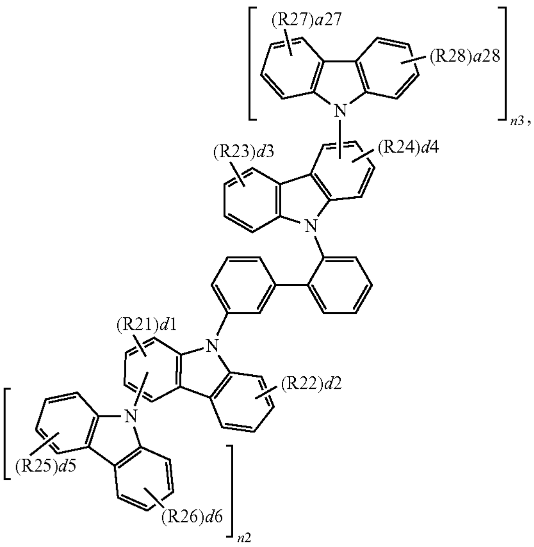

and

[Formula 3b]

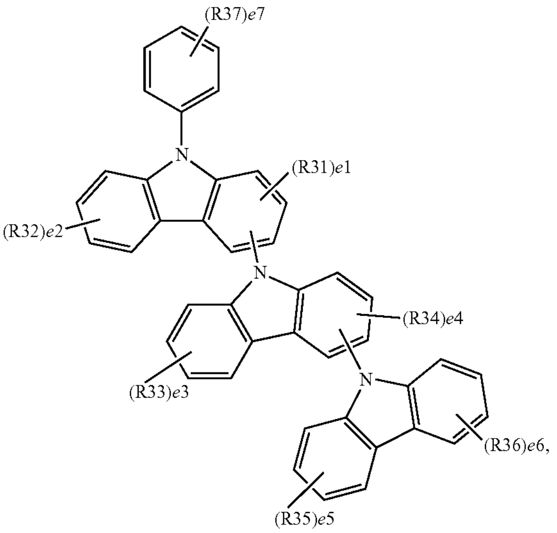

wherein in the Formula 3a, each of d1 and d4 is independently an integer of 0 to 3, each of d2, d3, d5, d6, a27 and a28 is independently an integer of 0 to 4, each of n2 and n3 is independently 0 or 1, and each of R21 to R28 is independently selected from the group consisting of deuterium, halogen, cyano, a substituted or unsubstituted C6 to C30 arylsilyl group, a substituted or unsubstituted C1 to C20 alkyl group, a substituted or unsubstituted C6 to C30 aryl group, a substituted or unsubstituted C5 to C60 heteroaryl group, a substituted or unsubstituted C1 to C30 alkylamino group and a substituted or unsubstituted C6 to C60 arylamino group, wherein in the Formula 3b, each of e1 and e4 is independently an integer of 0 to 3, each of e2, e3, e5 and e6 is independently an integer of 0 to 4, e7 is an integer of 0 to 5, and each of R31 to R37 is independently selected from the group consisting of deuterium, halogen, cyano, a substituted or unsubstituted C6 to C30 arylsilyl group, a substituted or unsubstituted C1 to C20 alkyl group, a substituted or unsubstituted C6 to C30 aryl group, a substituted or unsubstituted C5 to C60 heteroaryl group, a substituted or unsubstituted C1 to C30 alkylamino group and a substituted or unsubstituted C6 to C60 arylamino group.

2. The organic light emitting diode according to claim 1, wherein the first compound is one of compounds in Formula 2:

[Formula 2]

1-1

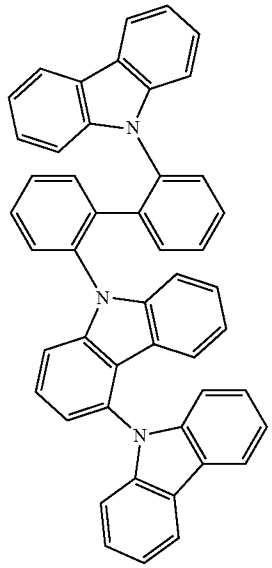

1-2

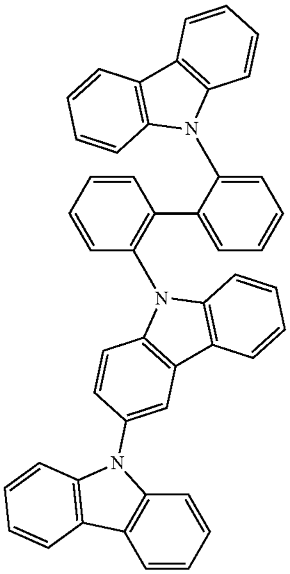

-continued
1-3
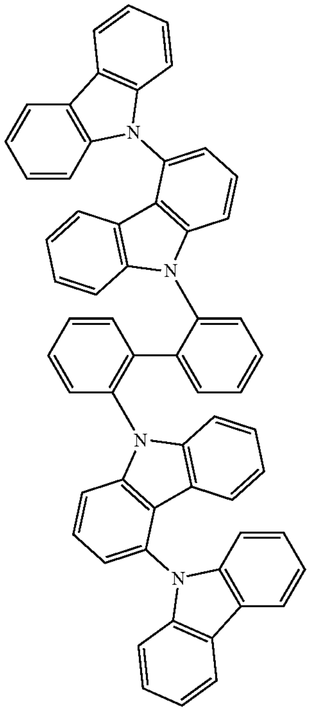
1-4
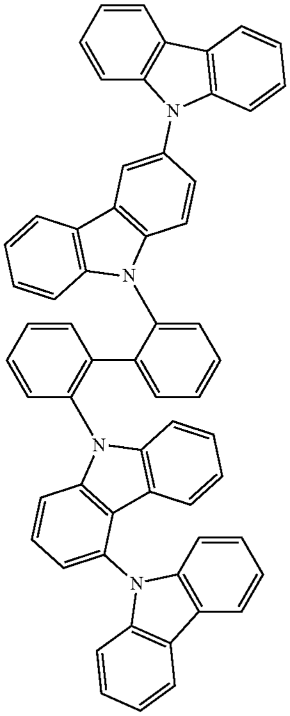
-continued
1-5
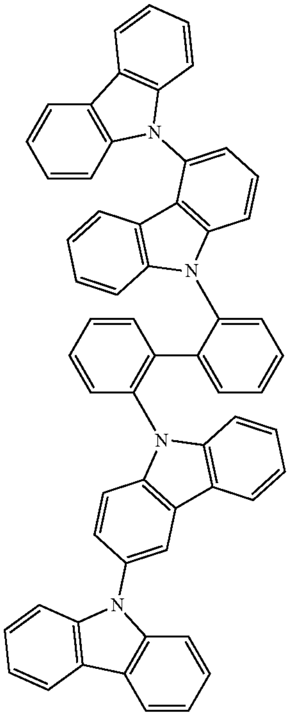
1-6
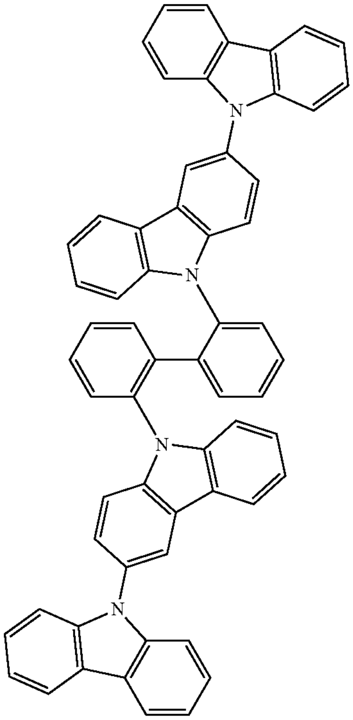

-continued
1-7
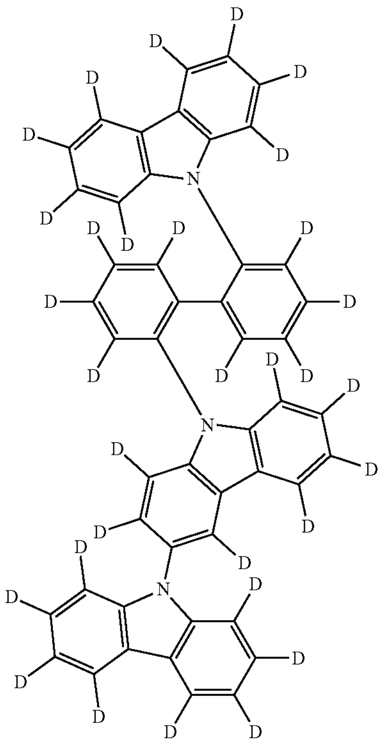
1-8
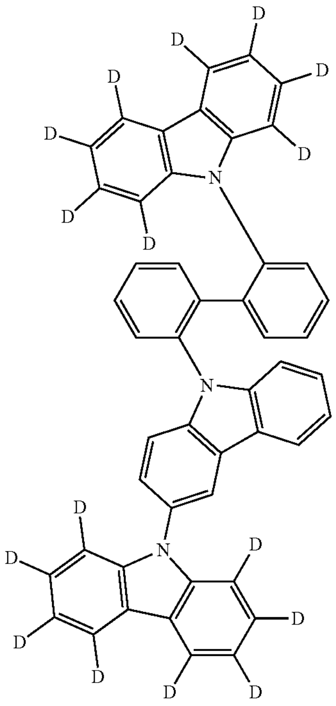
-continued
1-9
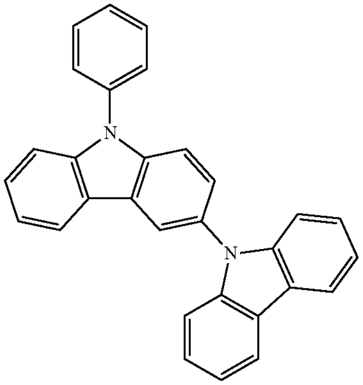
1-10
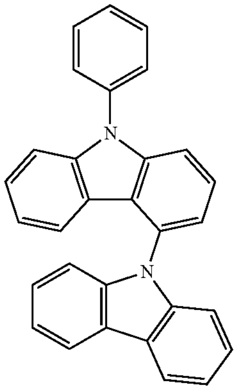
1-11
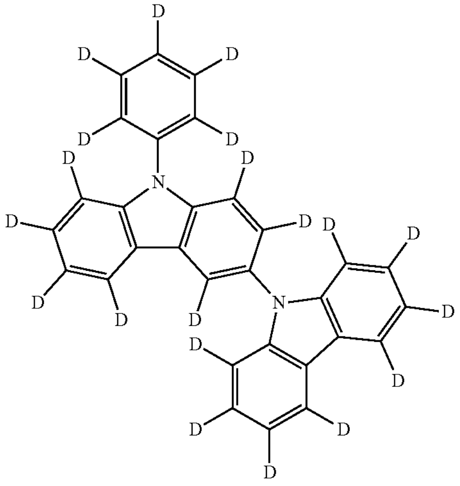

-continued
1-12
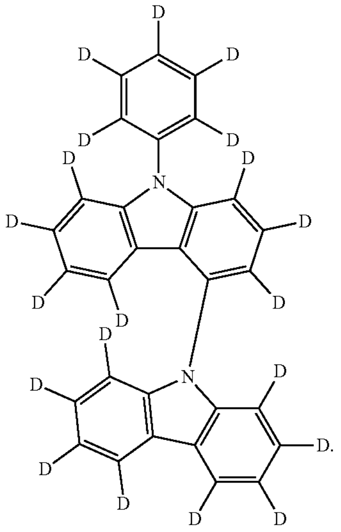
3. The organic light emitting diode according to claim 1, wherein the second compound is one of compounds in Formula 4:
[Formula 4]
2-1
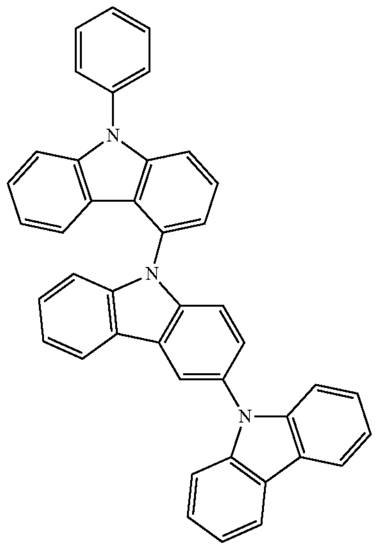
-continued
2-2
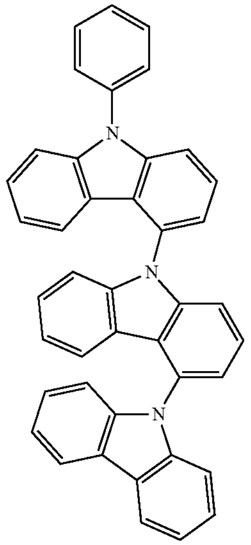
2-3
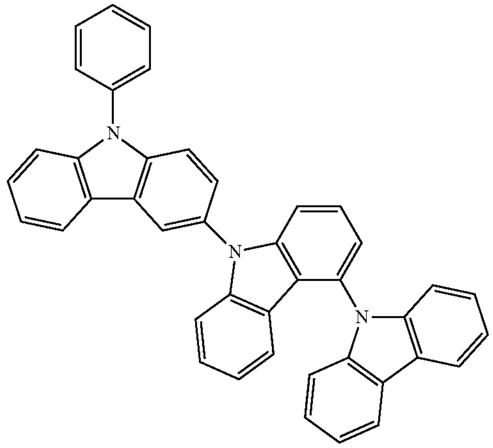
2-4
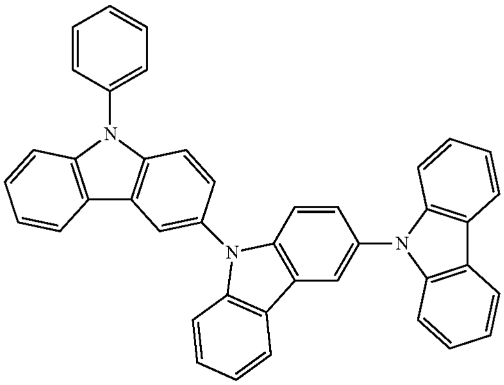

-continued
2-5
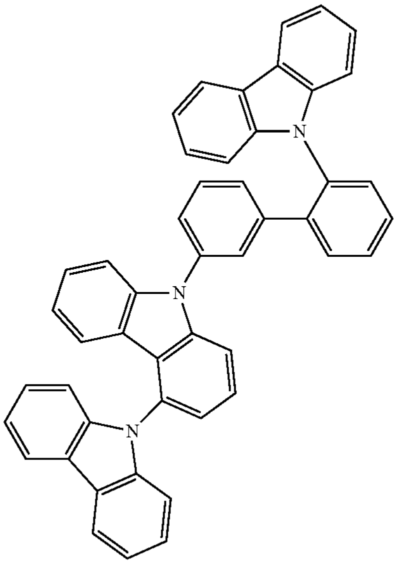
20-6
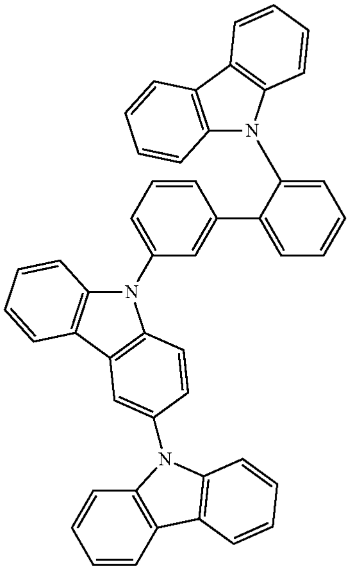
-continued
2-7
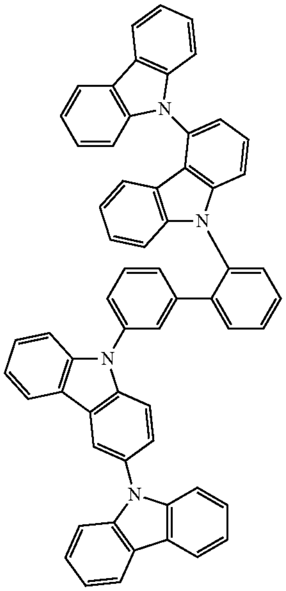
2-8
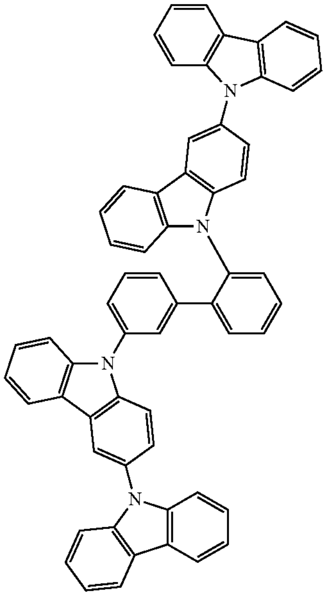

-continued 2-9

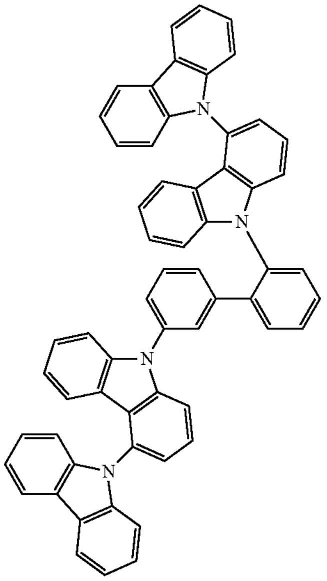

2-10

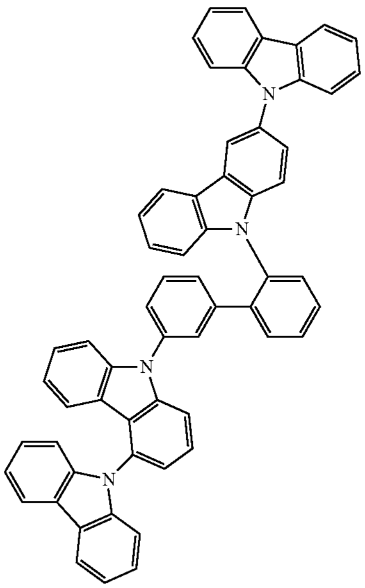

-continued 2-11

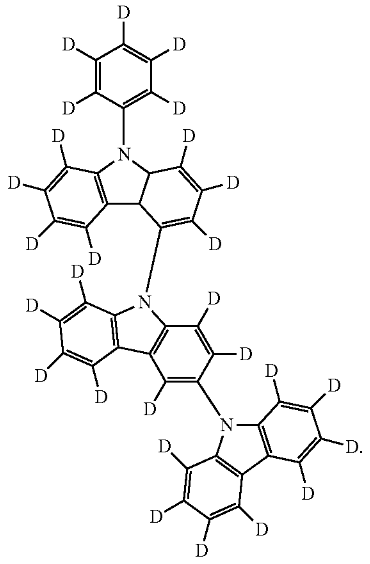

4. The organic light emitting diode according to claim 1, wherein each of the first n-type host and the second n-type host is represented by Formula 5:

Formula 5

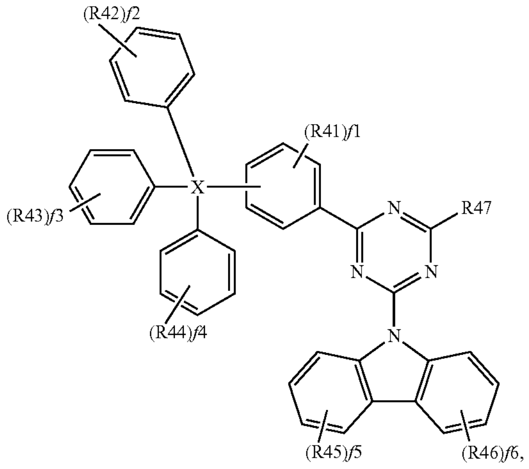

wherein in the Formula 5, each of f1, f5 and f6 is independently an integer of 0 to 4, each of f2 to f4 is independently an integer of 0 to 5, X is selected from the group consisting of C, Si and Ge, and each of R41 to R47 is independently selected from the group consisting of deuterium, halogen, cyano, a substituted or unsubstituted C6 to C30 arylsilyl group, a substituted or unsubstituted C6 to C30 arylgermyl group, a substituted or unsubstituted C1 to C20 alkyl group, a substituted or unsubstituted C6 to C30 aryl group, a substituted or unsubstituted C5 to C60 heteroaryl group, a substituted or unsubstituted C1 to C30 alkylamino group and a substituted or unsubstituted C6 to C60 arylamino group.

5. The organic light emitting diode according to claim 4, wherein each of the first n-type host and the second n-type host is independently selected from compounds in Formula 6:
[Formula 6]
3-1
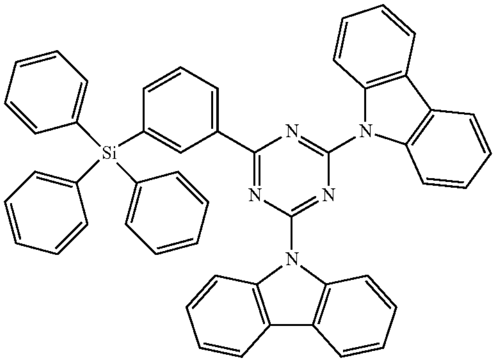
3-2
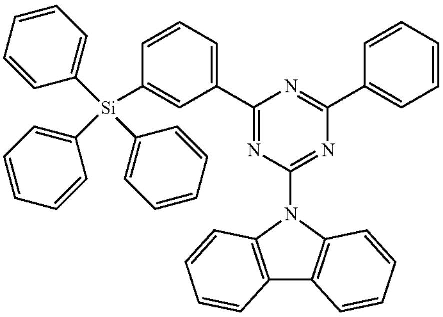
3-3
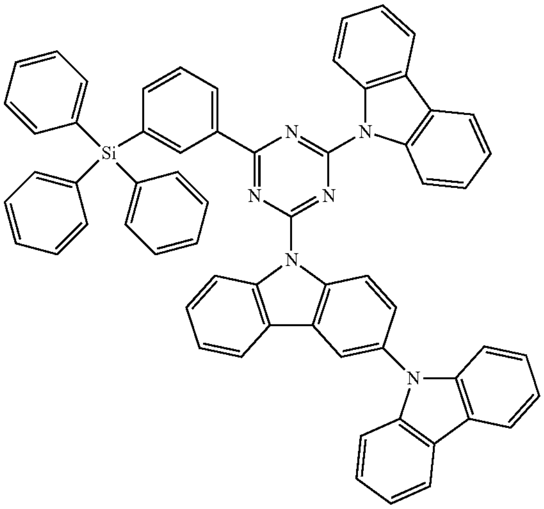
-continued
3-4
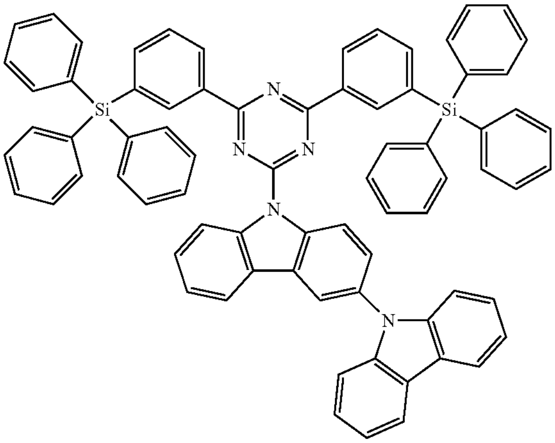
3-5
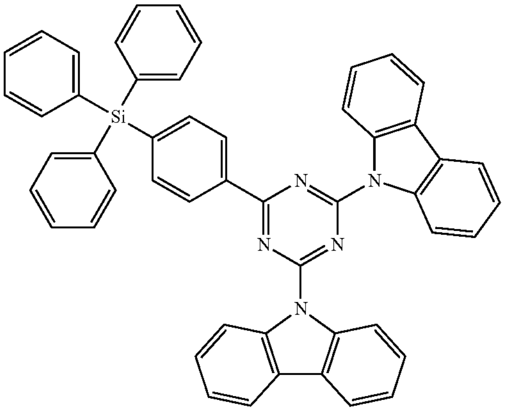
3-6
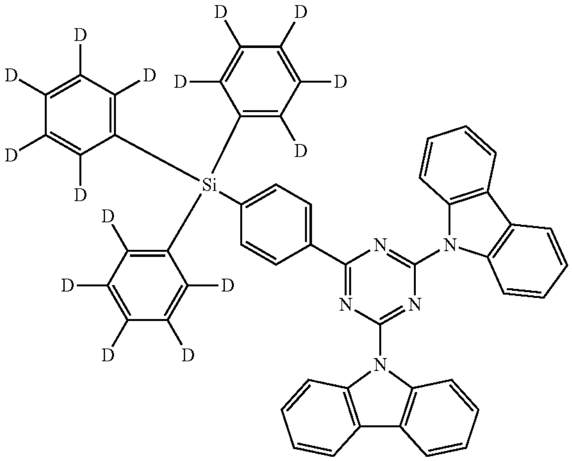

-continued
3-7
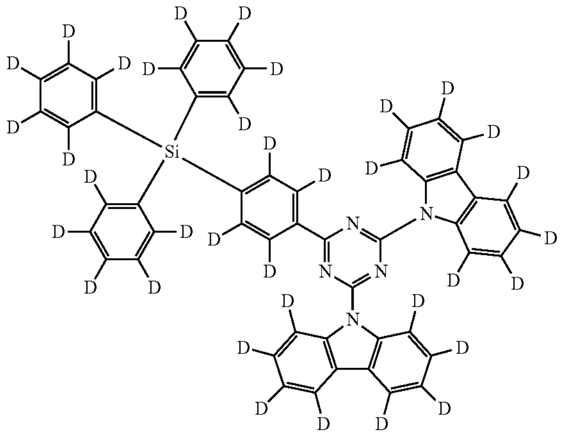
3-8
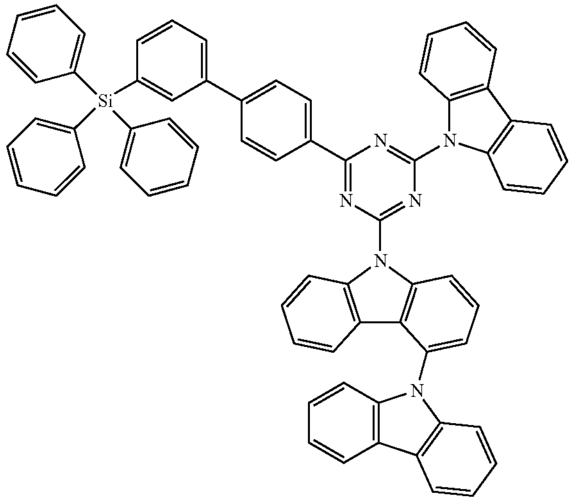
3-9
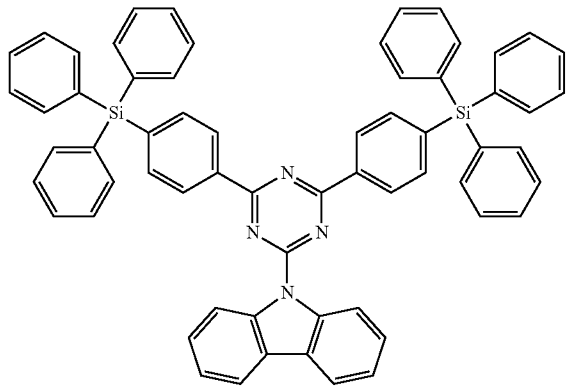
-continued
3-10
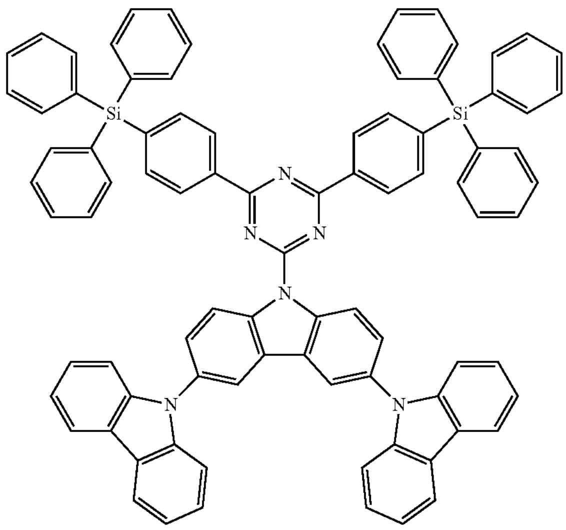
3-11
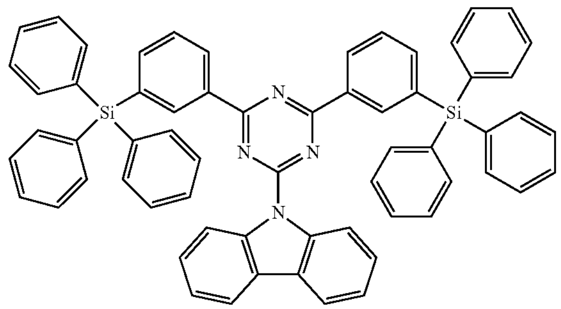
3-12
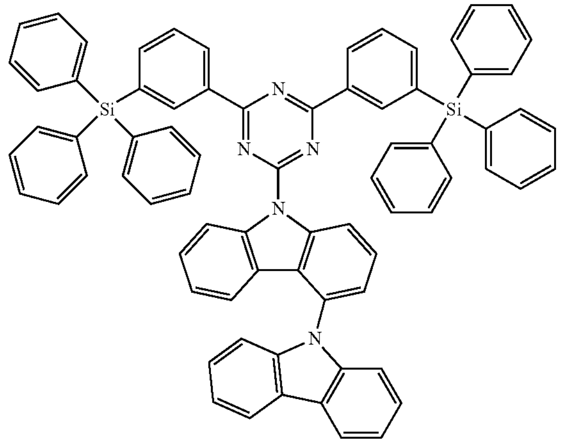

-continued 3-13

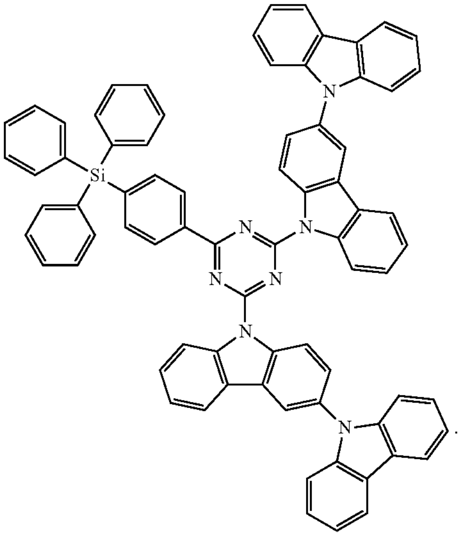

6. The organic light emitting diode according to claim 1, wherein the first blue emitting layer further includes a first phosphorescent dopant, and the second blue emitting layer further includes a second phosphorescent dopant, wherein each of the first and second phosphorescent dopants is represented by Formula 7:

[Formula 7]

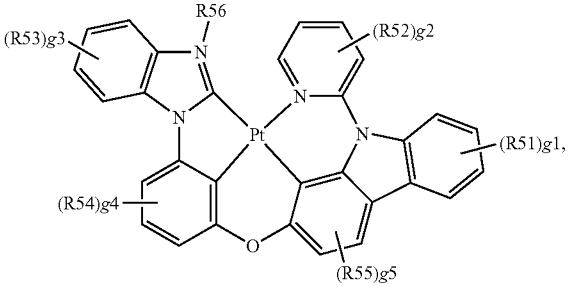

wherein in the Formula 7, each of R51 to R56 is independently selected from the group consisting of deuterium, halogen, cyano, a substituted or unsubstituted C1 to C20 alkyl group, a substituted or unsubstituted C3 to C20 cycloalkyl group, a substituted or unsubstituted C1 to C20 alkylsilyl group, a substituted or unsubstituted C1 to C20 alkylamino group, a substituted or unsubstituted C6 to C30 arylamino group, a substituted or unsubstituted C6 to C30 arylsilyl group, a substituted or unsubstituted C6 to C30 aryl group and a substituted or unsubstituted C3 to C30 heteroaryl group, each of g1, g2 and g3 is independently an integer of 0 to 4, and g4 is an integer of 0 to 3, and g5 is an integer of 0 to 2.

7. The organic light emitting diode according to claim 6, wherein each of the first phosphorescent dopant and the second phosphorescent dopant is independently selected from compounds in Formula 8:

[Formula 8]

4-1

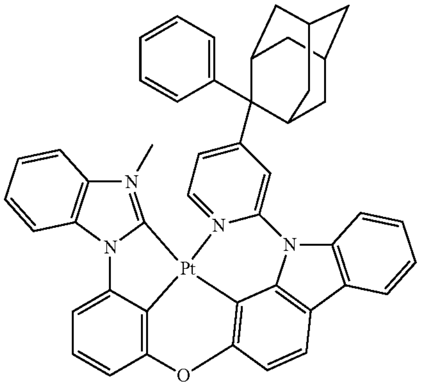

4-2

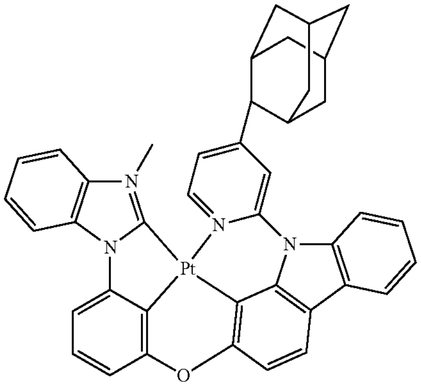

4-3

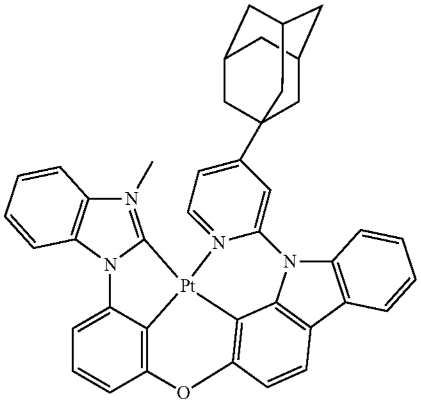

4-4

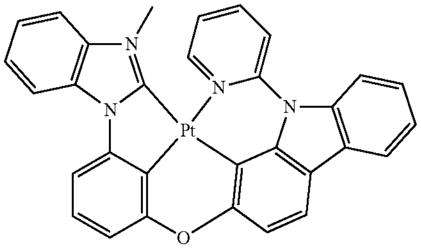

-continued
4-5
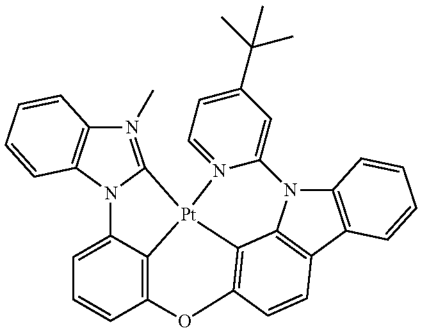
4-6
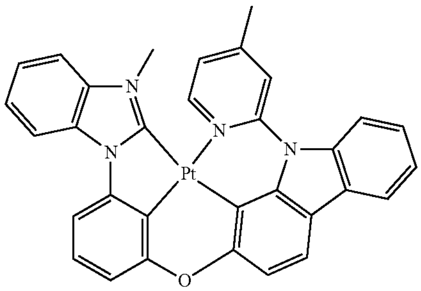
4-7
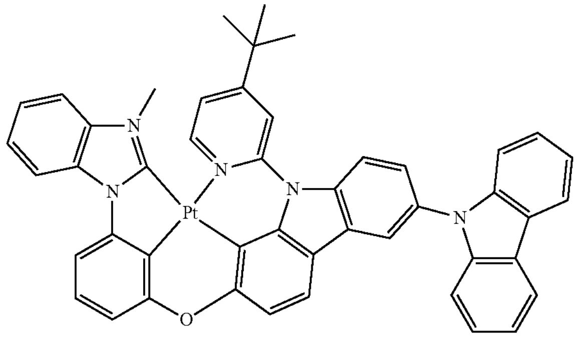
4-8
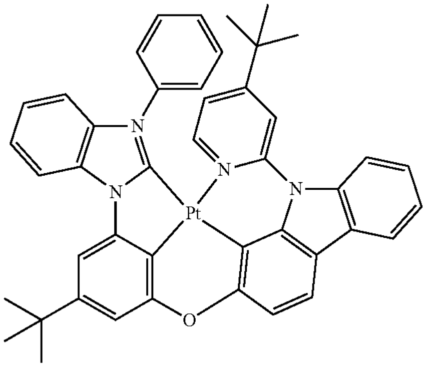
-continued
4-9
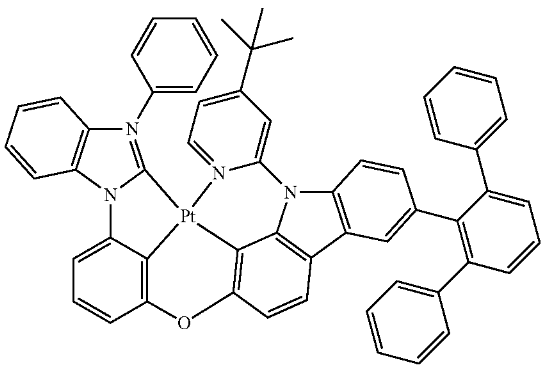
4-10
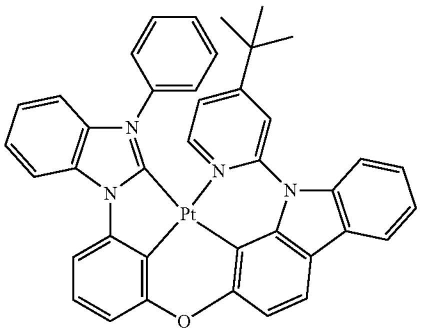
4-11
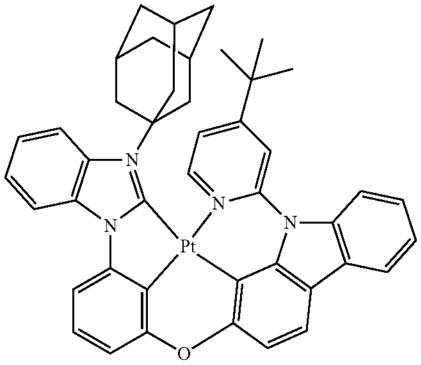
4-12
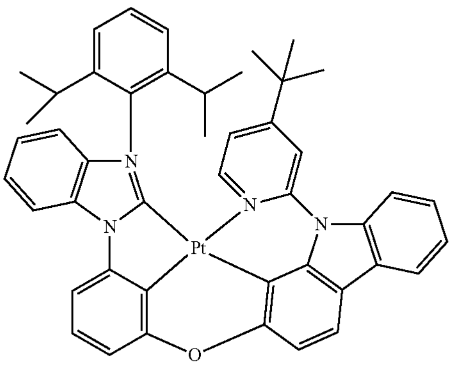

-continued 4-13

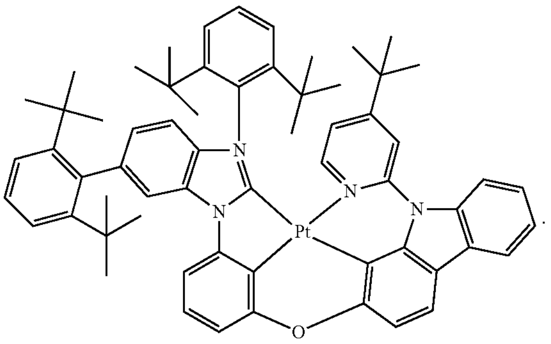

8. The organic light emitting diode according to claim 6, wherein in the first blue emitting layer, a first exciplex is generated between the first p-type host and the first n-type host, and a difference between an onset wavelength in an absorption spectrum of the first phosphorescent dopant and an onset wavelength in a PL spectrum of the first exciplex is 10 nm or more, and wherein in the second blue emitting layer, a second exciplex is generated between the second p-type host and the second n-type host, and a difference between an onset wavelength in an absorption spectrum of the second phosphorescent dopant and an onset wavelength in a PL spectrum of the second exciplex is 10 nm or more.

9. The organic light emitting diode according to claim 8, wherein a difference between a LUMO energy level of the first phosphorescent dopant and a LUMO energy level of the first n-type host is 0.2 eV or more, and wherein a difference between a LUMO energy level of the second phosphorescent dopant and a LUMO energy level of the second n-type host is 0.2 eV or more.

10. The organic light emitting diode according to claim 9, wherein in the first blue emitting layer, an onset wavelength in a PL spectrum of the first phosphorescent dopant is equal to or greater than the onset wavelength in the PL spectrum of the first exciplex, and wherein in the second blue emitting layer, an onset wavelength in a PL spectrum of the second phosphorescent dopant is equal to or greater than the onset wavelength in the PL spectrum of the second exciplex.

11. The organic light emitting diode according to claim 1, wherein a difference between a LUMO energy level of the first p-type host and a LUMO energy level of the first n-type host is 0.2 eV or more, and a difference between a HOMO energy level of the first p-type host and a HOMO energy level of the first n-type host is 0.3 eV or more, and wherein a difference between a LUMO energy level of the second p-type host and a LUMO energy level of the second n-type host is 0.2 eV or more, and a difference between a HOMO energy level of the second p-type host and a HOMO energy level of the second n-type host is 0.3 eV or more.

12. The organic light emitting diode according to claim 1, further comprising:

a second emitting part including a second blue emitting material layer and positioned between the first emitting part and the first electrode or between the first emitting part and the second electrode.

13. The organic light emitting diode according to claim 12, wherein the second blue emitting material layer includes a third blue emitting layer and a fourth blue emitting layer, wherein the third blue emitting layer includes a third p-type host and a third n-type host, and the fourth blue emitting layer includes a fourth p-type host and a fourth n-type host, and wherein one of the third p-type host and the fourth p-type host is represented by one of the Formula 1a and Formula 1b, and the other one of the third p-type host and the fourth p-type host is represented by one of the Formula 3a and Formula 3b.

14. The organic light emitting diode according to claim 13, wherein each of the third n-type host and the fourth n-type host is represented by Formula 5:

[Formula 5]

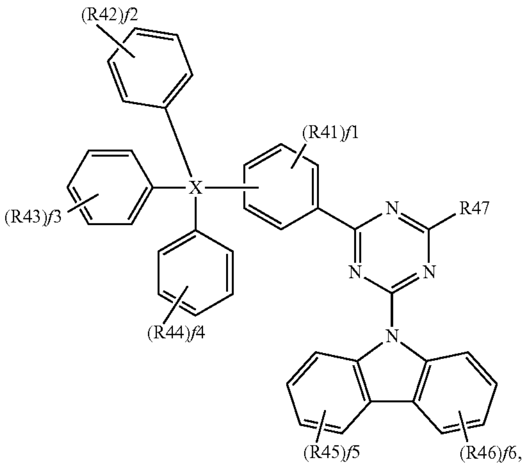

wherein in the Formula 5, each of f1, f5 and f6 is independently an integer of 0 to 4, each of f2 to f4 is independently an integer of 0 to 5, X is selected from the group consisting of C, Si and Ge, and each of R41 to R47 is independently selected from the group consisting of deuterium, halogen, cyano, a substituted or unsubstituted C6 to C30 arylsilyl group, a substituted or unsubstituted C6 to C30 arylgermyl group, a substituted or unsubstituted C1 to C20 alkyl group, a substituted or unsubstituted C6 to C30 aryl group, a substituted or unsubstituted C5 to C60 heteroaryl group, a substituted or unsubstituted C1 to C30 alkylamino group and a substituted or unsubstituted C6 to C60 arylamino group.

15. The organic light emitting diode according to claim 13, wherein the third blue emitting layer further includes a third phosphorescent dopant, and the fourth blue emitting layer further includes a fourth phosphorescent dopant, wherein each of the third and fourth phosphorescent dopants is represented by Formula 7:

[Formula 7]

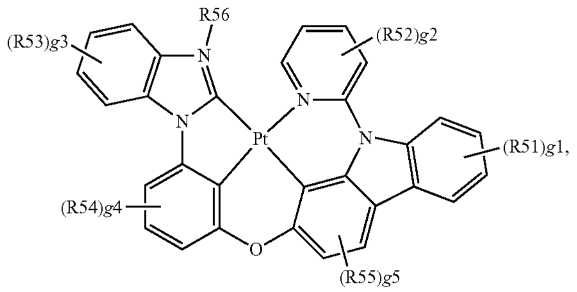

wherein in the Formula 7, each of R51 to R56 is independently selected from the group consisting of deuterium, halogen, cyano, a substituted or unsubstituted C1 to C20 alkyl group, a substituted or unsubstituted C3 to C20 cycloalkyl group, a substituted or unsubstituted C1 to C20 alkylsilyl group, a substituted or unsubstituted C1 to C20 alkylamino group, a substituted or unsubstituted C6 to C30 arylamino group, a substituted or unsubstituted C6 to C30 arylsilyl group, a substituted or unsubstituted C6 to C30 aryl group and a substituted or unsubstituted C3 to C30 heteroaryl group, each of g1, g2 and g3 is independently an integer of 0 to 4, and g4 is an integer of 0 to 3, and g5 is an integer of 0 to 2.

16. The organic light emitting diode according to claim 12, wherein the second blue emitting material layer includes a blue host and a blue dopant, wherein the blue host includes at least one of compounds in Formula 14, and the blue dopant is one of compounds in Formula 15:

[Formula 14]

H-1

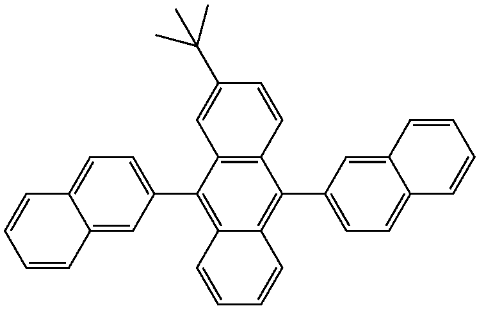

-continued

H-2

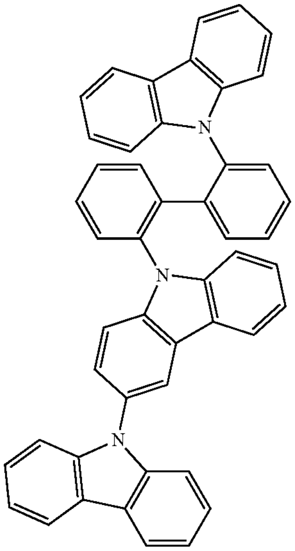

H-3

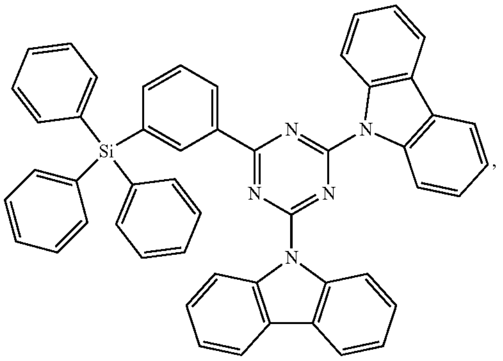

and

[Formula 15]

FD-1

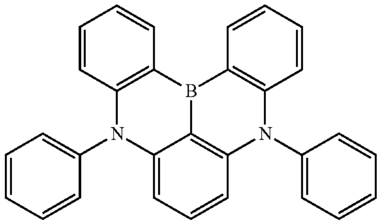

FD-2

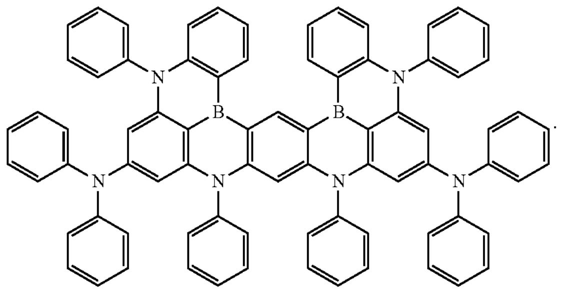

17. The organic light emitting diode according to claim 16, wherein the second blue emitting material layer further includes an auxiliary dopant being one of compounds in Formula 16:

[Formula 16]

A-1

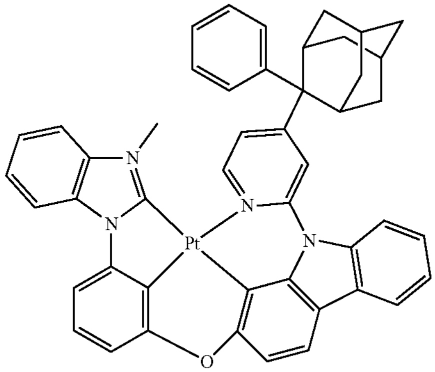

A-2

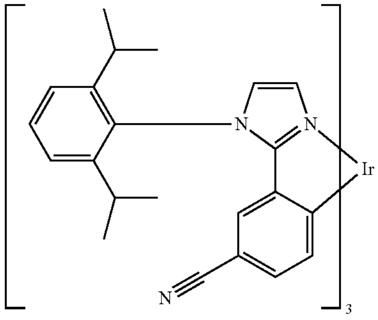

-continued

A-3

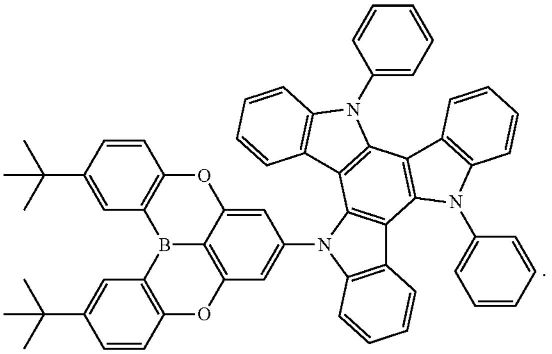

18. The organic light emitting diode according to claim 12, further comprising:

a third emitting part including a red emitting material layer and a green emitting material layer and positioned between the first and second emitting parts.

19. An organic light emitting device, comprising:

a substrate;

an organic light emitting diode of claim 1 and disposed over the substrate; and an encapsulation layer covering the organic light emitting diode.

20. The organic light emitting device according to claim 19, further comprising:

a color filter layer positioned between the substrate and the organic light emitting diode or on the encapsulation layer.

* * * * *